(12) United States Patent
Kondo

(10) Patent No.: US 10,438,990 B2
(45) Date of Patent: Oct. 8, 2019

(54) LIGHT-EMITTING COMPONENT, LIGHT-EMITTING DEVICE, AND IMAGE FORMING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/891,383

(22) Filed: Feb. 8, 2018

(65) Prior Publication Data
US 2018/0234584 A1 Aug. 16, 2018

(30) Foreign Application Priority Data

Feb. 13, 2017 (JP) ................. 2017-024433
Sep. 21, 2017 (JP) ................. 2017-181724
Sep. 21, 2017 (JP) ................. 2017-181727
Sep. 21, 2017 (JP) ................. 2017-181730

(51) Int. Cl.
*H04N 1/40* (2006.01)
*H04N 1/028* (2006.01)
(Continued)

(52) U.S. Cl.
CPC ....... *H01L 27/15* (2013.01); *G03G 15/04054* (2013.01); *G03G 15/04072* (2013.01);
(Continued)

(58) Field of Classification Search
CPC . H01L 27/25; H01L 33/0041; H01L 33/0062; H01L 33/0066; H01L 33/30; H01L 33/32; H01L 33/0806; H01L 33/06; H01L 33/40; H01L 33/44; H01L 33/62; H01L 29/745; H01L 29/125; H01L 29/127; H01L 29/2003; H01L 29/267; H01L 29/36; H01L 29/66401; H01L 29/7412; H01L 29/744; H01L 21/02532; H01L 21/02546; H01L 21/30612; H01L 21/0262; H01L 21/02631; H01L 31/1113; H01L 2933/0025; H01L 27/15; H01L 33/0016;
(Continued)

(56) References Cited

U.S. PATENT DOCUMENTS 7,948,004 B2  5/2011  Suzuki
2006/0119669 A1*  6/2006  Sharma ............... B41J 2/03
                                                        347/82
(Continued)

FOREIGN PATENT DOCUMENTS

JP   H01238962   9/1989
JP   2001308385  11/2001
JP   2009286048  12/2009

*Primary Examiner* — Allen H Nguyen
(74) *Attorney, Agent, or Firm* — JCIPRNET

(57) ABSTRACT

A light-emitting component includes a substrate, a light-emitting element, a thyristor, and a light-transmission reduction layer. The light-emitting element is disposed on the substrate. The thyristor causes the light-emitting element to emit light or causes an amount of light emitted by the light-emitting element to increase, upon entering an on-state. The light-transmission reduction layer is disposed between the light-emitting element and the thyristor such that the light-emitting element and the thyristor are stacked, and suppresses light emitted by the thyristor from passing therethrough.

20 Claims, 27 Drawing Sheets

(51) Int. Cl.
| | |
|---|---|
| G03G 15/04 | (2006.01) |
| G03G 15/043 | (2006.01) |
| G03G 15/18 | (2006.01) |
| H01L 27/15 | (2006.01) |
| H01L 33/00 | (2010.01) |
| H01L 29/745 | (2006.01) |
| H01S 5/062 | (2006.01) |
| H01S 5/32 | (2006.01) |
| H01S 5/183 | (2006.01) |
| H01L 21/02 | (2006.01) |
| H01L 21/306 | (2006.01) |
| H01L 29/12 | (2006.01) |
| H01L 29/20 | (2006.01) |
| H01L 29/267 | (2006.01) |
| H01L 29/36 | (2006.01) |
| H01L 29/66 | (2006.01) |
| H01L 29/74 | (2006.01) |
| H01L 29/744 | (2006.01) |
| H01L 31/111 | (2006.01) |
| H01L 33/06 | (2010.01) |
| H01L 33/30 | (2010.01) |
| H01L 33/32 | (2010.01) |
| H01S 5/026 | (2006.01) |
| H01S 5/042 | (2006.01) |
| H01S 5/187 | (2006.01) |
| H01S 5/343 | (2006.01) |
| H05B 33/08 | (2006.01) |
| H01S 5/20 | (2006.01) |
| H01L 25/065 | (2006.01) |
| H01L 29/45 | (2006.01) |
| H01L 33/40 | (2010.01) |
| H01L 33/44 | (2010.01) |
| H01L 33/62 | (2010.01) |

(52) U.S. Cl.
CPC .. *H01L 21/02532* (2013.01); *H01L 21/02546* (2013.01); *H01L 21/30612* (2013.01); *H01L 29/125* (2013.01); *H01L 29/127* (2013.01); *H01L 29/2003* (2013.01); *H01L 29/267* (2013.01); *H01L 29/36* (2013.01); *H01L 29/66401* (2013.01); *H01L 29/744* (2013.01); *H01L 29/745* (2013.01); *H01L 29/7412* (2013.01); *H01L 31/1113* (2013.01); *H01L 33/0016* (2013.01); *H01L 33/0041* (2013.01); *H01L 33/0062* (2013.01); *H01L 33/0066* (2013.01); *H01L 33/06* (2013.01); *H01L 33/30* (2013.01); *H01L 33/32* (2013.01); *H01S 5/026* (2013.01); *H01S 5/0261* (2013.01); *H01S 5/042* (2013.01); *H01S 5/0425* (2013.01); *H01S 5/062* (2013.01); *H01S 5/187* (2013.01); *H01S 5/18361* (2013.01); *H01S 5/2022* (2013.01); *H01S 5/2027* (2013.01); *H01S 5/32* (2013.01); *H01S 5/34313* (2013.01); *H01S 5/34333* (2013.01); *H04N 1/02865* (2013.01); *H04N 1/40025* (2013.01); *H04N 1/40056* (2013.01); *H05B 33/0806* (2013.01); *G03G 15/043* (2013.01); *G03G 15/18* (2013.01); *G03G 2215/0404* (2013.01); *G03G 2215/0409* (2013.01); *H01L 21/0262* (2013.01); *H01L 21/02631* (2013.01); *H01L 25/0655* (2013.01); *H01L 29/452* (2013.01); *H01L 33/40* (2013.01); *H01L 33/44* (2013.01); *H01L 33/62* (2013.01); *H01L 2933/0025* (2013.01); *H01S 5/0421* (2013.01); *H01S 5/06203* (2013.01); *H01S 5/18313* (2013.01); *H01S 5/18369* (2013.01); *H01S 5/18377* (2013.01); *H01S 5/2059* (2013.01); *H01S 2304/02* (2013.01); *H01S 2304/04* (2013.01)

(58) Field of Classification Search
CPC . H01L 29/452; H01S 5/2059; H01S 5/18313; H01S 5/06203; H01S 5/18377; H01S 5/18369; H01S 5/062; H01S 5/32; H01S 5/18361; H01S 5/026; H01S 5/0425; H01S 5/187; H01S 5/34313; H01S 5/34333; H01S 5/0261; H01S 5/042; H01S 5/2022; H01S 5/2027; H01S 5/0421; H01S 2304/02; H01S 2304/04; H04N 1/02865; H04N 1/40056; H04N 1/40025; G03G 15/18; G03G 15/04054; G03G 15/04072; G03G 15/043; G03G 2215/0404; G03G 2215/0409; H05B 33/0806
USPC .......................................... 358/475
See application file for complete search history.

(56) References Cited

U.S. PATENT DOCUMENTS

| | | | |
|---|---|---|---|
| 2010/0231682 A1* | 9/2010 | Ohno | B41J 2/451 347/238 |
| 2012/0251181 A1* | 10/2012 | Nagumo | G03G 15/04054 399/177 |
| 2013/0193464 A1* | 8/2013 | Bae | H01L 33/405 257/94 |
| 2013/0234168 A1* | 9/2013 | Kinoshita | H01L 27/153 257/88 |
| 2014/0070259 A1* | 3/2014 | Yoon | H01L 33/62 257/99 |

* cited by examiner

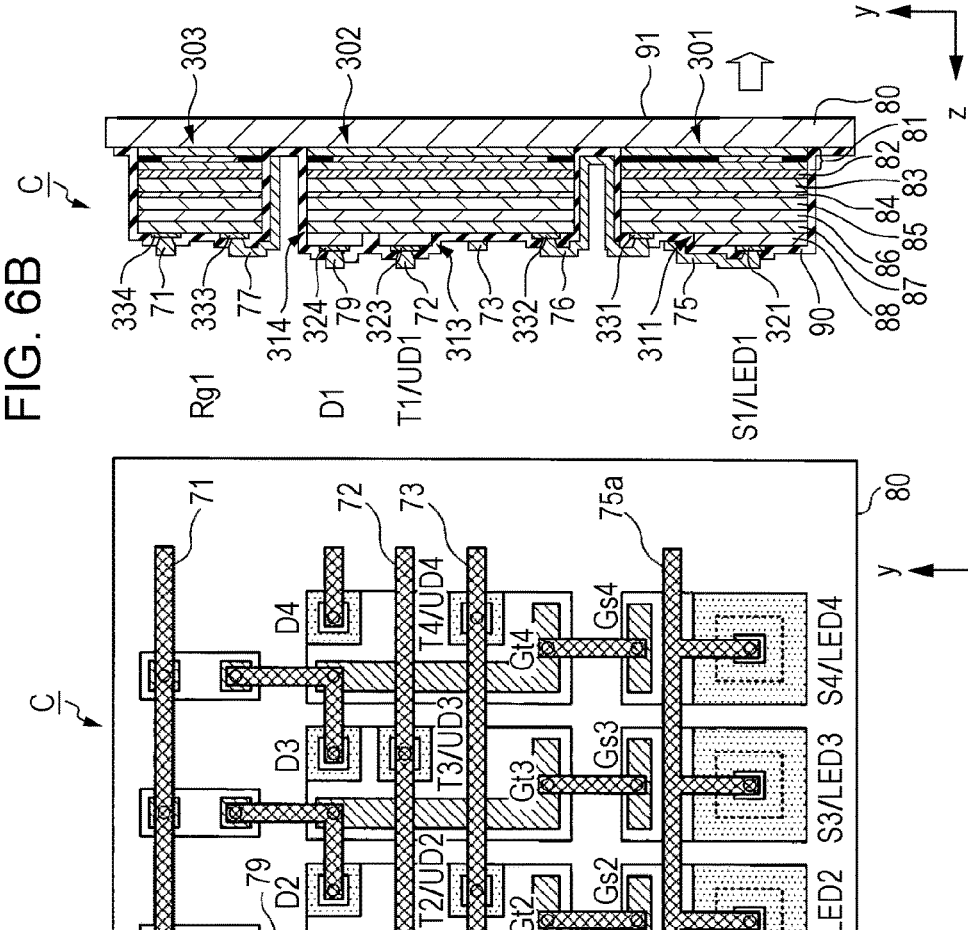
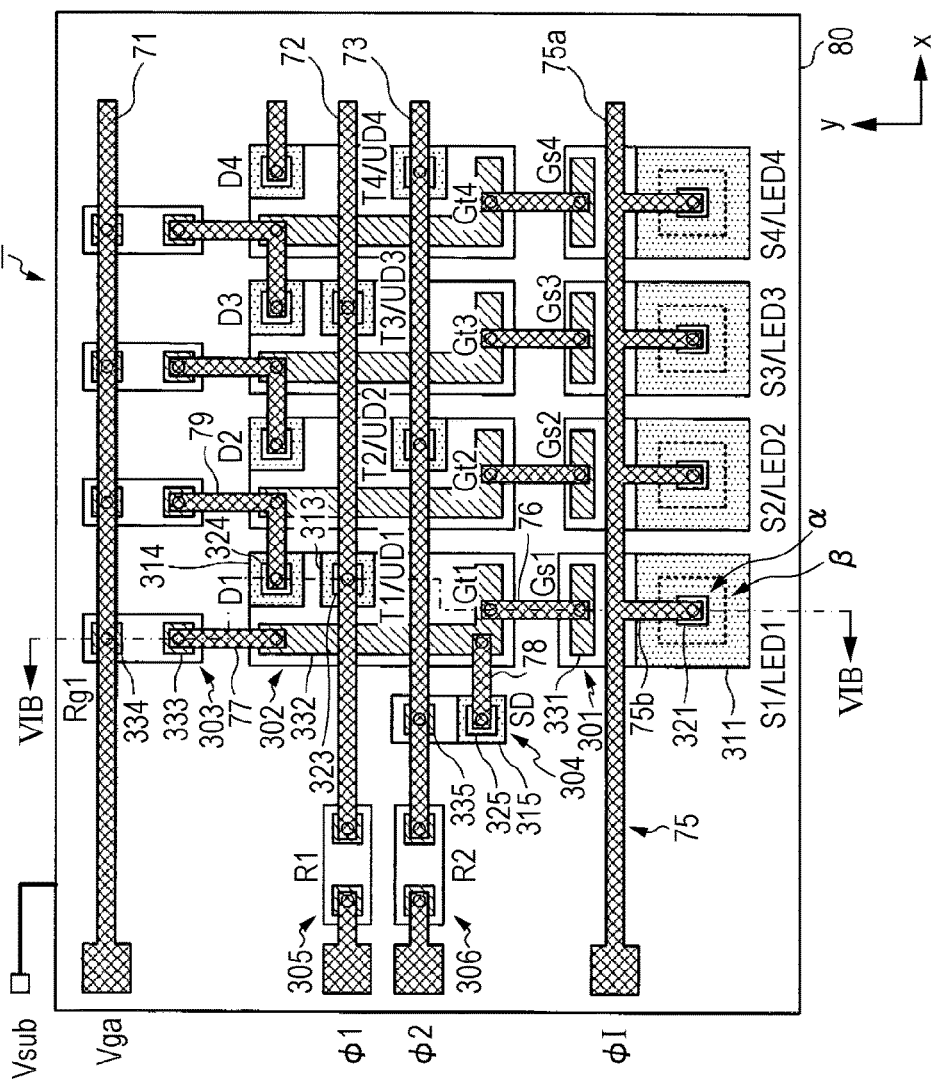
FIG. 6A
FIG. 6B

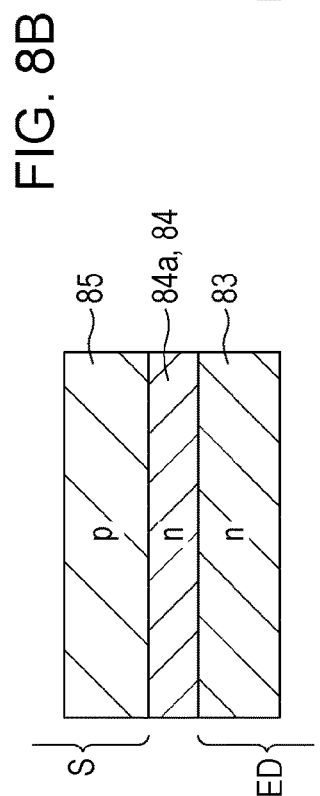
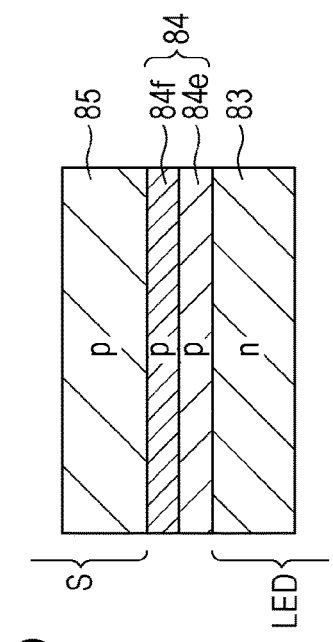
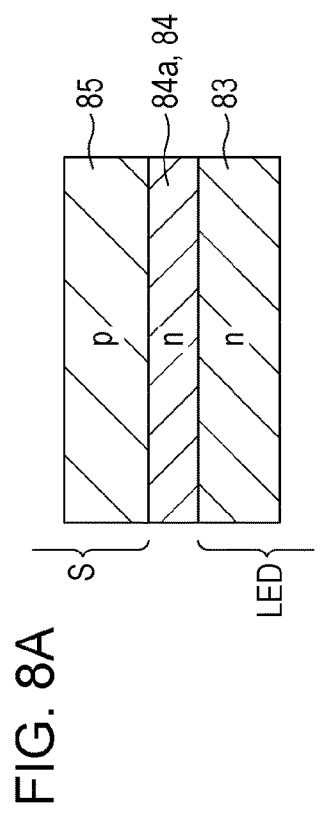
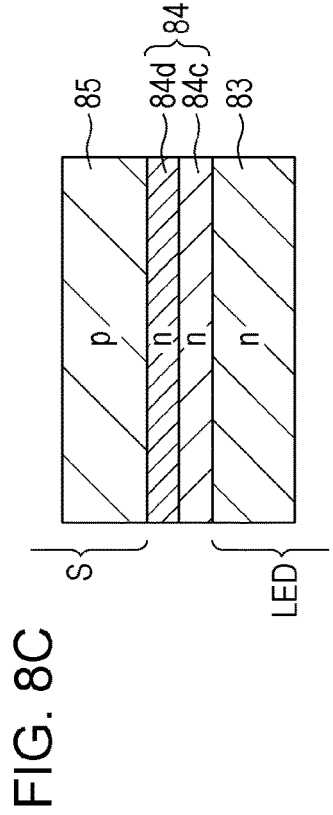
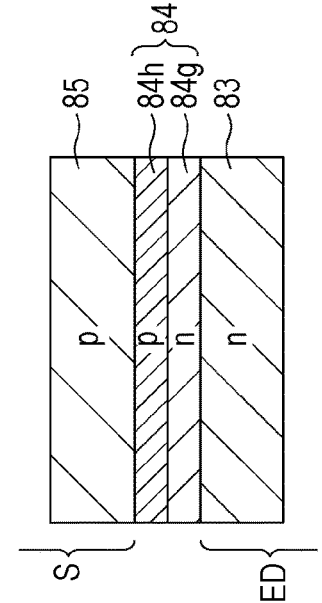

ND IMAGE FORMING APPARATUS

LIGHT-EMITTING COMPONENT, LIGHT-EMITTING DEVICE, AND IMAGE FORMING APPARATUS

CROSS-REFERENCE TO RELATED APPLICATIONS

This application is based on and claims priority under 35 USC 119 from Japanese Patent Application No. 2017-024433 filed Feb. 13, 2017, No. 2017-181724 filed Sep. 21, 2017, No. 2017-181727 filed Sep. 21, 2017, and No. 2017-181730 filed Sep. 21, 2017.

BACKGROUND

Technical Field

The present invention relates to a light-emitting component, a light-emitting device, and an image forming apparatus.

SUMMARY

According to an aspect of the invention, there is provided a light-emitting component including a substrate, a light-emitting element, a thyristor, and a light-transmission reduction layer. The light-emitting element is disposed on the substrate. The thyristor causes the light-emitting element to emit light or causes an amount of light emitted by the light-emitting element to increase, upon entering an on-state. The light-transmission reduction layer is disposed between the light-emitting element and the thyristor such that the light-emitting element and the thyristor are stacked, and suppresses light emitted by the thyristor from passing therethrough.

BRIEF DESCRIPTION OF THE DRAWINGS

Exemplary embodiments of the present invention will be described in detail based on the following figures, wherein:

FIGS. 6A and 6B are examples of a plan layout view and a cross-sectional view of the light-emitting chip according to the first exemplary embodiment, specifically, FIG. 6A is a plan layout view of the light-emitting chip and FIG. 6B is a cross-sectional view taken along line VIB-VIB illustrated in FIG. 6A;

FIGS. 8A to 8E illustrate a light-transmission reduction layer, specifically, FIG. 8A illustrates the case where the light-transmission reduction layer is constituted by a single n-type semiconductor layer, FIG. 8B illustrates the case where the light-transmission reduction layer is constituted by a single p-type semiconductor layer, FIG. 8C illustrates the case where the light-transmission reduction layer is constituted by plural n-type semiconductor layers, FIG. 8D illustrates the case where the light-transmission reduction layer is constituted by plural p-type semiconductor layers, and FIG. 8E illustrates the case where the light-transmission reduction layer is constituted by an n-type semiconductor layer and a p-type semiconductor layer;

FIG. 10A illustrates a semiconductor stack formation step, FIG. 10B illustrates an n-ohmic electrode formation step of forming n-ohmic electrodes, and FIG. 10C illustrates a semiconductor stack dividing step;

FIG. 11A illustrates a current blocking portion formation step of forming a current blocking portion, FIG. 11B illustrates a p-gate layer exposure etching process of exposing a p-gate layer, and FIG. 11C illustrates a p-ohmic electrode formation step of forming p-ohmic electrodes;

FIG. 12A illustrates a protection layer formation step of forming a protection layer, and FIG. 12B illustrates a wire formation step of forming wires and a back-surface electrode;

FIG. 14A is a cross-sectional view of a thyristor not including a voltage reduction layer, FIG. 14B is a cross-sectional view of a thyristor including a voltage reduction layer, and FIG. 14C illustrates characteristics of the thyristors;

DETAILED DESCRIPTION

Exemplary embodiments of the present invention will be described in detail below with reference to the accompanying drawings.

Note that a chemical symbol is used to represent a substance below in such a manner that Al is used for aluminum.

First Exemplary Embodiment

Image Forming Apparatus 1

Figure 1:
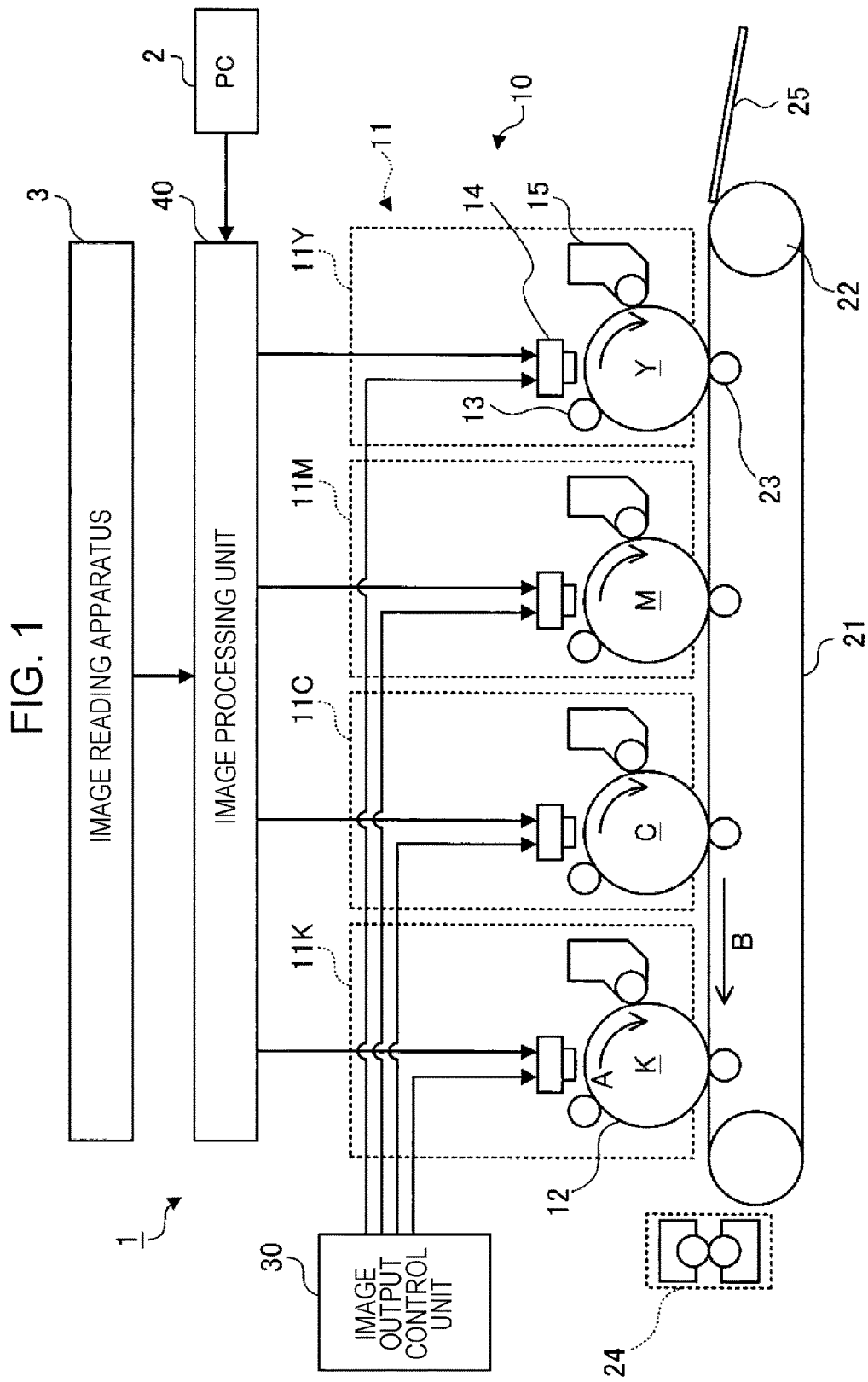
FIG. 1 illustrates an example of an overall configuration of an image forming apparatus to which a first exemplary embodiment is applied.

FIG. 1 illustrates an example of an overall configuration of an image forming apparatus 1 to which a first exemplary embodiment is applied. The image forming apparatus 1 illustrated in FIG. 1 is an image forming apparatus generally called a tandem type. The image forming apparatus 1 includes an image forming process unit 10, an image output control unit 30, and an image processing unit 40. The image forming process unit 10 forms an image in accordance with image data of each color. The image output control unit 30 controls the image forming process unit 10. The image processing unit 40 is connected to, for example, a personal computer (PC) 2 and an image reading apparatus 3 and performs predetermined image processing on image data received from the PC 2 and the image reading apparatus 3.

The image forming process unit 10 includes image forming units 11Y, 11M, 11C, and 11K that are disposed in parallel to each other with a predetermined space therebetween. The image forming units 11Y, 11M, 11C, and 11K are referred to as image forming units 11 when they are not distinguished from one another. Each of the image forming units 11 includes a photoconductor drum 12, a charger 13, a printhead 14, and a developer 15. The photoconductor drum 12, which is an example of an image bearing member, bears an electrostatic latent image and a toner image formed thereon. The charger 13, which is an example of a charging member, charges the surface of the photoconductor drum 12 to a predetermined potential. The printhead 14 exposes the photoconductor drum 12 that has been charged by the charger 13 to light. The developer 15, which is an example of a developing member, develops the electrostatic latent image obtained by the printhead 14. The image forming units 11Y, 11M, 11C, and 11K form toner images of yellow (Y), magenta (M), cyan (C), and black (K), respectively.

The image forming process unit 10 also includes a sheet transporting belt 21, a drive roll 22, transfer rolls 23, and a fixer 24 to transfer the toner images of the respective colors formed on the photoconductor drums 12 of the respective image forming units 11Y, 11M, 11C, and 11K onto a recording sheet 25 so that the toner images are superimposed together. The recording sheet 25 is an example of a transferred-image-receiving medium. The sheet transporting belt 21 transports the recording sheet 25. The drive roll 22 drives the sheet transporting belt 21. Each of the transfer rolls 23, which is an example of a transfer member, transfers the corresponding toner image on the corresponding photoconductor drum 12 onto the recording sheet 25. The fixer 24 fixes the toner images on the recording sheet 25.

In the image forming apparatus 1, the image forming process unit 10 performs an image forming operation in accordance with various control signals supplied thereto from the image output control unit 30. Under control of the image output control unit 30, the image processing unit 40 performs image processing on image data received from the PC 2 or the image reading apparatus 3 and supplies the resultant image data to the image forming units 11. Then, for example, in the image forming unit 11K for black (K), the photoconductor drum 12 is charged to a predetermined potential by the charger 13 while rotating in a direction of an arrow A and is exposed to light by the printhead 14 that emits light on the basis of the image data supplied thereto from the image processing unit 40. Consequently, an electrostatic latent image for an image of black (K) is formed on the photoconductor drum 12. The electrostatic latent image formed on the photoconductor drum 12 is then developed by the developer 15, and consequently a toner image of black (K) is formed on the photoconductor drum 12. Toner images of yellow (Y), magenta (M), and cyan (C) are formed in the image forming units 11Y, 11M, and 11C, respectively.

The toner images of the respective colors formed on the respective photoconductor drums 12 in the corresponding image forming units 11 are sequentially transferred electrostatically onto the recording sheet 25 that is fed in response to a movement of the sheet transporting belt 21 moving in a direction of an arrow B, by a transfer electric field applied to the transfer rolls 23. Consequently, a combined toner image in which the toner images of the respective colors are superimposed together is formed on the recording sheet 25.

Then, the recording sheet 25 having the electrostatically transferred combined toner image is transported to the fixer 24. The combined toner image on the recording sheet 25 transported to the fixer 24 undergoes a heat/pressure-based fixing process performed by the fixer 24 and is fixed on the recording sheet 25. Then, the recording sheet 25 is discharged from the image forming apparatus 1.

Printhead 14

Figure 2:
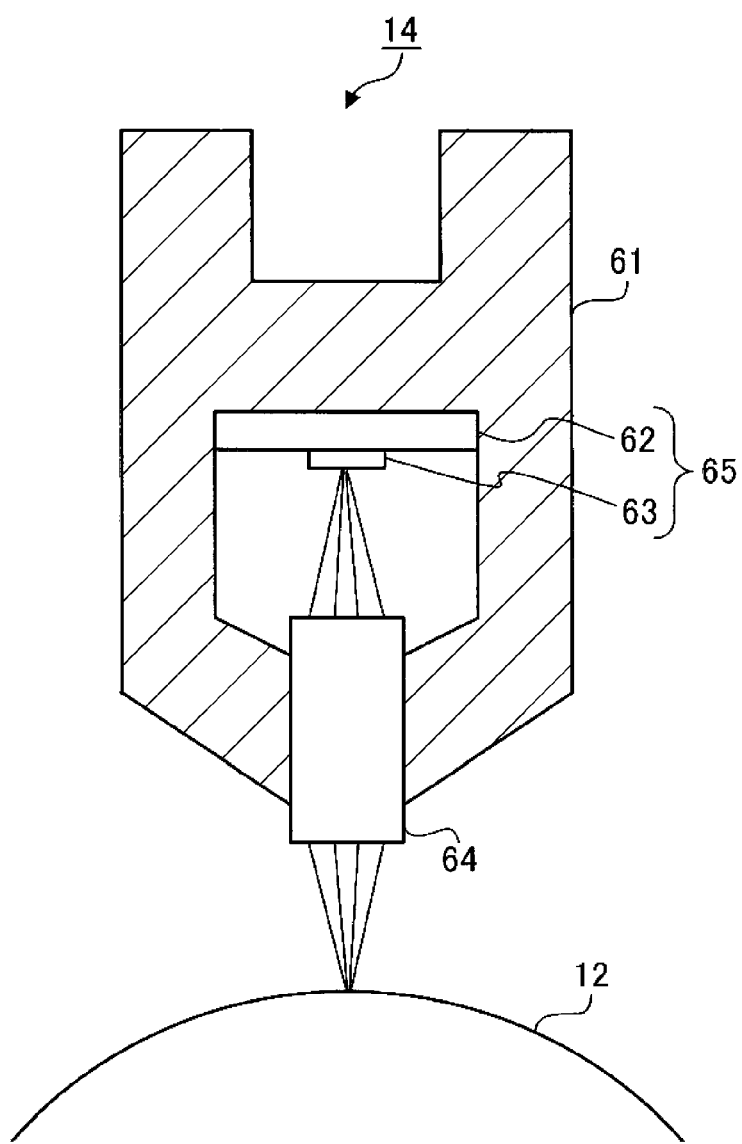
FIG. 2 is a cross-sectional view illustrating an example of a configuration of a printhead.

FIG. 2 is a cross-sectional view illustrating an example of a configuration of the printhead 14. The printhead 14, which is an example of an exposure device, includes a housing 61, a light-emitting device 65, and a rod lens array 64. The light-emitting device 65, which is an example of a light-emitting device, includes a light source unit 63 including plural light-emitting elements that expose the photoconductor drum 12 to light. In the first exemplary embodiment, the light-emitting elements are light-emitting diodes (LEDs), each of which is an example of a light-emitting element. The rod lens array 64, which is an example of an optical system, focuses the light emitted from the light source unit 63 onto the surface of the photoconductor drum 12 to form an image thereon.

The light-emitting device 65 includes a circuit board 62 on which the light source unit 63 described above, a signal generation circuit 110 (described later with reference to FIG. 3) that drives the light source unit 63, and so forth are mounted.

The housing 61 is formed of a metal, for example. The housing 61 supports the circuit board 62 and the rod lens array 64 to set the light-emitting surface of the light-emitting elements of the light source unit 63 to be a focal plane of the rod lens array 64. In addition, the rod lens array 64 is disposed in an axial direction of the photoconductor drum 12 (which is a main scanning direction and an X direction in FIGS. 3 and 4B described later).

Light-Emitting Device 65

Figure 3:
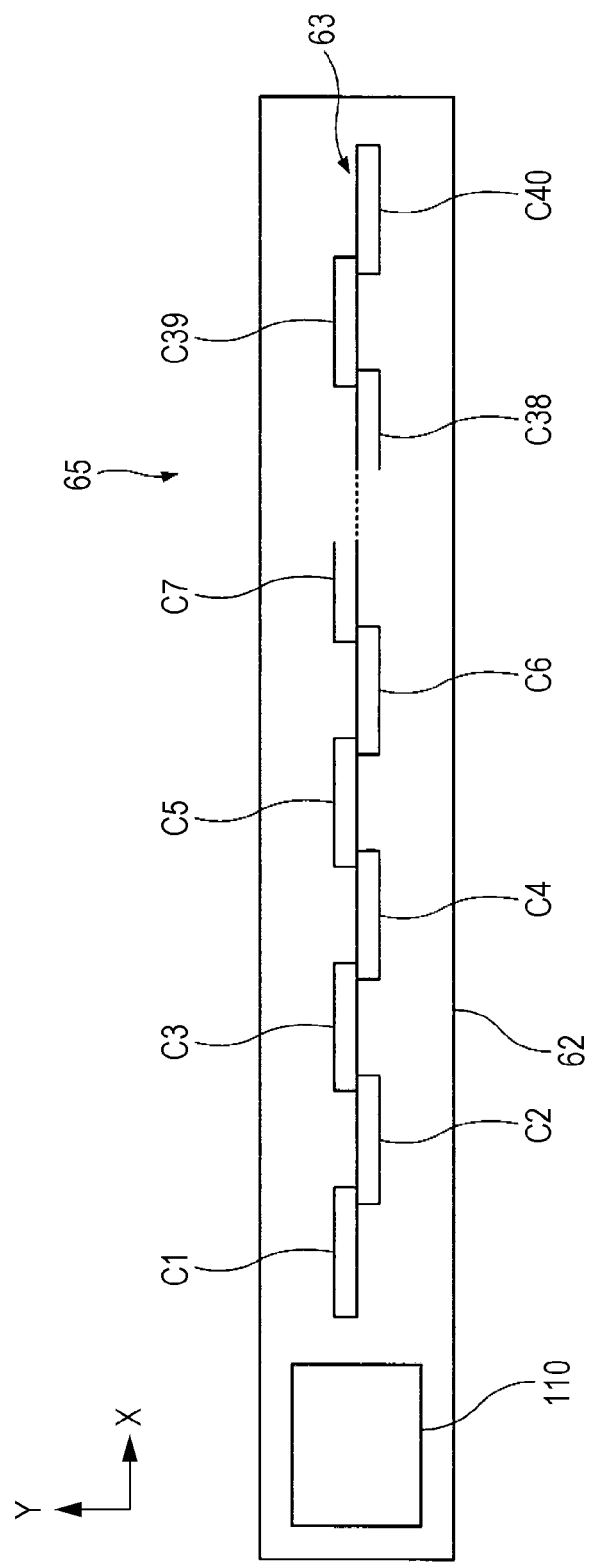
FIG. 3 is a top view of an example of a light-emitting device.

FIG. 3 is a top view of an example of the light-emitting device 65.

In the light-emitting device 65 illustrated by way of example in FIG. 3, the light source unit 63 includes 40 light-emitting chips C1 to C40 arranged in two lines in the X direction which is the main scanning direction on the circuit board 62 to form a staggered pattern. The light-emitting chips C1 to C40, each of which is an example of a light-emitting component, are referred to as light-emitting chips C when they are not distinguished from one another. The light-emitting chips C1 to C40 may have an identical configuration.

Herein, a symbol "-" or a word "to" is used to indicate plural components that are distinguished from one another using numbers and indicates that the plural components include components that are assigned the numbers preceding and following the symbol "-" or the word "to" and components that are assigned numbers between the preceding and following numbers. For example, the light-emitting chips C1-C40 (C1 to C40) include the light-emitting chip C1 through the light-emitting chip C40 in the numbered order.

In the first exemplary embodiment, 40 light-emitting chips C in total are used; however, the number of light-emitting chips C is not limited to 40.

The light-emitting device 65 includes the signal generation circuit 110 that drives the light source unit 63. The signal generation circuit 110 is constituted by an integrated circuit (IC), for example. Note that the light-emitting device 65 need not necessarily include the signal generation circuit 110. In such a case, the signal generation circuit 110 is provided outside the light-emitting device 65 and supplies control signals for controlling the light-emitting chips C or the like to the light-emitting device 65 through a cable or the like. The description is given herein on the assumption that the light-emitting device 65 includes the signal generation circuit 110.

An arrangement of the light-emitting chips C will be described in detail later.

Figures 4A, 4B:
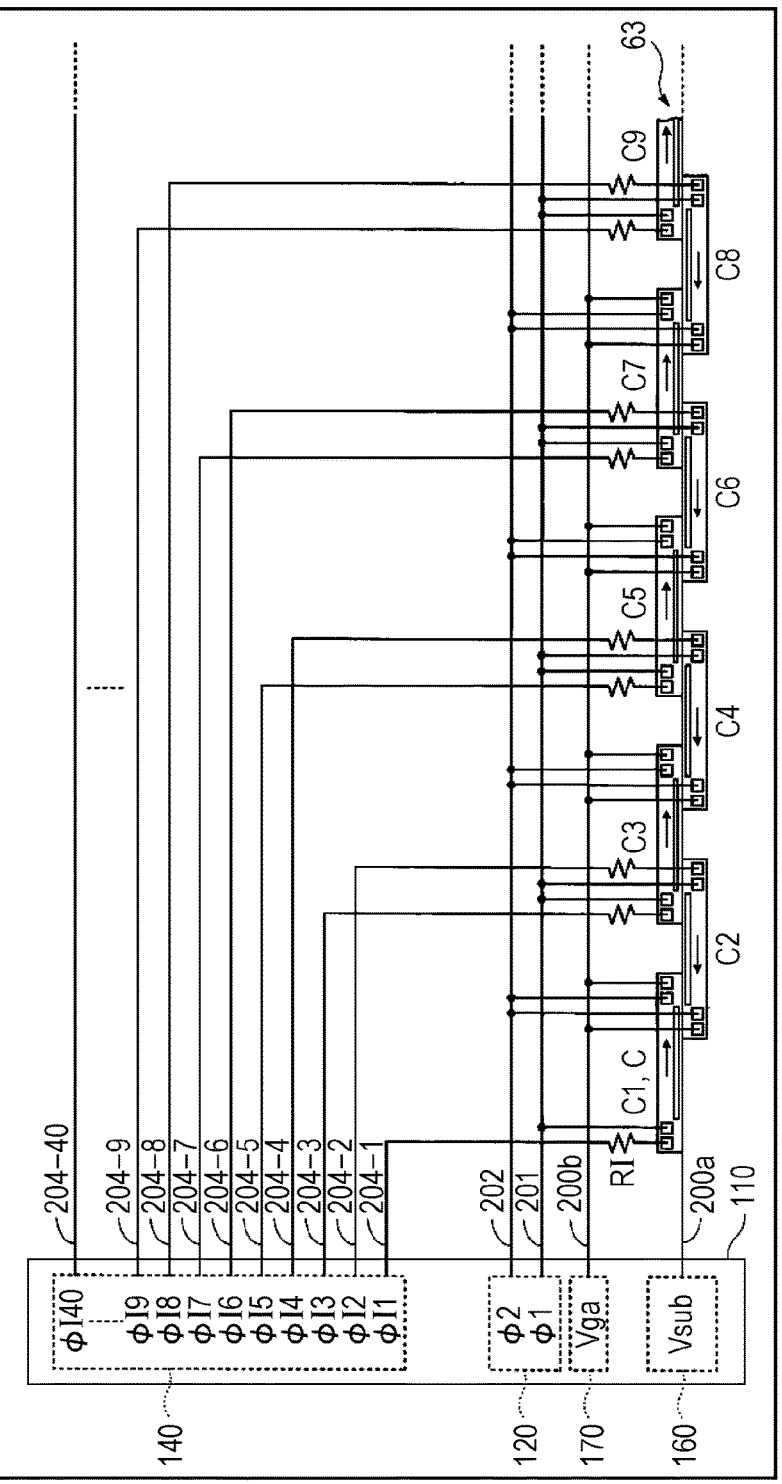
FIGS. 4A and 4B illustrate an example of a configuration of a light-emitting chip, an example of a configuration of a signal generation circuit of the light-emitting device, and an example of a configuration of wires (lines) on a circuit board.

FIGS. 4A and 4B illustrate an example of a configuration of each of the light-emitting chips C, an example of a configuration of the signal generation circuit 110 of the light-emitting device 65, and an example of a configuration of wires (lines) on the circuit board 62. Specifically, FIG. 4A illustrates the configuration of the light-emitting chip C, and FIG. 4B illustrates the configuration of the signal generation circuit 110 of the light-emitting device 65 and the configuration of wires (lines) on the circuit board 62. Note that FIG. 4B illustrates the light-emitting chips C1 to C9 among the light-emitting chips C1 to C40.

First, the configuration of the light-emitting chip C illustrated in FIG. 4A will be described.

The light-emitting chip C includes a light-emitting unit 102 including plural light-emitting elements arranged in a line along long sides to be closer to one of the long sides on a front surface of a substrate 80 that has a rectangular shape. In the first exemplary embodiment, the plural light-emitting elements are light-emitting diodes LED1 to LED128. The light-emitting diodes LED1 to LED128 are referred to as light-emitting diodes LED when they are not distinguished from one another. The light-emitting chip C further includes terminals ($\phi 1$, $\phi 2$, Vga, and $\phi I$) at respective ends of a long-side direction on the front surface of the substrate 80. The terminals are plural bonding pads for receiving various control signals, for example. These terminals are disposed in an order of the terminal $\phi I$ and the terminal $\phi 1$ from one of the ends of the substrate 80 and in an order of the terminal Vga and the terminal $\phi 2$ from the other end of the substrate 80. The light-emitting unit 102 is disposed between the terminals $\phi 1$ and $\phi 2$. A back-surface electrode 91 (see FIGS. 6A and 6B described later), which serves as a terminal Vsub, is also disposed on a back surface of the substrate 80. A direction in which the light-emitting diodes LED1-LED128 are arranged on the front surface of the substrate 80 is defined as an x direction, and a direction perpendicular to the x direction is defined as a y direction.

Note that the expression "arranged in a line" refers not only to a state in which plural light-emitting elements (light-emitting diodes LED in the first exemplary embodiment) are arranged in a line as illustrated in FIG. 4A but also to a state in which the plural light-emitting elements are shifted from each other by different displacement amounts in a direction perpendicular to the direction of the line. For example, the light-emitting elements may be arranged to be shifted from each other by a displacement amount in a direction perpendicular to the direction of the line. In addition, sets of adjacent light-emitting elements or of plural light-emitting elements may be arranged in a zigzag pattern.

The configuration of the signal generation circuit 110 of the light-emitting device 65 and the configuration of wires (lines) on the circuit boards 62 will be described next with reference to FIG. 4B.

As described above, the signal generation circuit 110 and the light-emitting chips C1 to C40 are mounted on the circuit board 62 of the light-emitting device 65, and wires (lines) that connect the signal generation circuit 110 and the respective light-emitting chips C1 to C40 to each other are provided on the circuit board 62.

The configuration of the signal generation circuit 110 will be described first.

The signal generation circuit 110 receives various control signals and pieces of image data that have been subjected to image processing respectively from the image output control unit 30 and the image processing unit 40 (see FIG. 1). The signal generation circuit 110 rearranges the pieces of image data and corrects an amount of light on the basis of the pieces of image data and the various control signals.

The signal generation circuit 110 includes a transfer signal generation unit 120 that sends a first transfer signal $\phi 1$ and a second transfer signal $\phi 2$ to the light-emitting chips C1 to C40 on the basis of the various control signals.

The signal generation circuit 110 also includes a turn-on signal generation unit 140 that sends turn-on signals $\phi I1$ to $\phi I40$ to the light-emitting chips C1 to C40 on the basis of the various control signals, respectively. The turn-on signals $\phi I1$ to $\phi I40$ are referred to as turn-on signals $\phi I$ when they are not distinguished from each other.

The signal generation circuit 110 further includes a reference potential supplying unit 160 and a power supply potential supplying unit 170. The reference potential supplying unit 160 supplies a reference positional Vsub, which serves as a reference of the potential, to the light-emitting chips C1 to C40. The power supply potential supplying unit 170 supplies a power supply potential Vga for driving the light-emitting chips C1 to C40.

The arrangement of the light-emitting chips C1 to C40 will be described next.

Odd-numbered light-emitting chips C1, C3, C5, . . . are arranged in a line in a long-side direction of the substrate 80 with a space interposed therebetween. Even-numbered light-emitting chips C2, C4, C6, . . . are also arranged in a line in the long-side direction of the substrate 80 with a space interposed therebetween. The odd-numbered light-emitting chips C1, C3, C5, . . . and the even-numbered light-emitting chips C2, C4, C6, . . . are arranged in a staggered pattern with being rotated by 180° from each other so that the long sides close to the light-emitting units 102 on the adjacent odd-numbered and even-numbered light-emitting chips C face each other. Positions of the light-emitting chips C are set such that the light-emitting diodes LED of the light-emitting chips C are arranged in the main scanning direction (X direction) at predetermined intervals. Note that a direction in which the light-emitting diodes LED of the light-emitting unit 102 illustrated in FIG. 4A are arranged (i.e., the numbered order of the light-emitting diodes LED1 to LED 128 in the first exemplary embodiment) is indicated using an arrow in each of the light-emitting chips C1 to C40 in FIG. 4B.

The wires (lines) that connect the signal generation circuit 110 and the light-emitting chips C1 to C40 to each other will be described.

A power supply line 200*a* is provided on the circuit board 62. The power supply line 200*a* is connected to the back-surface electrodes 91 (see FIGS. 6A and 6B described later) which serve as the terminals Vsub disposed on the back surfaces of the substrates 80 of the respective light-emitting chips C and supplies the reference potential Vsub.

A power supply line 200*b* is also provided on the circuit board 62. The power supply line 200*b* supplies the power supply potential Vga for driving. The power supply line 200*b* connects the power supply potential supplying unit 170 of the signal generation circuit 110 and the terminals Vga provided in the respective light-emitting chips C to each other.

A first transfer signal line 201 and a second transfer signal line 202 are provided on the circuit board 62. The first transfer signal line 201 is used to send the first transfer signal φ1 from the transfer signal generation unit 120 of the signal generation circuit 110 to the terminals φ1 of the respective light-emitting chips C1 to C40. The second transfer signal line 202 is used to send the second transfer signal φ2 from the transfer signal generation unit 120 of the signal generation circuit 110 to the terminals φ2 of the respective light-emitting chips C1 to C40. The first transfer signal φ1 and the second transfer signal φ2 are sent to the light-emitting chips C1 to C40 in common (in parallel).

In addition, turn-on signal lines 204-1 to 204-40 are provided on the circuit board 62. The turn-on signal lines 204-1 to 204-40 are used to send the turn-on signals φI1 to φI40 from the turn-on signal generation unit 140 of the signal generation circuit 110 to the terminals φI of the light-emitting chips C1 to C40 through respective current-limiting resistors RI, respectively. The turn-on signal lines 204-1 to 204-40 are referred to as turn-on signal lines 204 when they are not distinguished from one another.

As described above, the reference potential Vsub and the power supply potential Vga are supplied to all the light-emitting chips C1 to C40 on the circuit board 62 in common. The first transfer signal φ1 and the second transfer signal φ2 are also sent to the light-emitting chips C1 to C40 in common (in parallel). On the other hand, the turn-on signals φI1 to φI40 are individually sent to the light-emitting chips C1 to C40, respectively.

Light-Emitting Chip C

Figure 5:
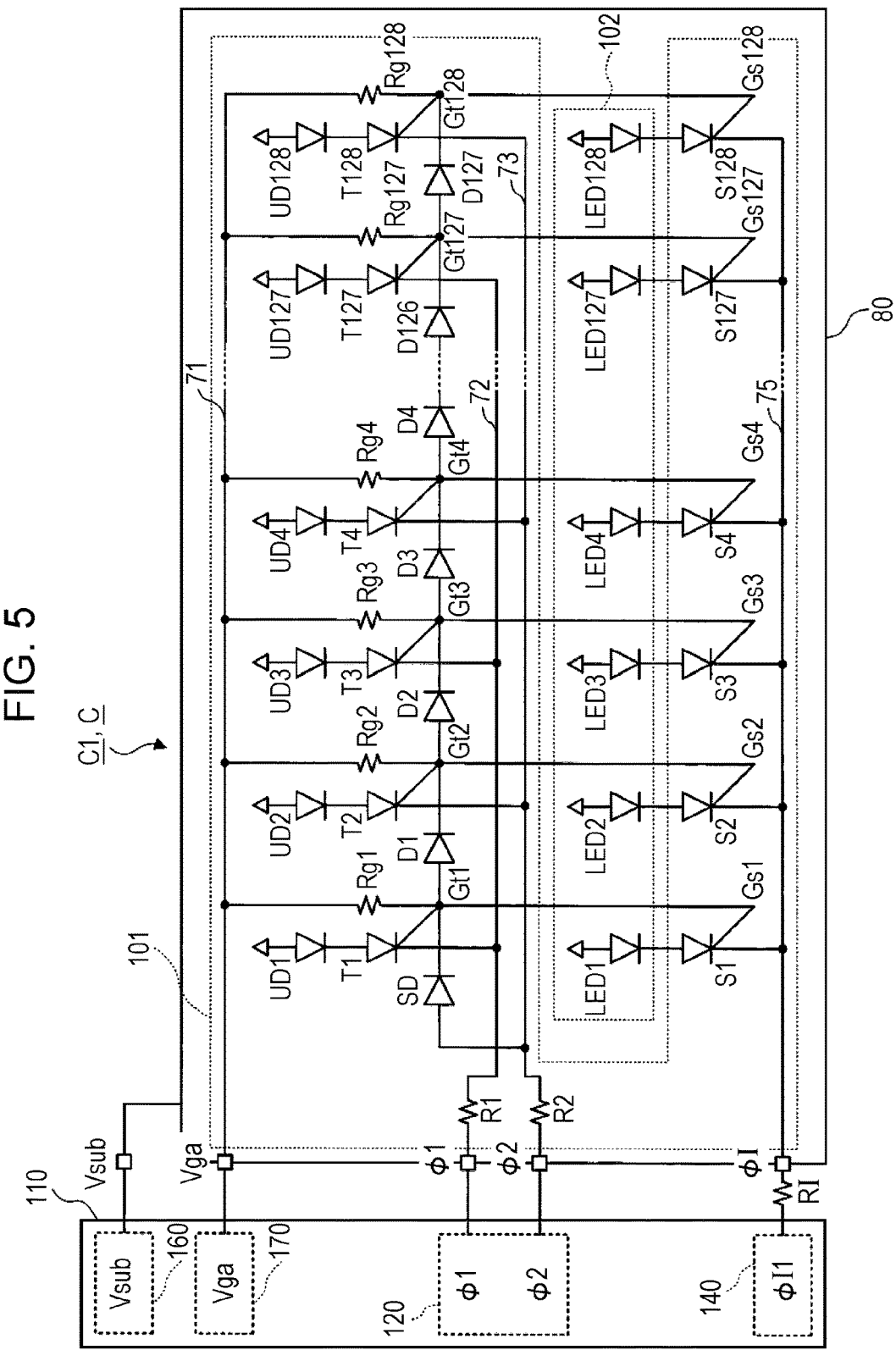
FIG. 5 is an equivalent circuit diagram illustrating a circuit configuration of the light-emitting chip in which a self-scanning light-emitting device (SLED) array according to the first exemplary embodiment is mounted.

FIG. 5 is an equivalent circuit diagram illustrating a circuit configuration of the light-emitting chip C in which an SLED array according to the first exemplary embodiment is mounted. Elements described below are arranged in accordance with the layout (see FIGS. 6A and 6B described later) on the light-emitting chip C except for the terminals (φ1, φ2, Vga, and φI). Note that the positions of the terminals (φ1, φ2, Vga, and φI) are different from those illustrated in FIG. 4A because the terminals are illustrated on the left end in FIG. 5 in order to describe connections with the signal generation circuit 110. The terminal Vsub provided on the back surface of the substrate 80 is illustrated outside the substrate 80 as an extended terminal.

The light-emitting chips C will be described in relationship with the signal generation circuit 110 by using the light-emitting chip C1 by way of example. Accordingly, the light-emitting chip C is referred to as the light-emitting chip C1(C) in FIG. 5. The other light-emitting chips C2 to C40 have the same or substantially the same configuration as the light-emitting chip C1.

The light-emitting chip C1(C) includes the light-emitting unit 102 (see FIG. 4A) including the light-emitting diodes LED1 to LED128.

The light-emitting chip C1(C) also includes driving thyristors S1 to S128, which are referred to driving thyristors S when they are not distinguished from one another. The light-emitting diodes LED1 to LED128 are connected to the driving thyristors S1 to S128, respectively, such that the light-emitting diode LED and the driving thyristor that are assigned the same number are connected in series.

As illustrated in FIG. 6B described later, the light-emitting diodes LEDs that are arranged in a line on the substrate 80 are stacked on the respective driving thyristors S. Thus, the driving thyristors S1 to S128 are also arranged in a line. Since the driving thyristors S set (control) on/off of the respective light-emitting diodes LED as described later, the driving thyristors S are elements that drive the respective light-emitting diodes LED. Note that the driving thyristors S are sometimes simply referred to as thyristors.

The light-emitting chip C1(C) further includes transfer thyristors T1 to T128 that are also arranged in a line just like the light-emitting diodes LED1 to LED128 and the driving thyristors S1 to S128. The transfer thyristors T1 to T128 are referred to as transfer thyristors T when they are not distinguished from one another.

The light-emitting chip C1(C) also includes lower diodes UD1 to UD128 having a structure substantially the same as that of the light-emitting diodes LED1 to LED128. The lower diodes UD1 to UD128 are referred to as lower diodes UD when they are not distinguished from one another. The lower diodes UD1 to UD128 and the transfer thyristors T1 to T128 are respectively connected to each other. That is, the lower diode UD and the transfer thyristor T assigned the same number are connected in series.

As illustrated in FIG. 6B described later, each transfer thyristor T is stacked on a corresponding one of the lower diodes UD arranged in a line on the substrate 80. Thus, the transfer thyristors S1 to S128 are also arranged in a line. Note that the lower diode UD is an example of a lower element.

Although the description is given here by using the transfer thyristors T as an example of transfer elements, the transfer elements may be any other circuit elements that sequentially turn on. For example, a shift register or a circuit element including a combination of plural transistors may be used.

In addition, the light-emitting chip C1(C) includes coupling diodes D1 to D127. The transfer thyristors T1 to T128 are paired in the numbered order, and each of the coupling diodes D1 to D127 is disposed between a corresponding one of the pairs. The coupling diodes D1 to D127 are referred to as coupling diodes D when they are not distinguished from one another.

Further, the light-emitting chip C1(C) includes power supply line resistors Rg1 to Rg128. The power supply line resistors Rg1 to Rg128 are referred to as power supply line resistors Rg when they are not distinguished from one another.

The light-emitting chip C1(C) also includes a start diode SD. In addition, the light-emitting chip C1(C) includes current-limiting resistors R1 and R2 that are provided to prevent an excessive current from flowing through a first transfer signal line 72 (described later) used to send the first transfer signal $\phi 1$ and through a second transfer signal line 73 (described later) used to send the second transfer signal $\phi 2$.

In this example, the driving thyristors S1 to S128, the transfer thyristors T1 to T128, the lower diodes UD1 to UD128, the power supply line resistors Rg1 to Rg128, the coupling diodes D1 to D127, the start diode SD, and the current-limiting resistors R1 and R2 constitute a driving unit 101.

The light-emitting diodes LED1 to LED128 of the light-emitting unit 102 and the driving thyristors S1 to S128, the transfer thyristors T1 to T128, and the lower diodes UD1 to UD128 of the driving unit 101 are arranged in the numbered order from the left in FIG. 5. Further, the coupling diodes D1 to D127 and the power supply line resistors Rg1 to Rg128 are also arranged in the numbered order from the left in FIG. 5.

The light-emitting chip C includes a power supply line 71 supplied with a power supply potential Vga, the first transfer signal line 72 supplied with the first transfer signal $\phi 1$, the second transfer signal line 73 supplied with the second transfer signal $\phi 2$, and a turn-on signal line 75 that supplies a current to turn on the light-emitting diodes LED.

In the first exemplary embodiment, the number of light-emitting diodes LED of the light-emitting unit 102 and the number of driving thyristors S, the number of transfer thyristors T, the number of lower diodes UD, and the number of power supply line resistors Rg of the driving unit 101 are set equal to 128. The number of coupling diodes D is equal to 127, which is less than the number of transfer thyristors T by 1.

The numbers of light-emitting diodes LED and other elements are not limited to the above values and may be set equal to predetermined values. The number of transfer thyristors T may be greater than the number of light-emitting diodes LED.

Each of the diodes (the light-emitting diodes LED, the lower diodes UD, the coupling diodes D, and the start diode SD) is a two-terminal semiconductor element having an anode terminal (anode) and a cathode terminal (cathode).

Each of the thyristors (the driving thyristors S and the transfer thyristors T) is a three-terminal semiconductor element having an anode terminal (anode), a gate terminal (gate), and a cathode terminal (cathode).

Note that the diodes (the light-emitting diodes LED, the lower diodes UD, the coupling diodes D, and the start diode SD) and the thyristors (the driving thyristors S and the transfer thyristors T) do not necessarily have the anode terminal, the gate terminal, or the cathode terminal that is formed as an electrode in some cases. Thus, hereinafter, the anode terminal, the gate terminal, and the cathode terminal are sometimes referred to as an anode, a gate, or a cathode, respectively.

Electrical connections between the elements of the light-emitting chip C1(C) will be described next.

The anodes of the light-emitting diodes LED and the anodes of the lower diodes UD are connected to the substrate 80 of the light-emitting chip C1(C) (anode-common). These anodes are connected to the power supply line 200*a* (see FIG. 4B) through the back-surface electrode 91 (see FIG. 6B described later) which is the terminal Vsub provided on the back surface of the substrate 80. The power supply line 200*a* is supplied with the reference potential Vsub from the reference potential supplying unit 160.

The cathodes of the light-emitting diodes LED are connected to the corresponding anodes of the respective driving thyristors S. The cathodes of the lower diodes UD are connected to the corresponding anodes of the respective transfer thyristors T.

Note that this connection is a configuration implemented when a p-type substrate is used as the substrate 80. When an n-type substrate is used, the polarity is reversed. When an intrinsic (i-type) substrate that is not doped with any impurities is used, a terminal connected to the power supply line 200*a* that supplies the reference potential Vsub is provided on the side of the substrate on which the driving unit 101 and the light-emitting unit 102 are disposed.

The cathodes of the odd-numbered transfer thyristors T1, T3, . . . are connected to the first transfer signal line 72 along the line of the transfer thyristors T. The first transfer signal line 72 is connected to the terminal $\phi 1$ through the current-limiting resistor R1. The first transfer signal line 201 (see FIG. 4B) is connected to the terminal $\phi 1$, and the first transfer signal $\phi 1$ is sent to the terminal $\phi 1$ from the transfer signal generation unit 120.

On the other hand, the cathodes of the even-numbered transfer thyristors T2, T4, . . . are connected to the second transfer signal line 73 along the line of the transfer thyristors T. The second transfer signal line 73 is connected to the terminal $\phi 2$ through the current-limiting resistor R2. The second transfer signal line 202 (see FIG. 4B) is connected to the terminal $\phi 2$, and the second transfer signal $\phi 2$ is sent to the terminal $\phi 2$ from the transfer signal generation unit 120.

The cathodes of the driving thyristors S are connected to the turn-on signal line 75. The turn-on signal line 75 is connected to the terminal $\phi$I. The terminal $\phi$I of the light-emitting chip C1 is connected to the turn-on signal line 204-1 through a current-limiting resistor RI that is provided outside the light-emitting chip C1(C), and the turn-on signal $\phi$I1 is sent to the terminal $\phi$I from the turn-on signal generation unit 140 (see FIG. 4B). The turn-on signal $\phi$I1 supplies a current to turn on the light-emitting diodes LED1 to LED128. Note that the turn-on signal lines 204-2 to 204-40 are respectively connected to the terminals $\phi$I of the other light-emitting chips C2 to C40 through the respective current-limiting resistors RI, and the turn-on signals $\phi$I2 to φI40 are sent to the respective terminals φI from the turn-on signal generation unit 140 (see FIG. 4B).

Gates Gt1 to Gt128 of the transfer thyristors T1 to T128 are connected to gates Gs1 to Gs128 of the driving thyristors S1 to S128, respectively, to have a one-to-one correspondence. The gates Gt1 to Gt128 are referred to as gates Gt when they are not distinguished from one another, and the gates Gs1 to Gs128 are referred to as gates Gs when they are not distinguished from one another. Thus, each pair of gates assigned the same number among the gates Gt1 to Gt128 and the gates Gs1 to Gs128 has an electrically equal potential. For example, the expression "gate Gt1 (gate Gs1)" indicates that the gate Gt1 and the gate Gs1 have an equal potential.

Each of the coupling diodes D1 to D127 is connected between a corresponding pair of gates Gt, which are two of the gates Gt1 to Gt128 of the transfer thyristors T1 to T128 in the numbered order. That is, the coupling diodes D1 to D127 are connected in series so that each of the coupling diodes D1 to D127 is interposed between a corresponding pair among the gates Gt1 to Gt128. The coupling diode D1 is connected so that current flows from the gate Gt1 to the gate Gt2. The same applies to the other coupling diodes D2 to D127.

The gates Gt of the transfer thyristors T are connected to the power supply line 71 through the respective power supply line registers Rg provided for the corresponding transfer thyristors T. The power supply line 71 is connected to the terminal Vga. The power supply line 200b (see FIG. 4B) is connected to the terminal Vga, and the terminal Vga is supplied with the power supply potential Vga from the power supply potential supplying unit 170.

The gate Gt1 of the transfer thyristor T1 is connected to the cathode terminal of the start diode SD. The anode of the start diode SD is connected to the second transfer signal line 73.

FIGS. 6A and 6B are an example of a plan layout view and a cross-sectional view of the light-emitting chip C according to the first exemplary embodiment. Specifically, FIG. 6A is a plan layout view of the light-emitting chip C, and FIG. 6B is a cross-sectional view taken along line VIB-VIB illustrated in FIG. 6A. Since connections between the light-emitting chips C and the signal generation circuit 110 are not illustrated in FIGS. 6A and 6B, it is not necessarily to use the light-emitting chip C1 by way of example. Thus, the term "light-emitting chip C" is used.

FIG. 6A mainly illustrates a portion around the light-emitting diodes LED1 to LED4, the driving thyristors S1 to S4, the transfer thyristors T1 to T4, and the lower diodes UD1 to UD4. Note that the terminals (φ1, φ2, Vga, and φI) are illustrated at the left end portion in FIG. 6A for convenience of explanation, and these positions of the terminals are different from those illustrated in FIG. 4A. The terminal Vsub (the back-surface electrode 91) disposed on the back surface of the substrate 80 is illustrated outside the substrate 80 as an extended terminal. When the terminals are disposed in accordance with FIG. 4A, the terminals φ2 and Vga and the current-limiting resistor R2 are disposed at a right end portion of the substrate 80. In addition, the start diode SD may be disposed on the right end portion of the substrate 80.

FIG. 6B, which is a cross-sectional view taken along line VIB-VIB illustrated in FIG. 6A, illustrates the driving thyristor S1/the light-emitting diode LED1, the transfer thyristor T1/the lower diode UD1, the coupling diode D1, and the power supply line resistor Rg1 sequentially from the bottom. Note that the driving thyristor S1 and the light-emitting diode LED1 are stacked. Likewise, the transfer thyristor T1 and the lower diode UD1 are stacked.

FIGS. 6A and 6B illustrate major elements and terminals using reference signs thereof. Note that a direction in which the light-emitting diodes LED (light-emitting diodes LED1 to LED4) are arranged on the front surface of the substrate 80 is assumed to be an x direction, and a direction perpendicular to the x direction is assumed to be a y direction. A direction from the back surface to the front surface of the substrate 80 is assumed to be a z direction.

First, the cross-sectional structure of the light-emitting chip C is described with reference to FIG. 6B.

A p-type anode layer 81 (p-anode layer 81), a light-emitting layer 82, and an n-type cathode layer 83 (n-cathode layer 83) that constitute the light-emitting diode LED and the lower diode UD are disposed on the p-type substrate 80 (the substrate 80).

A light-transmission reduction layer 84 is disposed on the n-cathode layer 83.

Further, a p-type anode layer 85 (p-anode layer 85), an n-type gate layer 86 (n-gate layer 86), a p-type gate layer (p-gate layer 87), and an n-type cathode layer 88 (n-cathode layer 88) that constitute the driving thyristor S, the transfer thyristor T, the coupling diode D1, and the power supply line resistor Rg1 are sequentially disposed on the light-transmission reduction layer 84.

As described later, the light-transmission reduction layer 84 reduces the intensity (amount of) light emitted from the driving thyristor S and the transfer thyristor T when the driving thyristor S and the transfer thyristor S emit light, so as to suppress the light from traveling to the light-emitting diode LED.

Note that the aforementioned terms in parentheses are used below. The same applies to the other cases.

These islands are connected to lines such as the power supply line 71, the first transfer signal line 72, the second transfer signal line 73, and the turn-on signal line 75 via through-holes (illustrated as circles in FIG. 6A) formed in a protection layer 90. A description of the protection layer 90 and the through-holes is omitted below.

As illustrated in FIG. 6B, the back-surface electrode 91 serving as the terminal Vsub is disposed on the back surface of the substrate 80.

In the light-emitting chip C, the protection layer 90 is disposed to cover the upper surface and the side surfaces of these islands as illustrated in FIG. 6B. The protection layer 90 is formed of a light-transmitting insulating material.

In FIG. 6B, an arrow indicates a direction in which light from the light-emitting diode LED exits (light emission direction). Herein, the light emission direction is a direction perpendicular to the back surface of the substrate 80. In FIG. 6B, the light emission direction is −Z direction, for example. Light emitted by the light-emitting diode LED passes through the substrate 80 and exits from the back surface of the substrate 80. Note that the back-surface electrode 91 is not disposed at a portion of the back surface of the substrate 80 where the light emitted by the light-emitting diode LED passes through.

The p-anode layer 81, the light-emitting layer 82, the n-cathode layer 83, the light-transmission reduction layer 84, the p-anode layer 85, the n-gate layer 86, the p-gate layer 87, and the n-cathode layer 88 are semiconductor layers and monolithically stacked by epitaxial growth.

To form plural mutually isolated islands (islands 301, 302, 303, ... described later), the semiconductor layers between the islands are removed by etching (mesa etching). In addition, the p-anode layer 81 may also serve as the substrate 80.

The terms "p-anode layer 81" and "n-cathode layer 83" correspond to functions (operations) in the case where these layers constitute the light-emitting diode LED and the lower diode UD. That is, the p-anode layer 81 functions as the anode, and the n-cathode layer 83 functions as the cathode.

The terms "p-anode layer 85", "n-gate layer 86", "p-gate layer 87", and "n-cathode layer 88" correspond to functions (operations) in the case where these layers constitute the driving thyristor S and the transfer thyristor T. That is, the p-anode layer 85 functions as the anode, the n-gate layer 86 and the p-gate layer 87 function as the gates, and the n-cathode layer 88 functions as the cathode.

As described later, these layers function (operate) differently when they constitute the coupling diode D and the power supply line resistor Rg.

As described below, the plural islands include those not including some of the plural layers which are the p-anode layer 81, the light-emitting layer 82, the n-cathode layer 83, the light-transmission reduction layer 84, the p-anode layer 85, the n-gate layer 86, the p-gate layer 87, and the n-cathode layer 88. For example, the islands 301 and 302 do not include a part of the n-cathode layer 88.

A layout of the light-emitting chip C in plan will be described next with reference to FIG. 6A.

The driving thyristor S1 and the light-emitting diode LED1 are disposed in the island 301. The lower diode UD1, the transfer thyristor T1, and the coupling diode D1 are disposed in the island 302. The power supply line resistor Rg1 is disposed in the island 303. The start diode SD is disposed in an island 304. The current-limiting resistor R1 is disposed in an island 305. The current-limiting resistor R2 is disposed in an island 306.

Plural islands similar to the islands 301, 302, and 303 are formed in parallel in the light-emitting chip C. In these islands, the light-emitting diodes LED2, LED3, LED4, . . . ; the driving thyristors S2, S3, S4, . . . ; the transfer thyristors T2, T3, T4, . . . ; the lower diodes UD2, UD3, UD4, . . . ; the coupling diodes D2, D3, D4, . . . ; etc. are provided in the same manner as in the islands 301, 302, and 303.

Now, the islands 301 to 306 will be described in detail with reference to FIGS. 6A and 6B.

As illustrated in FIG. 6B, the light-emitting diode LED1 disposed in the island 301 is constituted by the p-anode layer 81, the light-emitting layer 82, and the n-cathode layer 83. The driving thyristor S1 is constituted by the p-anode layer 85, the n-gate layer 86, the p-gate layer 87, and the n-cathode layer 88, which are stacked on the n-cathode layer 83 of the light-emitting diode LED1 with the light-transmission reduction layer 84 interposed therebetween.

The p-anode layer 81 of the light-emitting diode LED includes a current constriction layer (a current constriction layer 81b in FIG. 7 described later) that constricts a current as indicated by black portions in FIG. 6B. The current constriction layer is provided so that a current flows through a central portion of the light-emitting diode LED. Since a circumferential portion of the light-emitting diode LED often has a defect resulting from mesa etching, non-radiative recombination is likely to occur. Thus, the current constriction layer is provided so that the central portion of the light-emitting diode LED serves as a current passing portion (region) α in which current easily flows and the circumferential portion of the light-emitting diode LED serves as a current blocking portion (region) β in which current does not easily flow. As illustrated in the light-emitting diode LED1 in FIG. 6A, the portion inside a dash line corresponds to the current passing portion α, and the portion outside the dash line corresponds to the current blocking portion β. Note that the current blocking portion β need not completely block the flow of the current and is just able to concentrate the current to the current passing portion α. That is, a current flows through the current blocking portion β less easily than through the current passing portion α.

Since electric power consumed by non-radiative recombination is reduced by the current constriction layer, power consumption is reduced and light extraction efficiency improves. Note that the light extraction efficiency indicates an amount of light that is successfully extracted per certain power consumption.

When the current blocking portion β is formed by oxidation as described later, regions having an equal distance from the circumferences of the islands 301 and 302 serve as the current blocking portion β. However, FIG. 6A schematically illustrates the current blocking portion β in the island 301. Specifically, the width of the current blocking portion β of the island 301 in the +y direction in FIG. 6A is illustrated to be different from the widths of the current blocking portion β in the −y direction and the ±x direction and the distances from the circumference of the island 301 are not illustrated to be equal.

Note that the current constriction layer will be described later.

The driving thyristor S uses, as the cathode terminal, an n-type ohmic electrode 321 (n-ohmic electrode 321) disposed on a region 311 of the n-cathode layer 88. In addition, the driving thyristor S uses, as a terminal of the gate Gs1, a p-type ohmic electrode 331 (p-ohmic electrode 331) disposed on the p-gate layer 87 exposed by removing the n-cathode layer 88.

The lower diode UD1 disposed in the island 302 is constituted by the p-anode layer 81, the light-emitting layer 82, and the n-cathode layer 83 just like the light-emitting diode LED. The transfer thyristor T1 is constituted by the p-anode layer 85, the n-gate layer 86, the p-gate layer 87, and the n-cathode layer 88, which are stacked on the n-cathode layer 83 of the lower diode UD1 with the light-transmission reduction layer 84 interposed therebetween.

The transfer thyristor T1 uses, as the cathode terminal, an n-ohmic electrode 323 disposed on a region 313 of the n-cathode layer 88. In addition, the transfer thyristor T1 uses, as the terminal of the gate Gt1, a p-ohmic electrode 332 disposed on the p-gate layer 87 that is exposed by removing the n-cathode layer 88.

Likewise, the coupling diode D1 disposed in the island 302 is constituted by the p-gate layer 87 and the n-cathode layer 88. The coupling diode D1 uses, as the cathode terminal, an n-ohmic electrode 324 disposed on a region 314 of the n-cathode layer 88. In addition, the coupling diode D1 uses, as the anode terminal, the p-ohmic electrode 332 disposed on the p-gate layer 87 that is exposed by removing the n-cathode layer 88. In this example, the anode terminal of the coupling diode D1 is identical to the gate Gt1.

The power supply line resistor Rg1 disposed in the island 303 is constituted by the p-gate layer 87. Specifically, the p-gate layer 87 located between a p-ohmic electrode 333 and a p-ohmic electrode 334 disposed on the p-gate layer 87 that is exposed by removing the n-cathode layer 88 serves as the power supply line resistor Rg1.

The start diode SD disposed in the island 304 is constituted by the p-gate layer 87 and the n-cathode layer 88. That is, the start diode SD uses, as the cathode terminal, an n-ohmic electrode 325 disposed on a region 315 of the n-cathode layer 88. Further, the start diode SD uses, as the anode terminal, a p-ohmic electrode 335 disposed on the p-gate layer 87 that is exposed by removing the n-cathode layer 88.

The current-limiting resistor R1 disposed in the island 305 and the current-limiting resistor R2 disposed in the island 306 are provided in the same manner as the power supply line resistor Rg1 disposed in the island 303. The p-gate layer 87 located between two p-ohmic electros (assigned no reference signs) serve as the resistors.

Connections between the elements will be described with reference to FIG. 6A.

The turn-on signal line 75 has a trunk portion 75a and plural branch portions 75b. The trunk portion 75a extends in a direction of the line of the driving thyristors S/the light-emitting diodes LED. The branch portions 75b branch off from the trunk portion 75a, and one of the branch portions 75b is connected to the n-ohmic electrode 321 which is the cathode terminal of the driving thyristor S disposed in the island 301. The turn-on signal line 75 is also connected to the cathode terminals of the other driving thyristors S disposed in the islands similar to the island 301. The turn-on signal line 75 is connected to the terminal φI.

The first transfer signal line 72 is connected to the n-ohmic electrode 323 which is the cathode terminal of the transfer thyristor T1 disposed in the island 302. The first transfer signal line 72 is also connected to the cathode terminals of the odd-numbered transfer thyristors T disposed in islands that are substantially the same as the island 302. The first transfer signal line 72 is connected to the terminal φ1 through the current-limiting resistor R1 disposed in the island 305.

On the other hand, the second transfer signal line 73 is connected to the n-ohmic electrodes (assigned no reference sign) which are the cathode terminals of the even-numbered transfer thyristors T disposed in islands assigned no reference sign. The second transfer signal line 73 is connected to the terminal φ2 through the current-limiting resistor R2 disposed in the island 306.

The power supply line 71 is connected to the p-ohmic electrode 334 which is one of the terminals of the power supply line resistor Rg1 disposed in the island 303. The power supply line 71 is also connected to one of the terminals of the other power supply line resistors Rg provided in islands that are substantially the same as the island 303. The power supply line 71 is connected to the terminal Vga.

The p-ohmic electrode 331, which is the terminal of the gate Gs1 of the driving thyristor S1 disposed in the island 301, is connected, by a connection wire 76, to the p-ohmic electrode 332, which is the terminal of the gate Gt1 of the transfer thyristor T1 disposed in the island 302. Terminals of the gates Gs of the driving thyristors S disposed in islands similar to the island 301 are connected to respective terminals of the gates Gt of the transfer thyristors T disposed in islands similar to the island 302 by respective connection wires similar to the connection wire 76.

The p-ohmic electrode 332 is connected to the p-ohmic electrode 333, which is another terminal of the power supply line resistor Rg1 disposed in the island 303, by a connection wire 77. P-ohmic electrodes similar to the p-ohmic electrode 332 disposed in islands similar to the island 302 are connected to respective p-ohmic electrodes similar to the p-ohmic electrode 333, which are other terminals of the power supply resistors Rg disposed in islands similar to the island 303, by respective connection wires similar to the connection wire 77.

The n-ohmic electrode 324, which is the cathode terminal of the coupling diode D1 disposed in the island 302, is connected to a p-ohmic electrode (assigned no reference sign), which is the terminal of the gate Gt2 of the transfer thyristor T2 disposed in an island similar to the adjacent island 302 by a connection wire 79. Cathode terminals of the coupling diodes D disposed in islands similar to the island 302 are connected to respective terminals of the gates Gt (gate Gs) of the transfer thyristors T disposed in islands similar to the adjacent island 302 by respective connection wires similar to the connection wire 79.

The p-ohmic electrode 332, which is the terminal of the gate Gt1 in the island 302, is connected to the n-ohmic electrode 325, which is the cathode terminal of the start diode SD disposed in the island 304, by a connection wire 78. The p-ohmic electrode 335, which is the anode terminal of the start diode SD, is connected to the second transfer signal line 73.

Note that the connections and configurations described above are connections and configurations in the case where the p-type substrate 80 is used. In the case where an n-type substrate is used, the polarity is reversed. In addition, in the case where an i-type substrate is used, a terminal connected to the power supply line 200a that supplies the reference potential Vsub is provided on a side of the substrate on which the driving unit 101 and the light-emitting unit 102 are disposed. The connections and configurations in this case are the same as those of the case where the p-type substrate is used or of the case where the n-type substrate is used.

Layered Structure of Light-Emitting Diode LED and Driving Thyristor S

Figure 7:
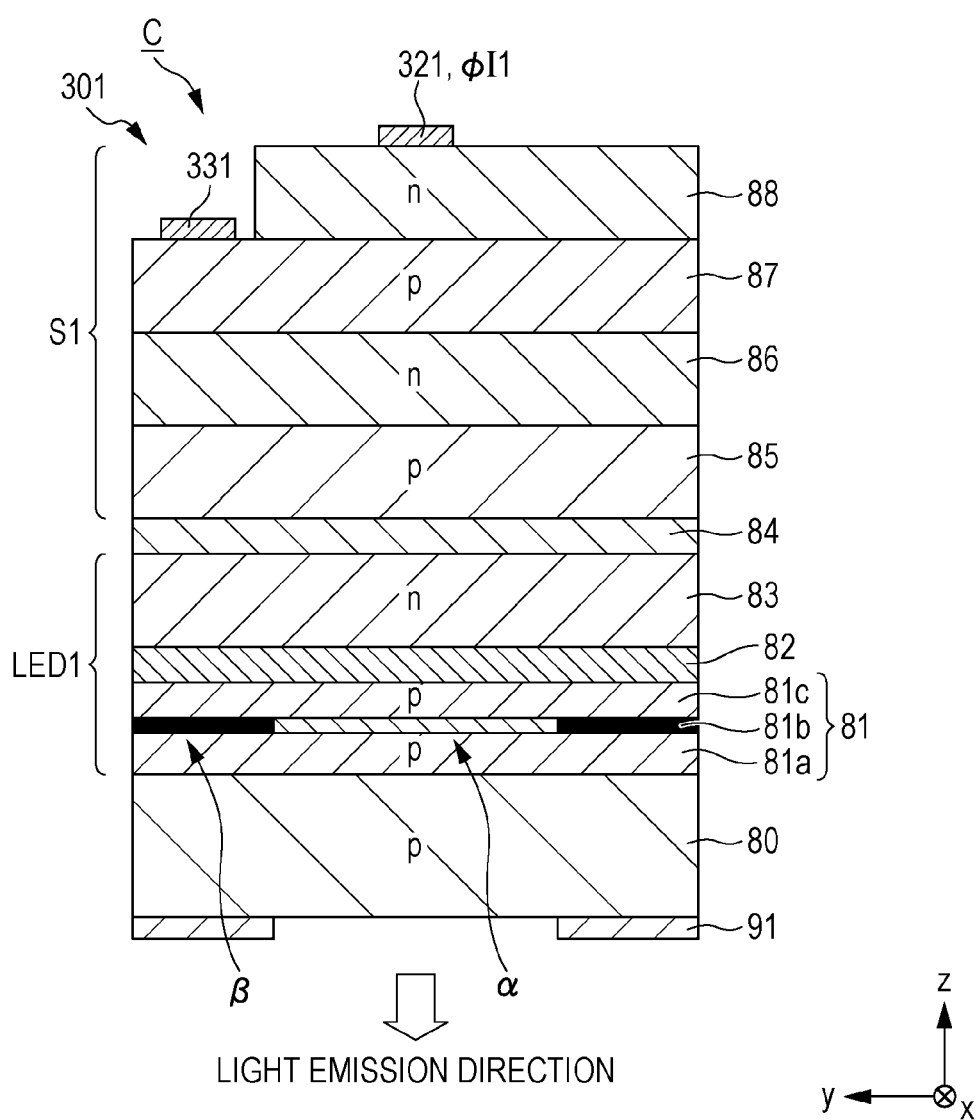
FIG. 7 is an enlarged cross-sectional view of an island in which a light-emitting diode and a driving thyristor are stacked.

FIG. 7 is an enlarged cross-sectional view of the island 301 in which the light-emitting diode LED and the driving thyristor S1 are stacked. The cross-section illustrated in FIG. 7 is a cross-section taken along line VIB-VIB but is viewed from the side (−x direction) opposite to the side illustrated in FIG. 6B. Note that FIG. 7 omits an illustration of the protection layer 90 and a region where the turn-on signal line 75 is disposed in the island 301. The same applies to cross-sectional views described below.

As described before, the driving thyristor S1 is stacked on the light-emitting diode LED1 with the light-transmission reduction layer 84 interposed therebetween. That is, the light-emitting diode LED1 and the driving thyristor S1 are connected in series. Note that the expression "on the light-emitting diode LED1" not only indicates a state in which the driving thyristor S1 is directly in contact with the light-emitting diode LED1 but also indicates a state in which the driving thyristor S is located above the light-emitting diode LED1 without directly touching the light-emitting diode LED. The same applies to similar expressions such as "on a substrate".

As illustrated in FIG. 7, the light-emitting diode LED is constituted by a semiconductor stack obtained by sequentially forming the p-anode layer 81, the light-emitting layer 82, and the n-cathode layer 83 on the p-type substrate 80 by epitaxial growth. Note that the light-emitting layer 82 has a quantum well structure in which well layers and barrier layers are alternately stacked. The light-emitting layer 82 may an intrinsic (i-type) layer (i-layer) not doped with any impurities. Alternatively, the light-emitting layer 82 may have a structure other than the quantum well structure, for example, a quantum wire structure or a quantum dot structure.

The p-anode layer 81 includes the current constriction layer 81b. Specifically, the p-anode layer 81 is constituted by a lower p-anode layer 81a, the current constriction layer 81*b*, and an upper p-anode layer 81*c*. The current constriction layer 81*b* is constituted by the current passing portion α and the current blocking portion β. As illustrated in FIG. 7, the current passing portion α is located at a central portion of the light-emitting diode LED, and the current blocking portion β is located at a circumferential portion of the light-emitting diode LED. That is, a portion where the current constriction layer 81*b* is located is the current blocking portion β, and a portion where the current constriction layer 81*b* is not located is the current passing portion α.

Note that the current blocking portion β in the p-anode layer 81 may be formed by implanting hydrogen ion ($H^+$) to the p-anode layer 81 (ion implantation). Specifically, the current blocking portion β may be formed by forming the p-anode layer 81 not including the current constriction layer 81*b* (the lower p-anode layer 81*a* and the upper p-anode layer 81*c*) and then implanting $H^+$ to a portion that serves as the current blocking portion β.

The current constriction layer may be provided in the n-cathode layer 83.

The light-transmission reduction layer 84 is epitaxially grown on the n-cathode layer 83. The light-transmission reduction layer 84 is also a semiconductor layer. The light-transmission reduction layer 84 will be described later.

The driving thyristor S is constituted by a semiconductor stack obtained by sequentially forming the p-anode layer 85, the n-gate layer 86, the p-gate layer 87, and the n-cathode layer 88 on the light-transmission reduction layer 84 by epitaxial growth.

These semiconductor layers are stacked using metal organic chemical vapor deposition (MOCVD) or molecular beam epitaxy (MBE), for example. Consequently, the semiconductor stack is formed.

The n-ohmic electrode 321 is formed of Ge-containing Au (AuGe) that easily forms an ohmic contact with an n-type semiconductor layer such as the n-cathode layer 88, for example.

The p-ohmic electrode 331 is formed of Zn-containing Au (AuZn) that easily forms an ohmic contact with a p-type semiconductor layer such as the p-gate layer 87, for example.

The back-surface electrode 91 is formed of AuZn, for example, just like the p-ohmic electrode 331.

The p-ohmic electrode 331 is disposed on the p-gate layer 87 and is used as the gate Gs of the driving thyristor S1 above; however, an n-ohmic electrode may be disposed on the n-gate layer 86 and may be used as the gate Gs of the driving thyristor S1.

Thyristor

Now, a basic operation of the thyristors (the transfer thyristors T and the driving thyristors S) is described. As described before, a thyristor is a semiconductor element having three terminals, i.e., the anode terminal (anode), the cathode terminal (cathode), and the gate terminal (gate), and is formed by stacking p-type semiconductor layers (the p-anode layer 85 and the p-gate layer 87) and n-type semiconductor layers (the n-gate layer 86 and the n-cathode layer 88) composed for example of GaAs, AlGaAs, or AlAs on the substrate 80. That is, a thyristor has a pnpn structure. A description is given here on the assumption that a forward potential (diffusion potential) of a pn junction formed by a p-type semiconductor layer and an n-type semiconductor layer is equal to 1.5 V, for example.

The following description is given on the assumption that the reference potential Vsub supplied to the back-surface electrode 91 (see FIGS. 5 to 6B) serving as the terminal Vsub is a high-level potential (hereinafter, referred to as "H") of 0 V and the power supply potential Vga supplied to the terminal Vga is a low-level potential (hereinafter, referred to as "L") of −5 V. Thus, expressions "H" (0 V) and "L" (−5 V) are sometimes used.

First, an operation of a single thyristor is described. It is assumed that the anode of the thyristor has a potential of 0 V.

When a potential lower than a threshold voltage (a negative potential having a greater absolute value) is applied to the cathode of a thyristor that is in an off-state in which no current flows between the anode and the cathode, the thyristor enters an on-state (turns on). Note that the threshold voltage of the thyristor is equal to a value obtained by subtracting the forward potential Vd (1.5 V) of the pn junction from the gate potential.

When the thyristor enters the on-state, the gate of the thyristor has a potential close to the potential of the anode. Since the potential of the anode is 0 V in this case, the potential of the gate becomes equal to 0 V. In addition, the cathode of the on-state thyristor has a potential close to a potential obtained by subtracting the forward potential Vd (1.5 V) of the pn junction from the potential of the anode. Since the potential of the anode is 0V in this case, the cathode of the on-state thyristor has a potential close to −1.5 V (a negative potential having an absolute value greater than 1.5 V). Note that the potential of the cathode is set in accordance with a relationship with a power supply that supplies a current to the on-state thyristor.

When the cathode of the on-state thyristor has a potential (a negative potential having a smaller absolute value, 0 V, or a positive potential) higher than a potential necessary to maintain the thyristor in the on-state (a potential close to −1.5 V), the thyristor enters the off-state (turns off).

On the other hand, when a potential (a negative potential having a greater absolute value) that is lower than the potential necessary to maintain the thyristor in the on-state is continuously applied to the cathode of the on-state thyristor and current that successfully maintains the on-state (maintaining current) is supplied to the thyristor, the thyristor is maintained in the on-state.

An operation in a state in which the light-emitting diode LED and the driving thyristor S are stacked will be described next. The light-emitting diode LED and the driving thyristor S are connected in series as a result of being stacked. In the driving thyristor S1 and the light-emitting diode LED illustrated in FIG. 7, the n-cathode layer 88 of the driving thyristor S1 is connected to the turn-on signal line φI1 through the n-ohmic electrode 321 and the p-anode layer 81 of the light-emitting diode LED1 is connected to the reference potential Vsub through the substrate 80 and the back-surface electrode 91. The same applies to the other light-emitting diodes LED and the other driving thyristors S of the light-emitting chip C.

That is, a voltage between the potential of the turn-on signal φI and the reference potential Vsub is applied to the light-emitting diode LED and the driving thyristor S that are connected in series. The reference potential Vsub is equal to "H" (0V). Accordingly, the potential of the turn-on signal φI is divided by the light-emitting diode LED and the driving thyristor S. The description is given herein on the assumption that the voltage applied to the light-emitting diode LED is equal to −1.7 V, for example. In this case, −3.3 V is applied to the driving thyristor S when the driving thyristor S is in the off-state.

As described above, if the absolute value of the threshold voltage of the driving thyristor S that is in the off-state is smaller than an absolute value of −3.3 V, the driving thyristor S turns on. Then, a current flows through the driving thyristor S and the light-emitting diode LED that are connected in series, and consequently the light-emitting diode LED turns on (emits light). On the other hand, if the absolute value of the threshold voltage of the driving thyristor S is greater than the absolute value of −3.3 V, the driving thyristor S does not turn on and remains in the off-state. Thus, the light-emitting diode LED remains in the off-state (does not turn on or emit light).

Upon turn-on of the driving thyristor S, the absolute value of the voltage applied to the light-emitting diode LED and the driving thyristor S that are connected in series decreases due to the current-limiting resistor R1 (see FIG. 5). However, if the voltage applied to the driving thyristor S is enough to maintain the driving thyristor S in the on-state, the driving thyristor S remains in the on-state. Consequently, the light-emitting diode LED also continues to be on (to emit light).

As described later, the driving thyristor S becomes ready to enter the on-state upon the transfer thyristor T connected to the driving thyristor S turning on and entering the on-state. When the turn-on signal ϕI changes to "L" as described later, the driving thyristor S turns on and enters the on-state, and causes the light-emitting diode LED to turn on (emit light) (sets the light-emitting diode LED on). Thus, the term "driving thyristor" is used herein.

Note that the voltage value used above is merely an example, and the voltage value is changed depending on the wavelength or an amount of light emitted by the light-emitting diode LED. In such a case, the potential ("L") of the turn-on signal ϕI may be adjusted.

While the above description is given of the driving thyristor S and the light-emitting diode LED that are stacked, the description also applies to the transfer thyristor T and the lower diode UD that are stacked. Note that light emitted by the lower diode UD is not used. Thus, the back-surface electrode 91 is disposed on the entire portion of the back surface of the substrate 80 where the lower diode UD is disposed in order to suppress the light emitted by the lower diode UD from passing through and exiting from the substrate 80.

Since the thyristor is formed of semiconductors, such as GaAs, the thyristor sometimes emits light between the n-gate layer 86 and the p-gate layer 87 in the on-state. The amount of light emitted by the thyristor is determined by an area of the cathode and a current that flows between the cathode and the anode.

Since the driving thyristor S is stacked on the light-emitting diode LED, light emitted by the driving thyristor S may pass through the light-emitting diode LED and the photoconductor drum 12 may be irradiated with the light. That is, the light emitted by the driving thyristor S is superimposed on the light emitted by the light-emitting diode LED.

Since the configuration of the semiconductor stack of the light-emitting diode LED is different from that of the driving thyristor S, the light emitted by the driving thyristor S and the light emitted by the light-emitting diode LED have different wavelength ranges and widths. That is, the emission spectrum of the driving thyristor S and the emission spectrum of the light-emitting diode LED are different from each other.

Mixing of the light emitted by the driving thyristor S to the light emitted by the light-emitting diode LED disturbs the emission spectrum of the light-emitting diode LED. For example, the emission spectrum of the light-emitting diode LED is narrower than the emission spectrum of the driving thyristor S, making it easier to design the optical system in the printhead 14 or the like. However, if the emission spectrum of the driving thyristor S mixes to the emission spectrum of the light-emitting diode LED, this benefit is no longer provided and an undesirable influence may occur in the image quality of an image to be formed.

Accordingly, in the first exemplary embodiment, the light-transmission reduction layer 84 is disposed between the light-emitting diode LED and the driving thyristor S. The light-transmission reduction layer 84 reduces the intensity (amount) of light emitted by the driving thyristor S and suppresses the light from reaching the light-emitting diode LED. Note that the light-transmission reduction layer 84 need not reduce the intensity (amount) of the light emitted by the driving thyristor S by 100%. That is, it is sufficient if the light-transmission reduction layer 84 reduces the intensity (amount) of light emitted by the driving thyristor S so that the light does not cause any undesirable influence in the image quality of an image to be formed even if the photoconductor drum 12 is irradiated with the light emitted by the driving thyristor S.

Note that the light-transmission reduction layer 84 may transmit light emitted by the light-emitting diode LED. That is, in the case where the emission spectrum of the light-emitting diode LED and the emission spectrum of the driving thyristor S are different from each other, the light-transmission reduction layer 84 may have transmission characteristics that vary depending on the wavelength.

Light-Transmission Reduction Layer 84

FIGS. 8A to 8E illustrate the light-transmission reduction layer 84. Specifically, FIG. 8A illustrates the case where the light-transmission reduction layer 84 is constituted by a single n-type semiconductor layer 84a. FIG. 8B illustrates the case where the light-transmission reduction layer 84 is constituted by a single p-type semiconductor layer 84b. FIG. 8C illustrates the case where the light-transmission reduction layer 84 is constituted by plural n-type semiconductor layers 84c and 84d. FIG. 8D illustrates the case where the light-transmission reduction layer 84 is constituted by plural p-type semiconductor layers 84e and 84f. FIG. 8E illustrates the case where the light-transmission reduction layer 84 is constituted by an n-type semiconductor layer 84g and a p-type semiconductor layer 84h.

At least one of the semiconductor layers (the n-type semiconductor layers 84a, 84c, 84d, and 84g and the p-type semiconductor layers 84b, 84e, 84f, and 84h) that constitute the light-transmission reduction layer 84 is a semiconductor layer having a bandgap that is smaller than or equal to a bandgap equivalent to the wavelength of the light emitted by the driving thyristor S.

With such a configuration, the light emitted by the driving thyristor S is absorbed by a semiconductor layer having a bandgap smaller than or equal to the bandgap equivalent to the light emitted by the driving thyristor S in the light-transmission reduction layer 84. That is, the light-transmission reduction layer 84 including a semiconductor layer having a bandgap that is smaller than or equal to the bandgap equivalent to the wavelength of the light emitted by the driving thyristor S absorbs the light emitted by the driving thyristor S to reduce the intensity (amount) of the light, thereby suppressing the light emitted by the driving thyristor S from reaching the light-emitting diode LED. Note that the setting of the light-transmission reduction layer 84 becomes easier by setting the light-transmission reduction layer 84 on the basis of the bandgap energy.

Note that the wavelength of the light emitted by the driving thyristor S is determined by a bandgap of the n-gate layer 86 and the p-gate layer 87 of the driving thyristor S.

Accordingly, for example, when the n-gate layer 86 and the p-gate layer 87 of the driving thyristor S are formed of AlGaAs, the light-transmission reduction layer 84 (at least one of the n-type semiconductor layers 84a, 84c, 84d, and 84g and the p-type semiconductor layers 84b, 84e, 84f, and 84h) is formed of GaAs or InGaAs.

In addition, for example, when the n-gate layer 86 and the p-gate layer 87 of the driving thyristor S are formed of GaAs, the light-transmission reduction layer 84 (at least one of the n-type semiconductor layers 84a, 84c, 84d, and 84g and the p-type semiconductor layers 84b, 84e, 84f, and 84h) is formed of InGaAs or InGaNAs.

Further, for example, when the n-gate layer 86 and the p-gate layer 87 of the driving thyristor S are formed of InGaAs, the light-transmission reduction layer 84 (at least one of the n-type semiconductor layers 84a, 84c, 84d, and 84g and the p-type semiconductor layers 84b, 84e, 84f, and 84h) may be formed of InGaAs or InGaNAs.

Note that thickness of the semiconductor layer(s) (at least one of the n-type semiconductor layers 84a, 84c, 84d, and 84g and the p-type semiconductor layers 84b, 84e, 84f, and 84h) that absorb(s) the light emitted by the driving thyristor S in the light-transmission reduction layer 84 is set in accordance with an amount of light to be absorbed. For example, the thickness may be several nanometers (nm) to several hundreds of nanometers (nm).

A current easily flows through a semiconductor layer having a small bandgap energy, compared with a semiconductor layer having a large bandgap energy. Thus, a voltage (rising voltage) applied to the series connection of the light-emitting diode LED and the driving thyristor S to turn on the light-emitting diode LED is reduced by providing the light-transmission reduction layer 84 including a semiconductor layer having a small bandgap energy between the n-cathode layer 83 of the light-emitting diode LED and the p-anode layer 85 of the driving thyristor S that form a reverse-direction junction (reverse junction).

Note that the light-transmission reduction layer 84 may be formed of a III-V compound semiconductor material having metallic properties. For example, InNAs which is a compound of InN and InAs has a negative bandgap energy and has metallic properties when the InN composition ratio x is in a range of approximately 0.1 to approximately 0.8.

In addition, for example, InNSb has a negative bandgap energy and has metallic properties when the InN composition ratio x is in a range of approximately 0.2 to approximately 0.75.

Such a III-V compound semiconductor material having metallic properties absorbs the light emitted by the driving thyristor S and reduces a resistance between the driving thyristor S and the light-emitting diode due to its metallic property of conductivity. That is, the light-transmission reduction layer 84 formed of a III-V compound semiconductor material having metallic properties absorbs the light emitted by the driving thyristor S to reduce the intensity (amount) of light, thereby suppressing the light emitted by the driving thyristor S from reaching the light-emitting diode LED. Further, a voltage (rising voltage) applied to the series connection of the driving thyristor S and the light-emitting diode LED to turn on the light-emitting diode LED is reduced more.

In addition, the light-transmission reduction layer 84 (at least one of the n-type semiconductor layers 84a, 84c, 84d, and 84g and the p-type semiconductor layers 84b, 84e, 84f, and 84h) may be a layer having a impurity concentration that is higher than one of the n-cathode layer 83 that is in contact with the light-transmission reduction layer 84 on the light-emitting diode LED side and the p-anode layer 85 that is in contact with the light-transmission reduction layer 84 on the driving thyristor S side. Note that the expression "be in contact with" not only indicates a state of direct contact but also indicates a state that is substantially the same as the state of direct contact in terms of operation, such as a case where an i-type thin film layer that is sufficiently thinner than the light-transmission reduction layer 84 is interposed between the layers.

When the impurity concentration of a semiconductor layer increases, the numbers of electrons and holes (free carriers) that are able to freely move in the semiconductor layer increase and light is more likely to be absorbed (free carrier absorption). In this case, light is absorbed regardless of the bandgap of the semiconductor layer. That is, the wavelength dependence is small for the light to be absorbed.

For example, free carrier absorption occurs at an impurity concentration of $1 \times 10^{18}/cm^3$ or greater. The thickness of the semiconductor layer (at least one of the n-type semiconductor layers 84a, 84c, 84d, and 84g and the p-type semiconductor layers 84b, 84e, 84f, and 84h) that absorbs the light emitted by the driving thyristor S in the light-transmission reduction layer 84 is set in accordance with an amount of light to be absorbed. The thickness is, for example, several nanometers (nm) to several hundreds of nanometers (nm).

That is, the light-transmission reduction layer 84 including a semiconductor layer with a high impurity concentration absorbs the light emitted by the driving thyristor S to reduce the intensity (amount) of light, thereby suppressing the light emitted by the driving thyristor S from reaching the light-emitting diode LED.

A semiconductor layer having a high impurity concentration has a smaller resistance and passes a current more easily than a semiconductor layer having a low impurity concentration. Thus, a voltage (rising voltage) applied to the series connection of the driving thyristor S and the light-emitting diode LED to turn on the light-emitting diode LED is reduced by providing the light-transmission reduction layer 84 including a semiconductor layer having a high impurity concentration between the n-cathode layer 83 of the light-emitting diode LED and the p-anode layer 85 of the driving thyristor S which form a reverse junction.

As illustrated in FIGS. 8A to 8E, the light-transmission reduction layer 84 is in contact with (is adjacent to) the n-cathode layer 83 of the light-emitting diode LED on the light-emitting diode LED side and is in contact with (is adjacent to) the p-anode layer 85 of the driving thyristor S on the driving thyristor S side.

When the light-transmission reduction layer 84 is constituted by a single layer, the light-transmission reduction layer 84 may be of n-type that is the same conductivity type as the conductivity type of the n-cathode layer 83 of the light-emitting diode LED or of p-type that is the same conductivity type as the conductivity type of the p-anode layer 85 of the driving thyristor S as illustrated in FIGS. 8A and 8B, respectively. In addition, when the light-transmission reduction layer 84 is constituted by plural layers of the same conductivity type, the light-transmission reduction layer 84 may be of n-type that is the same conductivity type as the conductivity type of the n-cathode layer 83 of the light-emitting diode LED or of p-type that is the same conductivity type as the conductivity type of the p-anode layer 85 of the driving thyristor S as illustrated in FIGS. 8C and 8D, respectively.

Further, when the light-transmission reduction layer 84 is constituted by two layers, i.e., a n-type layer and a p-type layer, the layer located closer to the n-cathode layer 83 of the light-emitting diode LED in the light-transmission reduction layer 84 is desirably of n-type and the layer located closer to the p-anode layer 85 of the driving thyristor S is desirably of p-type as illustrated in FIG. 8E. The configuration illustrated in FIG. 8E reduces the rising voltage more than the configurations illustrated in FIGS. 8A to 8D.

That is, the light-transmission reduction layer 84 is desirably configured to maintain a junction at which the a current flows in the same direction as in the case where the adjacent layer (the n-cathode layer 83) of the light-emitting diode LED and the adjacent layer (the p-anode layer 85) of the driving thyristor S are directly in contact with each other (directly joined). That is, the light-transmission reduction layer 84 is desirably configured so that the number of interfaces that are reverse junctions does not increase compared with the case where the adjacent layer (the n-cathode layer 83) of the light-emitting diode LED and the adjacent layer (the p-anode layer 85) of the driving thyristor S are in direct contact with each other (directly joined).

If the number of interfaces that are reverse junctions increases between the n-cathode layer 83 of the light-emitting diode LED and the p-anode layer 85 of the driving thyristor S, the flow of the current is obstructed or a voltage (rising voltage) applied to the series connection of the light-emitting diode LED and the driving thyristor S to turn on the light-emitting diode LED increases.

In other words, in the case where the light-transmission reduction layer 84 is constituted by plural layers, it is desirable that a layer (the n-cathode layer 83) of the light-emitting diode LED and a layer that is in contact with the layer (the n-cathode layer 83) of the light-emitting diode LED among the plural layers of the light-transmission reduction layer 84 have the same conductivity type and that a layer (the p-anode layer 85) of the driving thyristor S and a layer that is in contact with the layer (the p-anode layer 85) of the driving thyristor S among the plural layers of the light-transmission reduction layer 84 have the same conductivity type. In addition, as long as these conditions are met, the number of layers that constitute the light-transmission reduction layer 84 is not limited to two, and the light-transmission reduction layer 84 may be constituted by three or four semiconductor layers having impurity concentrations higher than the impurity concentration of the n-cathode layer 83 or the p-anode layer 85. An increase in the rising voltage is suppressed by increasing the impurity concentrations even if the number of reverse junctions increases.

The light-transmission reduction layer 84 described above absorbs light emitted by the driving thyristor S to reduce the intensity (amount) of the light, thereby suppressing the light emitted by the driving thyristor S from reaching the light-emitting diode LED. Alternatively, the light-transmission reduction layer 84 may reflect the light emitted by the driving thyristor S to suppress the light from reaching the light-emitting diode LED. In such a case, the light-transmission reduction layer 84 may reflect the light emitted by the driving thyristor S but may transmit light emitted by the light-emitting diode LED therethrough.

If the light emitted by the driving thyristor S in the z direction affects the emission spectrum of the light-emitting diode LED, the n-ohmic electrode 321 of the driving thyristor S1 and similar n-ohmic electrodes of the other driving thyristors S may be increased to block the light emitted by the driving thyristor S. In addition, if the light emitted by the transfer thyristor T in the z direction affects the emission spectrum of the light-emitting diode LED, the n-ohmic electrode 323 of the transfer thyristor T1 and similar n-ohmic electrodes of the other transfer thyristors T may be increased to block the light emitted by the transfer transistor T. Note that the light emitted by the transfer thyristor T in the −z direction is blocked by the back-surface electrode 91 disposed on the back surface of the substrate 80.

Operation of Light-Emitting Device 65

An operation of the light-emitting device 65 will be described next.

As described before, the light-emitting device 65 includes the light-emitting chips C1 to C40 (see FIGS. 3 to 4B).

Since the light-emitting chips C1 to C40 are driven in parallel, it is sufficient to describe the operation of the light-emitting chip C1.

Timing Chart

Figure 9:
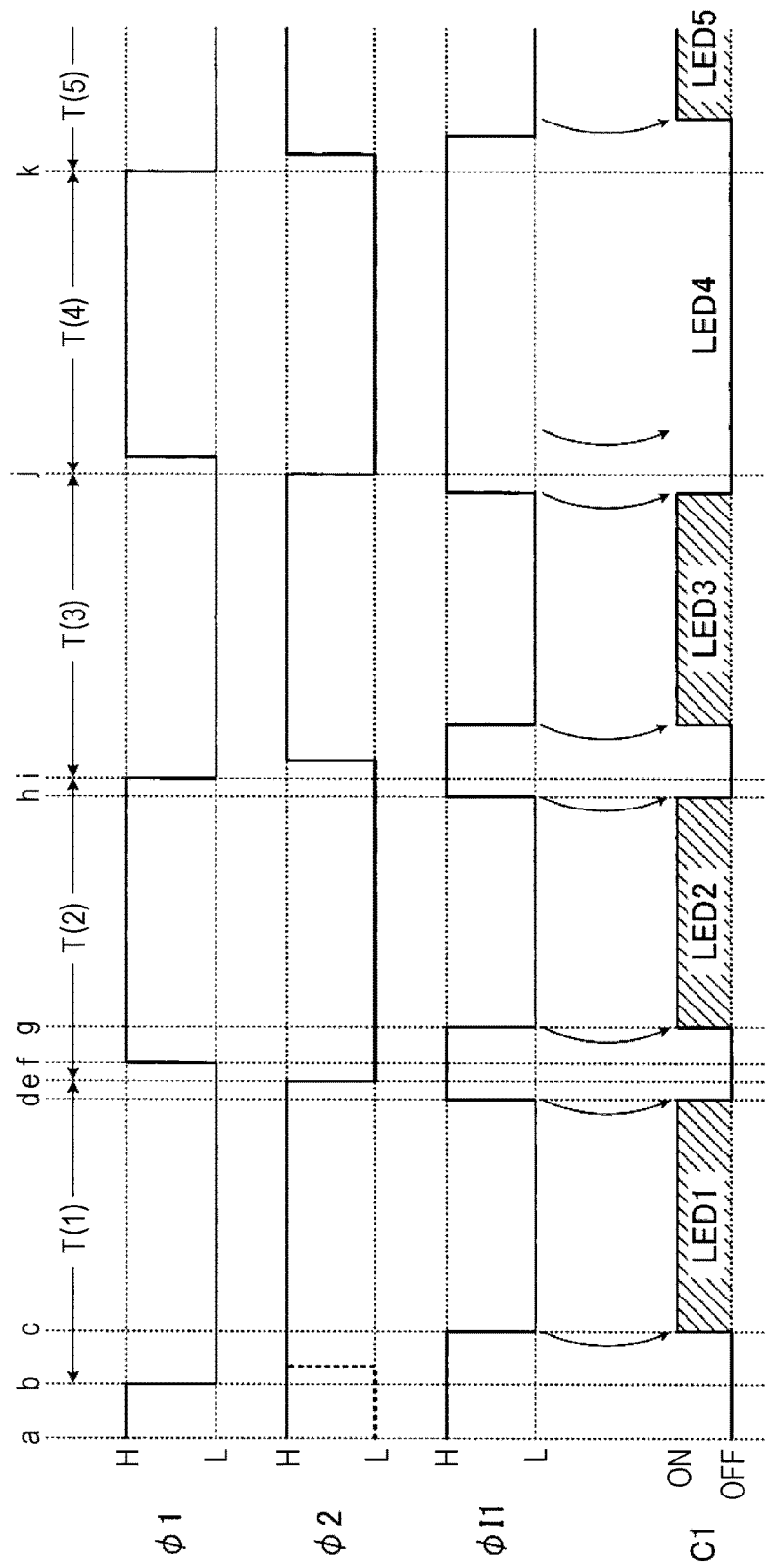
FIG. 9 is a timing chart describing operations of the light-emitting device and the light-emitting chip.

FIG. 9 is a timing chart describing operations of the light-emitting device 65 and the light-emitting chip C.

FIG. 9 is a timing chart of a period in which on (oscillation)/off of five light-emitting diodes LED (i.e., the light-emitting diodes LED1 to LED5) of the light-emitting chip C1 are controlled (hereinafter, referred to turn-on control). Note that the light-emitting diodes LED1, LED2, LED3, and LED5 of the light-emitting chip C1 are turned on and the light-emitting diode LED 4 is maintained in the off-state (off) in FIG. 9.

In FIG. 9, time passes in the alphabetical order from time a to time k. On and off of the light-emitting diodes LED1, LED2, LED3, and LED4 are controlled (turn-on control is performed) in periods T(1), T(2), T(3), and T(4), respectively. Turn-on control is performed on the light-emitting diodes LED assigned the numbers of 5 and greater in the similar manner.

It is assumed here that the periods T(1), T(2), T(3), . . . have equal durations and are referred to as periods T when they are not distinguished from one another.

Each of the first transfer signal φ1 that is sent to the terminal φ1 (see FIGS. 5 to 6B) and the second transfer signal φ2 that is sent to the terminal φ2 (see FIGS. 5 to 6B) is a signal having two potentials of "H" (0 V) and "L" (−5 V). Each of the first transfer signal φ1 and the second transfer signal φ2 has a waveform that iterates in a unit of two consecutive periods T (for example, the periods T(1) and T(2)).

Hereinafter, the expressions "H" (0 V) and "L" (−5 V) are sometimes simply referred to as "H" and "L", respectively.

The first transfer signal φ1 changes from "H" (0V) to "L" (−5 V) at start time b of the period T(1) and changes from "L" to "H" at time f. The first transfer signal φ1 then changes from "H" to "L" at end time i of the period T(2).

The second transfer signal φ2 is at "H" (0V) at the start time b of the period T(1) and changes from "H" (0V) to "L" (−5 V) at time e. Then, the second transfer signal φ2 changes from "L" to "H" slightly after the end time i of the period T(2).

Comparison of the first transfer signal φ1 and the second transfer signal φ2 indicates that the second transfer signal φ2 is a signal obtained by shifting the first transfer signal φ1 behind by the period T on the time axis. The waveform of the second transfer signal φ2 that is indicated by a dotted line in the period T(1) and the waveform in the period T(2) iterate in the period T(3) and subsequent periods. The waveform of the second transfer signal φ2 in the period T(1) is different from that in the period T(3) and thereafter because the period T(1) is a period in which the light-emitting device 65 starts the operation.

A set of transfer signals (i.e., the first transfer signal ϕ1 and the second transfer signal 42) specifies the light-emitting diode LED assigned the same number as the number of the on-state transfer thyristor T to be a target of on/off control (turn-on control) by propagating the on-state of the transfer thyristors T in the numbered order as described later.

The turn-on signal ϕI1 that is sent to the terminal ϕI of the light-emitting chip C1 will be described next. Note that turn-on signals ϕI2 to ϕI40 are sent to the other light-emitting chips C2 to C40, respectively. The turn-on signal ϕI1 is a signal having two potentials of "H" (0V) and "L" (−5 V).

The turn-on signal ϕI1 in the period T(1) in which turn-on control is performed on the light-emitting diode LED1 of the light-emitting chip C1 will be described. The turn-on signal ϕI1 is at "H" (0V) at the start time b of the period T(1) and changes from "H" (0V) to "L" (−5V) at time c. Then, the turn-on signal ϕI1 changes from "L" to "H" at time d and maintains "H" at time e.

The operation of the light-emitting device 65 and the operation of the light-emitting chip C1 will be described in accordance with the timing chart illustrated in FIG. 9 with reference to FIGS. 4A to 5. Note that the periods T(1) and T(2) in which turn-on control is performed on the light-emitting diodes LED1 and LED2 will be described below.

(1) Time a
Light-Emitting Device 65

At time a, the reference potential supplying unit 160 of the signal generation circuit 110 of the light-emitting device 65 sets the reference potential Vsub to "H" (0 V). The power supply potential supplying unit 170 sets the power supply potential Vga to "L" (−5 V). Then, the power supply line 200a on the circuit board 62 of the light-emitting device 65 has the reference potential Vsub ("H" (0 V)), and each of the terminals Vsub of the light-emitting chips C1 to C40 has "H". Likewise, the power supply line 200b has the power supply potential Vga ("L" (−5 V)), and each of the terminals Vga of the light-emitting chips C1 to C40 has "L" (see FIG. 4B). As a result, each of the power supply lines 71 of the light-emitting chips C1 to C40 has "L" (see FIG. 5).

Then, the transfer signal generation unit 120 of the signal generation circuit 110 sets the first transfer signal ϕ1 and the second transfer signal ϕ2 to "H" (0 V). Then, the first transfer signal line 201 and the second transfer signal line 202 have "H" (see FIG. 4B). Consequently, the terminals ϕ1 and ϕ2 of each of the light-emitting chips C1 to C40 have "H". The first transfer signal line 72 that is connected to the terminal ϕ1 through the current-limiting resistor R1 has "H", and the second transfer signal line 73 that is connected to the terminal ϕ1 through the current-limiting resistor R2 also has "H" (see FIG. 5).

Further, the turn-on signal generation unit 140 of the signal generation circuit 110 sets the turn-on signals ϕI1 to ϕI40 to "H" (0 V). Then, the turn-on signal lines 204-1 to 204-40 have "H" (see FIG. 4B). Consequently, the terminal ϕI of each of the light-emitting chips C1 to C40 has "H" through the current-limiting resistor RI, and the turn-on signal line 75 connected to the terminal ϕI also has "H" (0 V) (see FIG. 5).

Light-Emitting Chip C1

The anode (the p-anode layer 85) of the driving thyristor S is connected to the cathode (the n-cathode layer 83) of the light-emitting diode LED with the light-transmission reduction layer 84 interposed therebetween. The anode (the p-anode layer 81) of the light-emitting diode LED is connected to the terminal Vsub that is set to "H".

The anode (the p-anode layer 85) of the transfer thyristor T is connected to the cathode (the n-cathode layer 83) of the lower diode UD with the light-transmission reduction layer 84 interposed therebetween. The anode (the p-anode layer 81) of the lower diode UD is connected to the terminal Vsub that is set to "H".

The cathodes of the odd-numbered transfer thyristors T1, T3, T5, . . . are connected to the first transfer signal line 72 and are set to "H" (0 V). The cathodes of the even-numbered transfer thyristors T2, T4, T6, . . . are connected to the second transfer signal line 73 and are set to "H". Since both the anode and the cathode of each of the transfer thyristors T have "H", the transfer thyristor T is in the off-state. In addition, since both the anode and the cathode of each of the lower diodes UD have "H", the lower diode UD is in the off-state.

The cathode terminal of the driving thyristor S is connected to the turn-on signal line 75 having a potential of "H" (0 V). Thus, both the anode and the cathode of the driving thyristor S have "H", and the driving thyristor S is in the off-state. In addition, both the anode and the cathode of the light-emitting diode LED have "H", and the light-emitting diode LED is in the off-state.

The gate Gt1 is connected to the cathode of the start diode SD as described before. The gate Gt1 is connected to the power supply line 71 having the power supply potential Vga ("L" (−5 V)) through the power supply line resistor Rg1. The anode terminal of the start diode SD is connected to the second transfer signal line 73 and is connected to the terminal ϕ2 having "H" (0 V) through the current-limiting resistor R2. Thus, the start diode SD is forward-biased, and the cathode (gate Gt1) of the start diode SD has a potential of −1.5 V obtained by subtracting the forward potential Vd (1.5 V) of the pn junction from the potential ("H" (0 V)) of the anode of the start diode SD. If the potential of the gate Gt1 becomes equal to −1.5 V, the coupling diode D1 is forward-biased since the anode (gate Gt1) thereof has −1.5 V and the cathode thereof is connected to the power supply line 71 ("L" (−5 V)) through the power supply line resistor Rg2. Thus, the potential of the gate Gt2 becomes equal to −3 V obtained by subtracting the forward potential Vd (1.5 V) of the pn junction from the potential (−1.5 V) of the gate Gt1. Further, since the anode (gate Gt1) of the coupling diode D2 has −3 V and the cathode thereof is connected to the power supply line 71 ("L" (−5 V)) through the power supply line resistor Rg2, the coupling diode D2 is forward-biased. Thus, the potential of the gate Gt3 becomes equal to −4.5 V obtained by subtracting the forward potential Vd (1.5 V) of the pn junction from the potential (−3 V) of the gate Gt2. However, there is no influence of the anode of the start diode SD having "H" (0 V) on the gates Gt assigned the numbers of 4 and greater, and the potentials of these gates Gt are equal to "L" (−5 V) which is the potential of the power supply line 71.

Since the gates Gt serve as the gates Gs, the gates Gs have a potential equal to the potential of the gates Gt. Thus, the threshold voltages of the transfer thyristors T and the driving thyristors S are equal to a value obtained by subtracting the forward potential Vd (1.5 V) of the pn junction from the potential of the gates Gt and Gs. That is, the threshold voltages of the transfer thyristor T1 and the driving thyristor S1 are equal to −3 V, the threshold voltages of the transfer thyristor T2 and the driving thyristor S2 are equal to −4.5 V, the threshold voltages of the transfer thyristor T3 and the driving thyristor S3 are equal to −6V, and the threshold voltages of the transfer thyristors T and the driving thyristors S assigned the number of 4 or greater are equal to −6.5 V.

(2) Time b

At time b illustrated in FIG. 9, the first transfer signal $\phi1$ changes from "H" (0 V) to "L" (−5 V). In response to this, the light-emitting device 65 starts the operation.

Upon the first transfer signal $\phi1$ changing from "H" to "L", the potential of the first transfer signal line 72 changes from "H" (0 V) to "L" (−5 V) through the terminal $\phi1$ and the current-limiting resistor R1. Then, the transfer thyristor T1 whose threshold voltage is equal to −3 V turns on since the voltage applied to the transfer thyristor T1 is equal to −3.3 V. At that time, a current flows through the lower diode UD1 and the lower diode UD1 enters the on-state from the off-state. As a result of the turn-on of the transfer thyristor T1, the potential of the first transfer signal line 72 becomes equal to a potential close to −3.2 V (a negative potential having an absolute value greater than 3.2 V), which is obtained by subtracting the forward potential Vd (1.5 V) of the pn junction from the potential of the anode of the transfer thyristor T1 (−1.7 V which is the potential applied to the lower diode UD1).

The transfer thyristor T3 has a threshold voltage of −6 V and the transfer thyristors T assigned odd numbers greater than or equal to 5 have a threshold voltage of −6.5 V. Since the voltages applied to the transfer thyristor T3 and the transfer thyristors T assigned odd numbers greater than or equal to 5 are equal to −1.5 V, which is obtained by adding −3.2 V to 1.7 V that is the voltage applied to the light-emitting diode LED, the transfer thyristor T3 and the transfer thyristors T assigned odd numbers greater than or equal to 5 do not turn on.

In addition, the even-numbered transfer thyristors T do not turn on since the second transfer signal $\phi2$ has "H" (0 V) and the second transfer signal line 73 has "H" (0 V).

In response to turn-on of the transfer thyristor T1, the potential of the gate Gt1/Gs1 becomes equal to "H" (0 V) that is the potential of the anode of the transfer thyristor T1. In addition, the potential of the gate Gt2 (gate Gs2) becomes equal to −1.5 V, the potential of the gate Gt3 (gate Gs3) becomes equal to −3 V, the potential of the gate Gt4 (gate Gs4) becomes equal to −4.5 V, and the potential of the gate Gt (gate Gs) assigned the number of 5 or greater becomes equal to "L".

Consequently, the threshold voltage of the driving thyristor S1 becomes equal to −1.5 V, the threshold voltages of the transfer thyristor T2 and the driving thyristor S2 become equal to −3 V, the threshold voltages of the transfer thyristor T3 and the driving thyristor S3 become equal to −4.5 V, the threshold voltages of the transfer thyristor T4 and the driving thyristor S4 become equal to −6 V, and the threshold voltages of the transfer thyristor T and the driving thyristor S assigned the number of 5 or greater become equal to −6.5 V.

However, since the first transfer signal line 72 has −1.5 V due to the on-state transfer thyristor T1, the odd-numbered transfer thyristors T that are in off-state do not turn on. Since the second transfer signal line 73 has "H" (0 V), the even-numbered transfer thyristors T do not turn on. In addition, the turn-on signal line 75 has "H" (0 V), none of the light-emitting diodes LED turn on.

Immediately after the time b (indicating time at which a steady state is achieved after a change in the thyristor and the like has occurred in response to a change in the potential of the signal at the time b, and the same applies to the other cases), the transfer thyristor T1 and the lower diode UD1 are in the on-state and the other transfer thyristors T, the other lower diodes UD, the other driving thyristors S, and the other light-emitting diodes LED are in the off-state.

(3) Time c

At time c, the turn-on signal $\phi$I1 changes from "H" (0 V) to "L" (−5V).

Upon the turn-on signal $\phi$I1 changing from "H" to "L", the turn-on signal line 75 changes from "H" (0 V) to "L" (−5 V) through the current-limiting resistor RI and the terminal $\phi$I. Then, −3.3 V obtained by adding the voltage of 1.7 V applied to the light-emitting diode LED to −5 V (L) is applied to the driving thyristor S1, and the driving thyristor S1 having a threshold voltage of −1.5 V turns on and the light-emitting diode LED1 turns on (emits light). Consequently, the potential of the turn-on signal line 75 becomes equal to a potential close to −3.2 V. Although the threshold voltage of the driving thyristor S2 is equal to −3 V, the voltage applied to the driving thyristor S2 is equal to −1.5 V obtained by adding −3.2 V to the voltage of 1.7 V applied to the light-emitting diode LED and thus the driving thyristor S2 does not turn on.

Immediately after the time c, the transfer thyristor T1, the lower diode UD1, and the driving thyristor S1 are in the on-state, and the light-emitting diode LED1 is on (is emitting light).

(4) Time d

At time d, the turn-on signal $\phi$I1 changes from "L" (−5 V) to "H" (0 V).

Upon the turn-on signal $\phi$I1 changing from "L" to "H", the potential of the turn-on signal line 75 changes from −3.2 V to "H" through the current-limiting resistor RI and the terminal $\phi$I. Since both the cathode of the driving thyristor S1 and the anode of the light-emitting diode LED1 have "H", the driving thyristor S1 turns off and the light-emitting diode LED1 turns off (off). A period for which the light-emitting diode LED1 is on is a period for which the turn-on signal $\phi$I1 has a potential of "L" (−5 V) from the time c at which the turn-on signal $\phi$I1 changes from "H" to "L" to the time d at which the turn-on signal $\phi$I1 changes from "L" to "H".

Immediately after the time d, the transfer thyristor T1 is in the on-state.

(5) Time e

At time e, the second transfer signal $\phi2$ changes from "H" (0V) to "L" (−5 V). At the time e, the period T(1) in which turn-on control is performed on the light-emitting diode LED1 ends, and the period T(2) in which turn-on control is performed on the light-emitting diode LED2 starts.

Upon the second transfer signal $\phi2$ changing from "H" to "L", the potential of the second transfer signal line 73 changes to −3.3 V through the terminal $\phi2$. As described before, since the threshold voltage of the transfer thyristor T2 is equal to −3 V, the transfer thyristor T2 turns on. At that time, a current flows through the lower diode UD2, and the lower diode UD2 enters the on-state from the off-state.

Consequently, the potential of the gate terminal Gt2 (gate terminal Gs2) becomes equal to "H" (0 V), the potential of the gate Gt3 (gate Gs3) becomes equal to −1.5 V, the potential of the gate Gt4 (gate Gs4) becomes equal to −3 V, and the potential of the gate Gt5 (Gs5) becomes equal to −4.5 V. In addition, the potential of the gates Gt (gates Gs) assigned the numbers of 6 or greater becomes equal to −5 V.

Immediately after the time e, the transfer thyristors T1 and T2 and the lower diodes UD1 and UD2 are in the on-state.

(6) Time f

At time f, the first transfer signal $\phi1$ changes from "L" (−3.3 V) to "H" (0 V).

Upon the first transfer signal $\phi1$ changing from "L" to "H", the potential of the first transfer signal line 72 changes from "L" to "H" through the terminal $\phi1$. Then, both the anode and the cathode of the on-state transfer thyristor T1 have "H", and the transfer thyristor T1 turns off. At that time, both the anode and the cathode of the lower diode UD1 have "H", and the lower diode UD1 enters the off-state from the on-state.

Then, the potential of the gate Gt1 (gate Gs1) changes toward the power supply voltage Vga ("L" (−5 V)) of the power supply line 71 through the power supply line resistor Rg1. Consequently, the coupling diode D1 enters a state in which a potential is applied so that no current flows therethrough (a reverse-biased state). Thus, there is no longer an influence of the gate Gt2 (gate Gs2) having "H" (0 V) on the gate Gt1 (gate Gs1). That is, the transfer thyristor T having the gate Gt connected through the reverse-biased coupling diode D has the threshold of −6.5 V and no longer turns on with the first transfer signal φ1 and the second transfer signal φ2 of "L" (−5 V).

Immediately after the time f, the transfer thyristor T2 and the lower diode UD2 are in the on-state.

(7) Other Times

Upon the turn-on signal φI1 changing from "H" (0 V) to "L" (−5 V) at time g, the driving thyristor S2 turns on and the light-emitting diode LED2 turns on (emits light) just like the driving thyristor S1 and the light-emitting diode LED1 at the time c.

Then, upon the turn-on signal φI1 changing from "L" (−5 V) to "H" (0 V) at time h, the driving thyristor S2 turns off and the light-emitting diode LED2 turns off just like the driving thyristor S1 and the light-emitting diode LED1 at the time d.

Further, upon the first transfer signal φ1 changing from "H" (0 V) to "L" (−5 V) at time i, the transfer thyristor T3 having a threshold voltage of −3 V turns on just like the transfer thyristor T1 at the time b or the transfer thyristor T2 at the time e. At the time i, the period T(2) in which turn-on control is performed on the light-emitting diode LED2 ends and the period T(3) in which turn-on control is performed on the light-emitting diode LED3 starts.

The operation described above is repeated thereafter.

Note that if the light-emitting diode LED is maintained off (turned off) instead of turning on, the turn-on signal φI is maintained at "H" (0 V) just like the turn-on signal φI1 from time j to time k in the period T(4) in which turn-on control is performed on the light-emitting diode LED4 in FIG. 9. With this configuration, even if the threshold of the driving thyristor S4 is equal to −1.5 V, the driving thyristor S4 does not turn on and the light-emitting diode LED4 is maintained off (turned off).

As described above, the gate terminals Gt of the transfer thyristors T are connected to each other by the corresponding coupling diodes D. Thus, when the potential of the gate Gt changes, the potential of the gate Gt that is connected to the potential-changed gate Gt through the forward-biased coupling diode D also changes. Then, the threshold voltage of the transfer thyristor T having the potential changed gate also changes. The transfer thyristor T turns on at a timing at which the first transfer signal φ1 or the second transfer signal φ2 changes from "H" (0 V) to "L" (−5 V) if the threshold voltage thereof is higher than −3.3 V (a negative value having a smaller absolute value).

Then, since the driving thyristor S whose gate Gs is connected to the gate Gt of the on-state transfer thyristor T has a threshold of −1.5 V, the driving thyristor S turns on when the turn-on signal φI changes from "H" (0 V) to "L" (−5 V), and the light-emitting diode LED that is connected in series with the driving thyristor S turns on (emits light).

That is, the transfer thyristor T enters the on-state to specify the light-emitting diode LED that is the target of turn-on control, and the turn-on signal φI at "L" (−5 V) turns on the driving thyristor S connected in series with the light-emitting diode LED that is the target of turn-on control and also turns on the light-emitting diode LED.

Note that the turn-on signal φI at "H" (0 V) maintains the driving thyristor S in the off-state and maintains the light-emitting diode LED off. That is, the turn-on signal φI sets on/off of the light-emitting diodes LED.

On/off of the light-emitting diodes LED is controlled by setting the turn-on signal φI in accordance with image data in this way.

Fabrication Method of Light-Emitting Chip C

A fabrication method of the light-emitting chip C will be described.

Figure 10A:
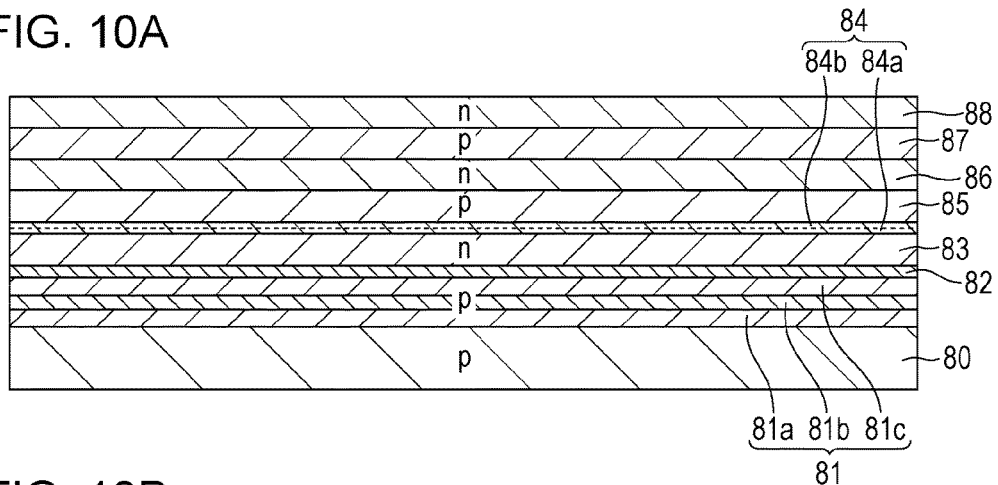
FIGS. 10A to 10C illustrate a fabrication method of the light-emitting chip, specifically.
Figure 10B:
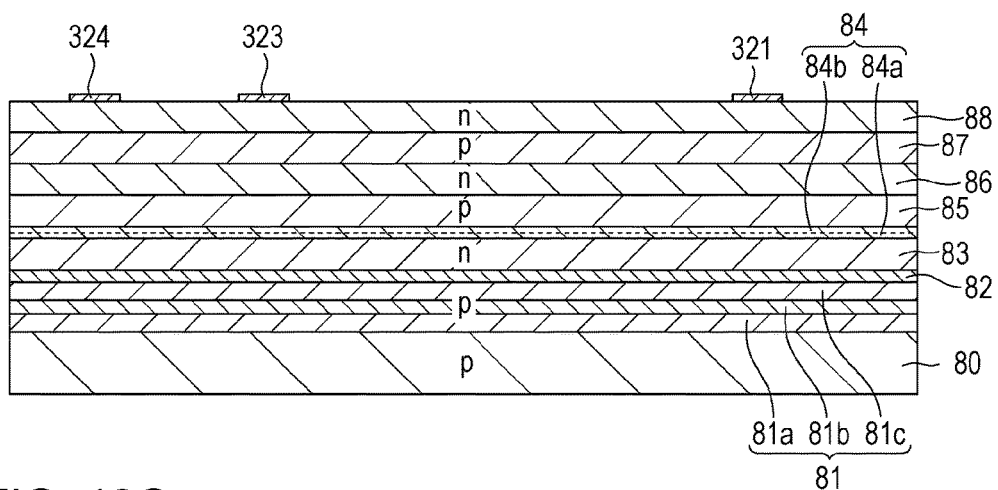
Figure 10C:
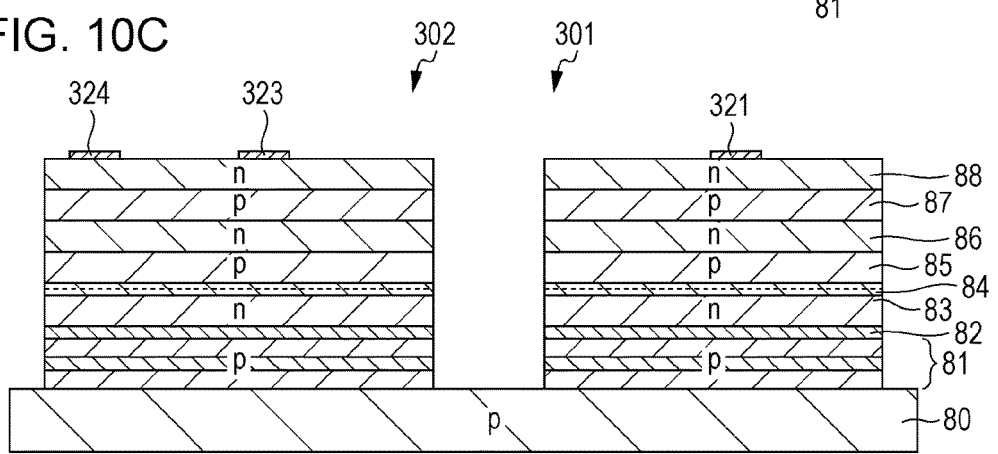
Figure 11A:
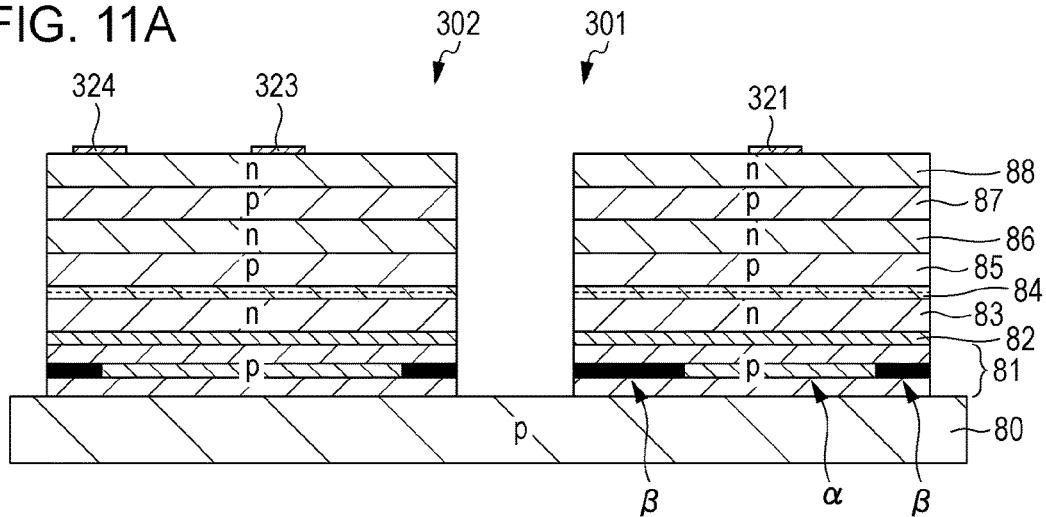
FIGS. 11A to 11C illustrate the fabrication method of the light-emitting chip, specifically.
Figure 11B:
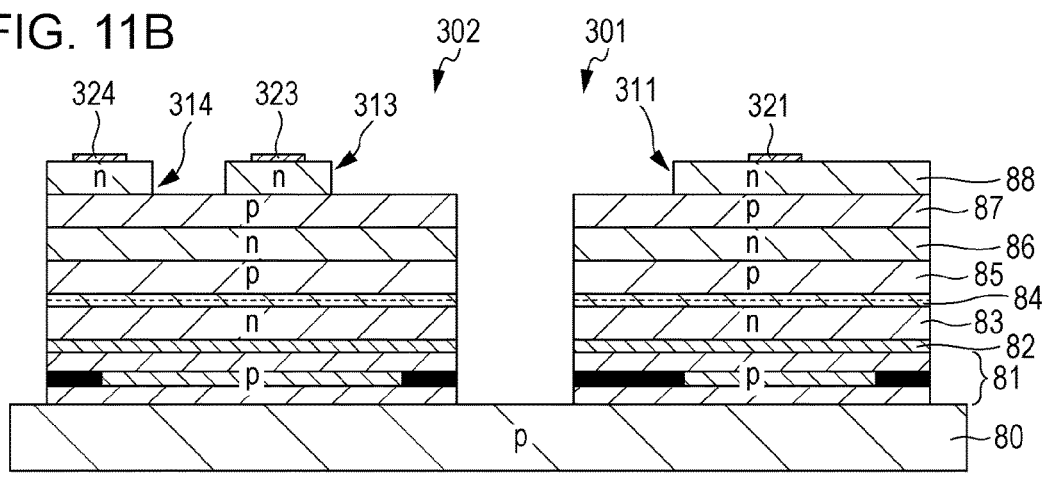
Figure 11C:
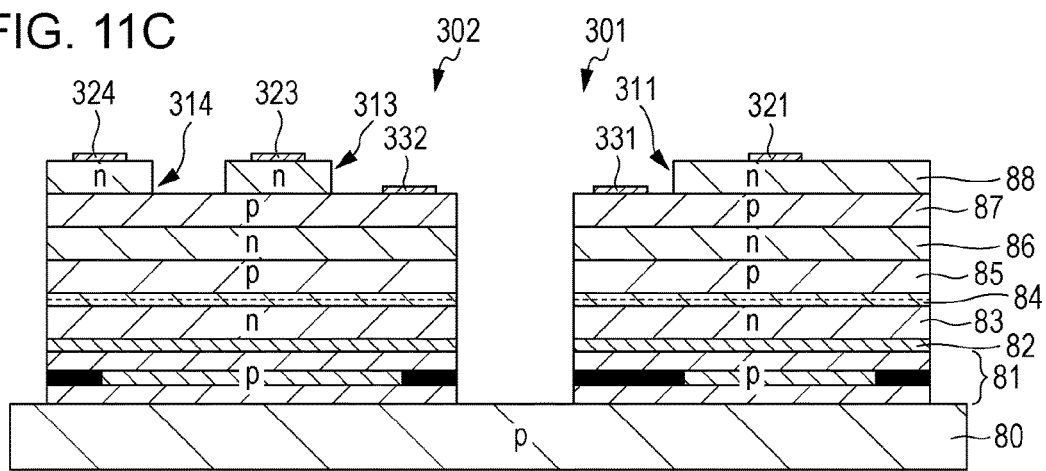
Figure 12A:
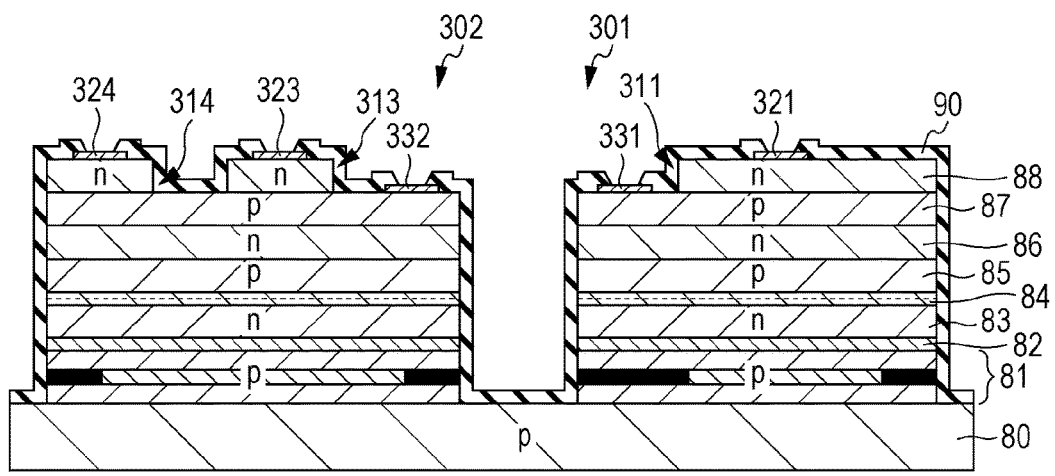
FIGS. 12A and 12B illustrate the fabrication method of the light-emitting chip, specifically.
Figure 12B:
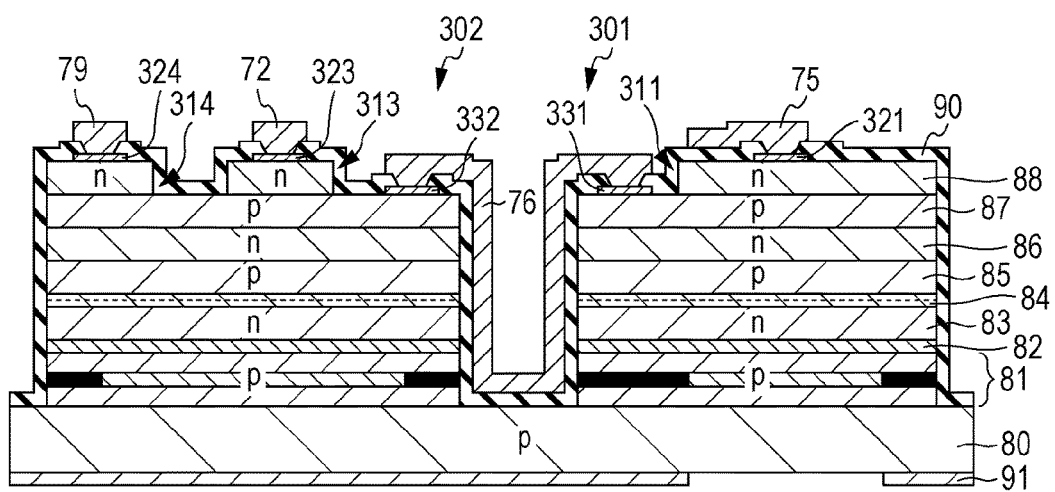

FIGS. 10A to 12B illustrate the fabrication method of the light-emitting chip C. Specifically, FIG. 10A illustrates a semiconductor stack formation step, FIG. 10B illustrates an n-ohmic electrode formation step of forming n-ohmic electrodes (such as the n-ohmic electrodes 321, 323, and 324), and FIG. 10C illustrates a semiconductor stack division step. FIG. 11A illustrates a current blocking portion formation step of forming the current blocking portion β, FIG. 11B illustrates a p-gate layer exposure etching step for exposing the p-gate layer 87, and FIG. 11C illustrates a p-ohmic electrode formation step of forming p-ohmic electrodes (such as the p-ohmic electrodes 331 and 332). FIG. 12A illustrates a protection layer formation step of forming the protection layer 90, and FIG. 12B illustrates a wire formation step of forming wires (such as the power supply line 71, the first transfer signal line 72, the second transfer signal line 73, and the turn-on signal line 75) and the back-surface electrode 91.

FIGS. 10A to 12B illustrate the cross-sections of the islands 301 and 302 illustrated in FIG. 7. The cross-section of these islands 301 and 302 are taken along line VIB-VIB illustrated in FIG. 6A but are viewed from the side (−x direction) opposite to the side in FIG. 6B. The same applies to the other islands. In addition, the conductivity type (p or n) of an impurity is indicated.

The steps are sequentially described below.

In the semiconductor stack formation step illustrated in FIG. 10A, the p-anode layer 81, the light-emitting layer 82, the n-cathode layer 83, the light-transmission reduction layer 84, the p-anode layer 85, the n-gate layer 86, the A-gate layer 87, and the n-cathode layer 88 are sequentially formed by epitaxial growth on the p-type substrate 80 in this order to form a semiconductor stack.

The description is given using the substrate 80 of p-type GaAs, for example; however, the substrate 80 may be of n-type GaAs or i-type GaAs not doped with any impurities. In addition, the substrate 80 may be formed of InP, GaN, InAs, a III-V or II-VI compound semiconductor material, sapphire, Si, Ge, etc. When the material of the substrate 80 is changed, a material having a lattice constant that substantially matches the lattice constant of the substrate (including a strain structure, a strain relaxation layer, and metamorphic growth) is used as a material monolithically stacked on the substrate. For example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a Si substrate. Note that in the case where a semiconductor material is attached to another supporting substrate after its crystal growth, the semiconductor material need not have a lattice that substantially matches the lattice constant of the supporting substrate.

The p-anode layer 81 is constituted by the lower p-anode layer 81a, the current constriction layer 81b, and the upper p-anode layer 81c that are sequentially stacked.

The lower p-anode layer 81a and the upper p-anode layer 81c of the p-anode layer 81 are formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The current constriction layer 81b is formed of AlAs or p-type AlGaAs with a high composition ratio of Al, for example. Any material may be used as long as Al is oxidized to be $Al_2O_3$ and consequently electrical resistance increases to constrict the current path.

The light-emitting layer 82 has a quantum well structure in which well layers and barrier layers are alternately stacked one on top of the other. The well layers are formed of GaAs, AlGaAs, InGaAS, GaAsP, AlGaInP, GaInAsP, or GaInP, for example. The barrier layers are formed of AlGaAs, GaAs, GaInP, or GaInAsP, for example. Note that the light-emitting layer 82 may have a quantum wire structure or a quantum dot structure.

The n-cathode layer 83 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

The light-transmission reduction layer 84 includes a junction of the $n^{++}$-layer 84a doped with an n-type impurity at a high concentration and the $p^{++}$-layer 84b doped with an n-type impurity at a high concentration (see FIG. 8E). The $n^{++}$-layer 84a and the $p^{++}$-layer 84b have a high impurity concentration of $1\times10^{20}/cm^3$, for example. The impurity concentration of a normal junction is in a range of $10^{17}/cm^3$ to $10^{18}/cm^3$. Examples of the combination of the $n^{++}$-layer 84a and the $p^{++}$-layer 84b (hereinafter, referred to as "$n^{++}$-layer 84a/$p^{++}$-layer 84b) include $n^{++}GaInP/p^{++}GaAs$, $n^{++}GaInP/p^{++}AlGaAs$, $n^{++}GaAs/p^{++}GaAs$, $n^{++}AlGaAs/p^{++}AlGaAs$, $n^{++}InGaAs/p^{++}InGaAs$, $n^{++}GaInAsP/p^{++}GaInAsP$, and $n^{++}GaAsSb/p^{++}GaAsSb$. Note that the combinations may be interchanged.

The p-anode layer 85 is formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The n-gate layer 86 is formed of n-type $Al_{0.9}GaAs$ with an impurity concentration of $1\times10^{17}/cm^3$, for example. The Al composition ratio may be changed within a range of 0 to 1. Note that GaInP or the like may be alternatively used.

The p-gate layer 87 is formed of p-type $Al_{0.9}GaAs$ with an impurity concentration of $1\times10^{17}/cm^3$, for example. The Al composition ratio may be changed within a range of 0 to 1. Note that GaInP or the like may be alternatively used.

The n-cathode layer 88 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

These semiconductor layers are stacked using metal organic chemical vapor deposition (MOCVD) or molecular beam epitaxy (MBE), for example. Consequently, a semiconductor stack is formed.

In the n-ohmic electrode formation step illustrated in FIG. 10B, n-ohmic electrodes such as the n-ohmic electrodes 321, 323, and 324 are formed on the n-cathode layer 88 first.

The n-ohmic electrodes (such as the n-ohmic electrodes 321, 323, and 324) are formed of Ge-containing Au (AuGe) that easily forms an ohmic contact with an n-type semiconductor layer such as the n-cathode layer 88, for example.

The n-ohmic electrodes (such as the n-ohmic electrodes 321, 323, and 324) are formed using the lift-off method, for example.

In the semiconductor stack division step illustrated in FIG. 10C, the n-cathode layer 88, the p-gate layer 87, the n-gate layer 86, the p-anode layer 85, the light-transmission reduction layer 84, the n-cathode layer 83, the light-emitting layer 82, and the p-anode layer 81 are sequentially etched so as to isolate islands such as the islands 301 and 302. This etching may be wet etching using, for example, a sulfuric-acid-based etching solution (sulfuric acid:hydrogen peroxide water:water=1:10:300 in weight ratio) or anisotropic dry etching (RIE) using, for example, boron chloride. The etching performed in this semiconductor stack division step is sometimes called mesa etching or post etching.

In the current blocking portion formation step illustrated in FIG. 11A, the current constriction layer 81b whose side faces have been exposed by the semiconductor stack division step is oxidized from the side faces to form the current blocking portion β that blocks a current. The remaining non-oxidized portion serves as the current passing portion α.

The current constriction layer 81b is oxidized by oxidizing Al in the current constriction layer 81b formed of AlAs, AlGaAs, or the like through steam oxidation at 300 to 400° C., for example. At that time, oxidation progresses from the exposed side faces, and consequently the current blocking portion β formed of $Al_2O_3$, which is an oxide of Al, is formed at the circumferential portion of the islands such as the islands 301 and 302. The portion of the current constriction layer 81b that is not oxidized serves as the current passing portion α. Note that FIG. 11B to FIG. 12B illustrate the widths of the current blocking portion β from the side faces of the islands differently for the sake of illustration. Since oxidation progresses over the same distance from the side faces of the islands such as the islands 301 and 302, the widths of the formed current blocking portion β from the side faces are equal.

Note that the current blocking portion β may be formed by implanting the hydrogen ion ($H^+$) to a semiconductor layer of GaAs, AlGaAs, or the like (ion implantation), instead of by using a semiconductor layer having a large Al composition ratio, such as AlAs. That is, the p-anode layer 81 may be formed without dividing the p-anode layer 81 into the lower p-anode layer 81a and the upper p-anode layer 81c and without using the current constriction layer 81b, and $H^+$ may be implanted to a portion that serves as the current blocking portion β to inactivate the impurity. The current blocking portion β having a high electric resistance may be formed in this way.

In the p-gate layer exposure etching step illustrated in FIG. 11B, the n-cathode layer 88 is etched to expose the p-gate layer 87.

This etching may be wet etching using, for example, a sulfuric-acid-based etching solution (sulfuric acid:hydrogen peroxide water:water=1:10:300 in weight ratio) or anisotropic dry etching (RIE) using, for example, boron chloride.

In the p-ohmic electrode formation step illustrated in FIG. 11C, p-ohmic electrodes such as the p-ohmic electrodes 331 and 332 are formed on the p-gate layer 87.

The p-ohmic electrodes (such as the p-ohmic electrodes 331 and 332) are formed of Zn-containing Au (AuZn) that easily forms an ohmic contact with a p-type semiconductor layer such as the p-gate layer 87, for example.

The p-ohmic electrodes (such as the p-ohmic electrodes 331 and 332) are formed using the lift off method, for example.

In the protection layer formation step illustrated in FIG. 12A, the protection layer 90 is formed to cover the surfaces of the islands such as the islands 301 and 302 by using an insulating material, such as $SiC_2$, SiON, or SiN, for example.

Then, through-holes (openings) are formed in the protection layer 90 above the n-ohmic electrodes (such as the n-ohmic electrodes 321, 323, and 324) and the p-ohmic electrodes (such as the p-ohmic electrodes 331 and 332).

In the wire formation step illustrated in FIG. 12B, wires (such as the power supply line 71, the first transfer signal line 72, the second transfer signal line 73, and the turn-on signal line 75) connected to the n-ohmic electrodes (the n-ohmic electrodes 321, 323, and 324) and the p-ohmic electrodes (p-ohmic electrodes 331 and 332) via through-holes in the protection layer 90 and the back-surface electrode 91 are formed.

The wires and the back-surface electrode 91 are formed of Au, Al, or the like.

As described above, the driving thyristors S and the light-emitting diodes LED are stacked in each of the light-emitting chips C according to the first exemplary embodiment. Such a configuration makes the light-emitting chips C be of self-scanning type that sequentially turns on the light-emitting diodes LED by using the transfer thyristors T and the driving thyristors S. As a result, the number of terminals provided in the light-emitting chips C is reduced, and the light-emitting chips C and the light-emitting device 65 become more compact.

The driving thyristors S are sometimes used as light-emitting thyristors (light-emitting elements) instead of disposing the light-emitting diodes LED under the respective driving thyristors S. That is, the p-anode layer 81, the light-emitting layer 82, and the n-cathode layer 83 that constitute the light-emitting diodes LED and the lower diodes UB are omitted.

In this case, driving characteristics and light emission characteristics are not separately (independently) settable. Thus, it is difficult to increase the driving speed, increase the output power of light, increase the efficiency, reduce the power consumption, and reduce the cost.

In contrast, in the first exemplary embodiment, the light-emitting diodes LED perform light emission and the transfer thyristors T and the driving thyristors S perform transfer. That is, light emission and transfer are separated from each other. The driving thyristors S need not emit light. Thus, light emission characteristics are successfully improved by configuring the light-emitting diodes LED to have the quantum well structure, and transfer characteristics of the transfer thyristors T and the driving thyristors S are also successfully improved. That is, the light-emitting diodes LED of the light-emitting unit 102 and the transfer thyristors T and the driving thyristors S of the driving unit 101 are separately (independently) settable. This makes it easier to achieve a higher driving speed, a higher output power of light, a higher efficiency, a lower power consumption, and a lower cost.

In addition, in the first exemplary embodiment, the light-emitting diode LED and the driving thyristor S are stacked with the light-transmission reduction layer 84 interposed therebetween. When the n-cathode layer 83 of the light-emitting diode LED and the p-anode layer 85 of the driving thyristor S are directly stacked, the junction therebetween is reverse-biased. However, since current easily flows through the light-transmission reduction layer 84 as described above, current flows more easily through the junction by stacking the light-emitting diode LED and the driving thyristor S with the light-transmission reduction layer 84 interposed therebetween.

If the light-transmission reduction layer 84 is not provided, a voltage greater than or equal to a breakdown voltage of the reverse-biased junction is applied in order to allow a current to flow through the series connection of the driving thyristor S and the light-emitting diode LED. That is, the driving voltage increases.

However, the driving voltage is reduced by stacking the light-emitting diode LED and the driving thyristor S with the light-transmission reduction layer 84 interposed therebetween, compared with the case where the light-transmission reduction layer 84 is not interposed between the light-emitting diode LED and the driving thyristor S.

In addition, the light-transmission reduction layer 84 reduces the intensity (amount) of light emitted by the driving thyristor S so that the light does not affect image formation even if the driving thyristor S emits light. Thus, the driving thyristor S may emit light.

Note that the current constriction layer 81b provided in the p-anode layer 81 of the light-emitting diode LED may be provided in the n-cathode layer 83 of the light-emitting diode LED.

A material used for the light-transmission reduction layer 84 is more difficult to grow and has a lower quality than a material such as GaAs or InP. Thus, crystal defects are more likely to occur in the light-transmission reduction layer 84 and the crystal defects extend to a semiconductor layer of, for example, GaAs that is grown on the light-transmission reduction layer 84. For example, since an InGaAs layer has a different lattice constant for a GaAs substrate or an InP substrate and an InGaN layer has a different lattice constant for a GaN substrate, crystal defects with distortion are more likely to occur.

Further, when the light-transmission reduction layer 84 is a semiconductor layer with a high impurity concentration, the light-transmission reduction layer 84 has, for example, an impurity concentration of $10^{19}/cm^3$, which is higher than the impurity concentrations of the other layers that are in a range of $10^{17}$ to $10^{18}/cm^3$. Si that is used as an impurity has a lattice constant, a bond strength, and the number of valence electrons that are different from those of GaAs, which is an example of a semiconductor material serving as a base. Thus, when a semiconductor layer of GaAs or the like is grown on the light-transmission reduction layer 84, crystal defects are more likely to occur. The higher the impurity concentration, the higher the likelihood of crystal defects. The crystal defects continue to the semiconductor layer formed thereon.

In addition, in order to make the impurity concentration of a layer such as the light-transmission reduction layer 84 higher than those of the other layers, the layer needs to be grown at a low temperature. That is, the growth conditions (temperature, growth speed, and ratio) need to be changed. Thus, the growth conditions of a semiconductor layer disposed on the light-transmission reduction layer 84 deviates from the optimum growth conditions.

As a result, the semiconductor layer disposed on the light-transmission reduction layer 84 contains many crystal defects.

In particular, the light emission characteristics of light-emitting elements such as the light-emitting diodes LED are easily affected by the crystal defects contained in the semiconductor layer. On the other hand, thyristors (the driving thyristors S and the transfer thyristors T) are only required to turn on and supply a current to the light-emitting diodes LED and the lower diodes UD. That is, the thyristors (the driving thyristors S and the transfer thyristors T) are robust against the influence of the crystal defects.

In the first exemplary embodiment, the light-emitting diodes LED and the lower diodes UD are disposed on the substrate 80, and the driving thyristors S and the transfer thyristors T are disposed on the light-emitting diodes LED and the lower diodes UD with the light-transmission reduction layer 84 interposed therebetween. In this way, the occurrence of crystal defects is suppressed in the light-emitting diodes LED and the lower diodes UD, particularly, in the light-emitting diodes LED, and the influence of the crystal defects on the light emission characteristics is reduced.

Voltage Reduction Layer 89

In the light-emitting chip C described above, the driving thyristors S and the transfer thyristors T are respectively stacked on the light-emitting diodes LED and the lower diodes UD with the light-transmission reduction layer 84 interposed therebetween. Thus, the absolute values of the voltages of the power supply potential Vga, the first transfer signal φ1, the second transfer signal φ2, and the turn-on signal φI have increased. As described before, "L" (−5 V) is used.

Accordingly, a voltage reduction layer 89 that reduces voltages applied to the thyristors (the driving thyristors S and the transfer thyristors T) may be used in order to reduce the absolute values of the voltages of the power supply potential Vga, the first transfer signal φ1, the second transfer signal φ2, and the turn-on signal φI.

Figure 13:
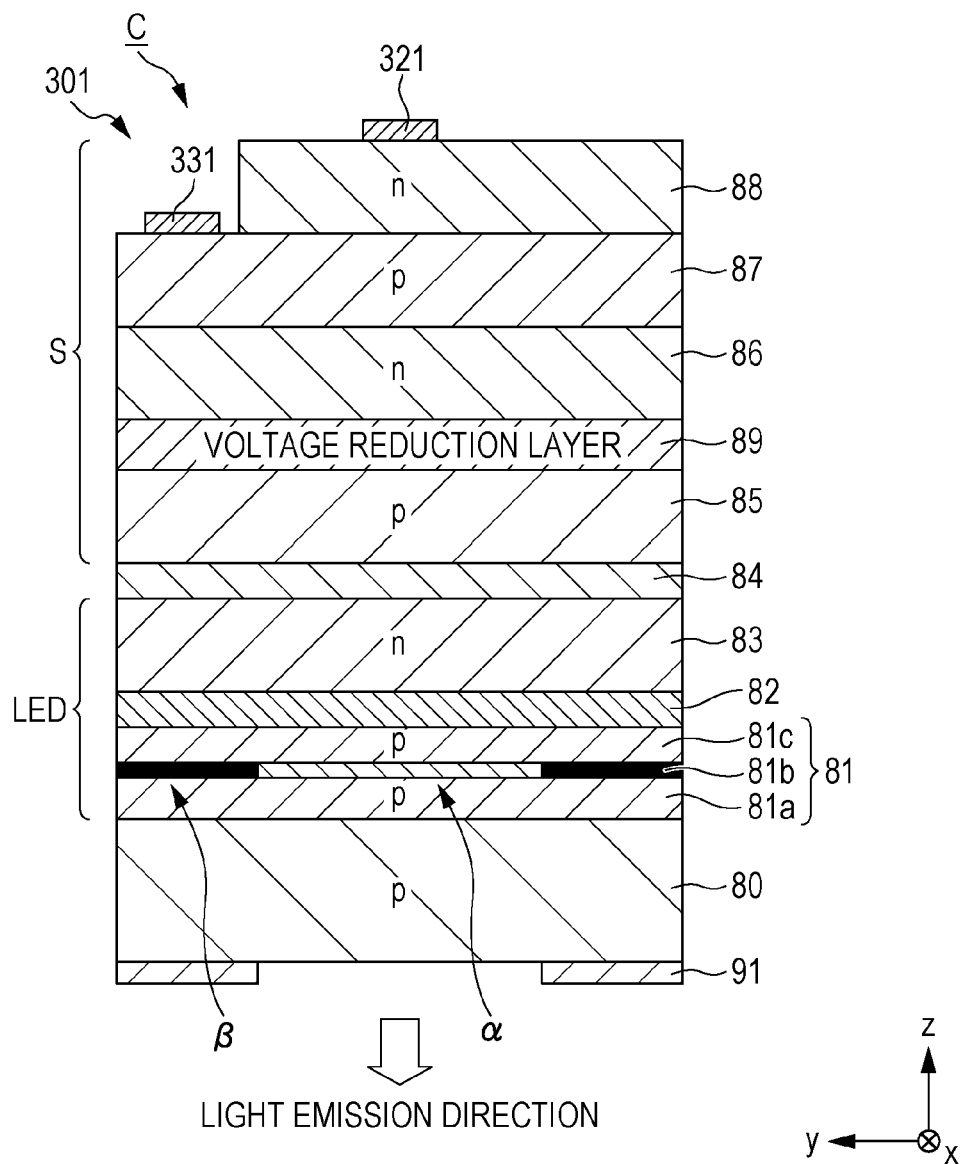
FIG. 13 is an enlarged cross-sectional view of an island in which a light-emitting diode and a driving thyristor including a voltage reduction layer are stacked.

FIG. 13 is an enlarged cross-sectional view of the island 301 in which the light-emitting diode LED1 and the driving thyristor S1 including the voltage reduction layer 89 are stacked. FIG. 13 is equivalent to FIG. 7 additionally including the voltage reduction layer 89. Thus, portions substantially the same as those illustrated in FIG. 7 are assigned the same reference signs to omit a description thereof, and different part will be described.

In this example, the voltage reduction layer 89 is disposed between the p-anode layer 85 and the n-gate layer 86 of the driving thyristor S. The same applies to the transfer thyristor T.

The voltage reduction layer 89 may be part of the p-anode layer 85, that is, may be a p-type layer with an impurity concentration similar to that of the p-anode layer 85. Alternatively, the voltage reduction layer 89 may be part of the n-gate layer 86, that is, may be an n-type layer with an impurity concentration similar to that of the n-gate layer 86. In addition, the voltage reduction layer 89 may be an i-type layer.

A function of the voltage reduction layer 89 in the driving thyristors S and the transfer thyristors T will be described by generalizing the driving thyristors S and the transfer thyristors T as thyristors.

Figure 14A:
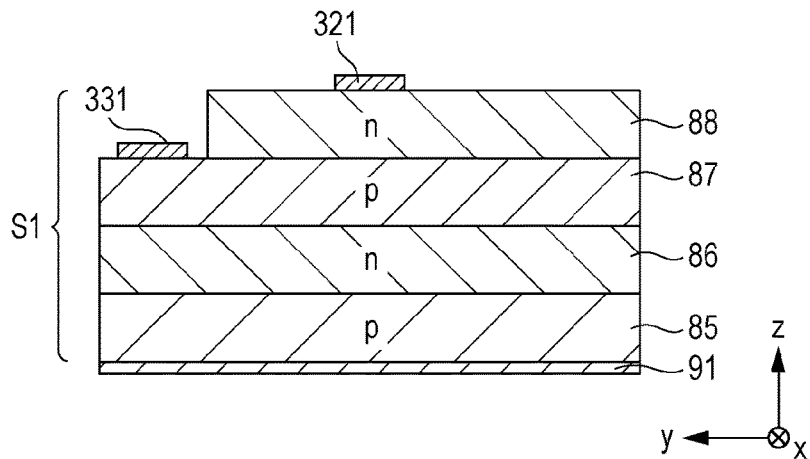
FIGS. 14A to 14C illustrate structures and characteristics of thyristors, specifically.
Figure 14B:
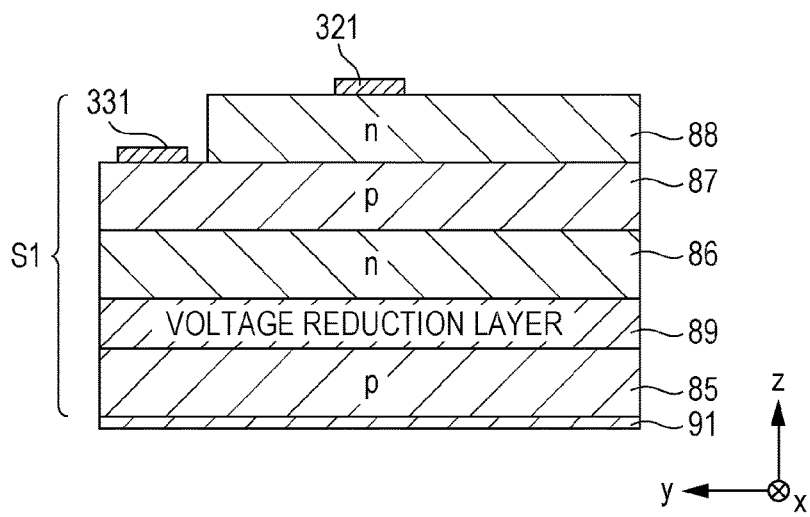
Figure 14C:
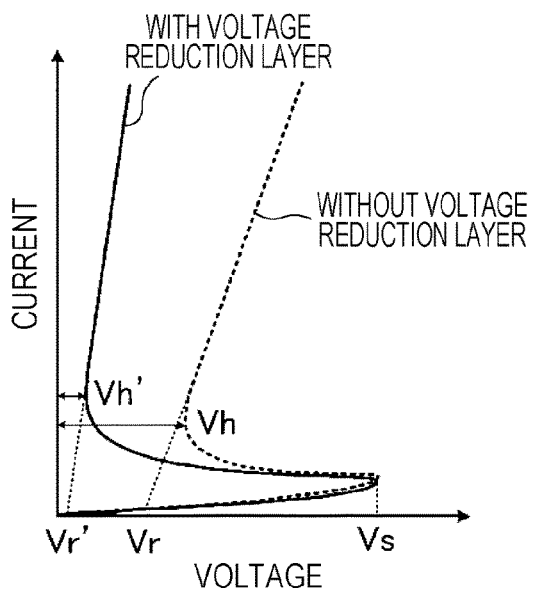

FIGS. 14A to 14C illustrate structures and characteristics of thyristors. Specifically, FIG. 14A is a cross-sectional view of a thyristor not including the voltage reduction layer 89, FIG. 14B is a cross-sectional view of a thyristor including the voltage reduction layer 89, and FIG. 14C illustrates characteristics of the thyristors. Cross-sections in FIGS. 14A and 14B correspond to cross-sections of the driving thyristor S1 that is not stacked on the light-emitting diode LED, for example. Accordingly, the reference signs used for the driving thyristor S1 are illustrated with parentheses. It is assumed that the back-surface electrode 91 is disposed on the back surface of the p-anode layer 85.

The thyristor illustrated in FIG. 14A does not include the voltage reduction layer 89. The thyristor illustrated in FIG. 14B includes the voltage reduction layer 89 located between the p-anode layer 85 and the n-gate layer 86.

The rising voltages (see Vr and Vr' in FIG. 14C) of the thyristors are determined by the smallest bandgap energy among bandgap energies of the semiconductor layers that constitute the thyristors. Note that the rising voltage of a thyristor is a voltage obtained when current flowing through the thyristor in an on-state is extrapolated to the voltage axis.

As illustrated in FIG. 14C, the rising voltage Vr' of the thyristor including the voltage reduction layer 89 which is a layer having a smaller bandgap energy than the p-anode layer 85, the n-gate layer 86, the p-gate layer 87, and the n-cathode layer 88 is lower than the rising voltage Vr of the thyristor not including the voltage reduction layer 89. The voltage reduction layer 89 is a layer having a smaller bandgap than the bandgap of the light-emitting layer 82, for example.

The thyristors (the driving thyristor S and the transfer thyristors T) are not used as the light-emitting elements. The thyristors (the driving thyristor S and the transfer thyristors T) function as part of the driving unit 101 that drives light-emitting elements, such as the light-emitting diodes LED. Thus, the bandgap is determined independently of the wavelength of light actually emitted by the light-emitting element. Accordingly, the rising voltage Vr of the thyristor is reduced by providing the voltage reduction layer 89 having a bandgap smaller than the bandgap of the light-emitting layer 82.

Figure 15:
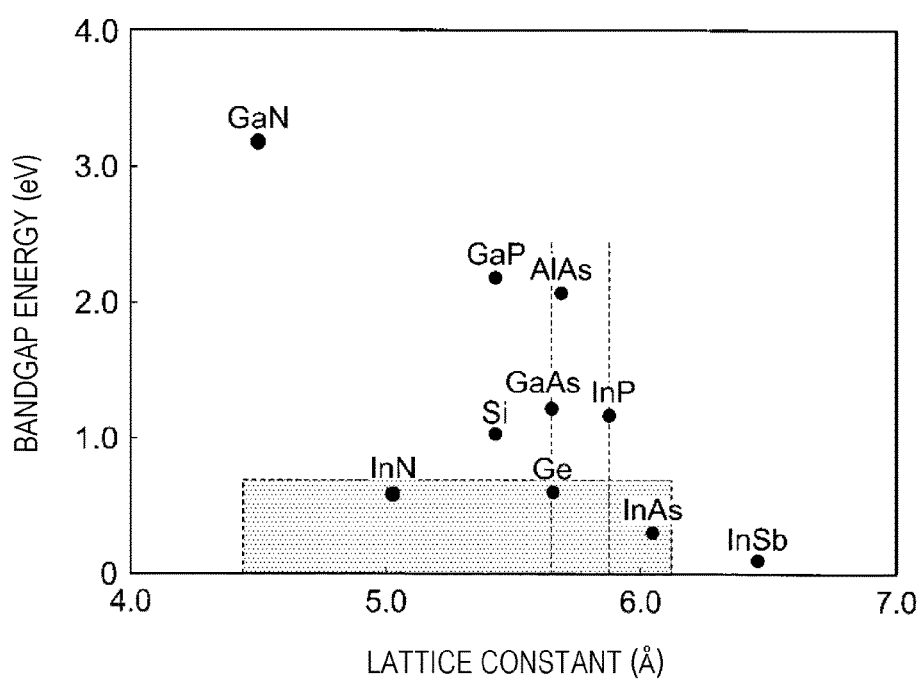
FIG. 15 illustrates bandgap energies of materials of semiconductor layers.

FIG. 15 illustrates bandgap energies of materials of semiconductor layers.

The lattice constant of GaAs is about 5.65 Å. The lattice constant of AlAs is about 5.66 Å. Thus, a material having a lattice constant close to this lattice constant is successfully epitaxially grown on a GaAs substrate. For example, Ge or AlGaAs, which is a compound of GaAs and AlAs, is successfully epitaxially grown on a GaAs substrate.

In addition, the lattice constant of InP is about 5.87 Å. A material having a lattice constant close to this lattice constant is successfully epitaxially grown on an InP substrate.

GaN has different lattice constants depending on the growth face. The lattice constant of the a-plane is 3.19 Å and the lattice constant of the c-plane is 5.17 Å. A material having a lattice constant close to one of these lattice constants is successfully epitaxially grown on a GaN substrate.

Materials having bandgap energies that reduce the rising voltage of the thyristor for GaAs, InP, and GaN are in a shaded range in FIG. 15. That is, when a material in the shaded range is used as a layer of the thyristor, the rising voltage Vr of the thyristor becomes equal to bandgap energy of the material in the shaded range.

For example, the bandgap energy of GaAs is about 1.43 eV. Thus, the rising voltage Vr of the thyristor is about 1.43 V without the voltage reduction layer 89. However, when a material in the shaded range is used as or included in a layer of the thyristor, the rising voltage Vr of the thyristor is successfully set to be higher than 0 V and lower than 1.43 V (0 V<Vr<1.43 V).

Consequently, power consumption is reduced when the thyristor is in the on-state.

The materials in the shaded range include Ge which has a bandgap energy of about 0.67 eV for GaAs. In addition, the materials include InAs which has a bandgap energy of about 0.36 eV for InP. In addition, materials having a smaller bandgap energy such as a compound of GaAs and InP, a compound of InN and InSb, and a compound of InN and InAs may be used for a GaAs substrate or an InP substrate. In particular, a GaInNAs-based mixed compound is suitable. These may contain Al, Ga, As, P, Sb, etc. In addition, GaNP may serve as the voltage reduction layer 89 for GaN. In addition, (1) an InN layer or an InGaN layer obtained by metamorphic growth, for example; (2) quantum dots of InN, InGaN, InNAs, or InNSb; or (3) an InAsSb layer having a lattice constant equivalent to the doubled lattice constant of GaN (the a-plane) may be used as the voltage reduction layer 89. These may contain Al, Ga, N, As, P, Sb, etc.

The description has been given using the rising voltages Vr and Vr' of the thyristors in this example. The same applies to hold voltages Vh and Vh' that are the minimum voltages applied to maintain the thyristors in the on-state and to voltages applied to the on-state thyristors (see FIG. 14C).

On the other hand, the switching voltage Vs (see FIG. 14C) of a thyristor is determined by a depletion layer of a reverse-biased semiconductor layer. Thus, the influence of the voltage reduction layer 89 on the switching voltage Vs of the thyristor is small.

That is, the voltage reduction layer 89 maintains the switching voltage Vs of the thyristor and reduces the rising voltage (reduces the rising voltage Vr to the rising voltage Vr'). Consequently, the voltage applied to the on-state thyristor is reduced, and power consumption is reduced. The switching voltage Vs of the thyristor is set to a given value by adjusting the materials and impurity concentrations of the p-anode layer 85, the n-gate layer 86, the p-gate layer 87, and the n-cathode layer 88. Note that the switching voltage Vs changes depending on the position at which the voltage reduction layer 89 is inserted.

Although FIG. 13 illustrates an example in which a single voltage reduction layer 89 is provided, plural voltage reduction layers 89 may be provided. For example, the voltage reduction layer 89 may be disposed between the p-anode layer 85 and the n-gate layer 86 and between the p-gate layer 87 and the n-cathode layer 88. Alternatively, the voltage reduction layer 89 may be disposed in the n-gate layer 86 and in the p-gate layer 87. In addition, two or three layers may be selected from among the p-anode layer 85, the n-gate layer 86, the p-gate layer 87, and the n-cathode layer 88, and the voltage reduction layer may be disposed in each of the two or three selected layers. The conductivity types of these voltage reduction layers may be set to match the conductivity types of the anode layer, the cathode layer, and the gate layers where the respective voltage reduction layers are disposed or may be i-type.

A material used for the voltage reduction layer 89 is more difficult to grow and has a lower quality than a material such as GaAs or InP. Thus, crystal defects are more likely to occur in the voltage reduction layer 89 and the crystal defects extend to a semiconductor layer of, for example, GaAs that is grown on the voltage reduction layer 89.

As described above, light emission characteristics of light-emitting elements, such as the light-emitting diodes LED, are easily affected by crystal defects contained in the semiconductor layer. On the other hand, thyristors (the driving thyristors S and the transfer thyristors T) are only required to turn on and supply a current to the light-emitting diodes LED and the lower diodes UD. That is, when the thyristors including the voltage reduction layer 89 are not used as the light-emitting layer but is used for reducing the voltage, the semiconductor layer that constitutes the thyristors may contain crystal defects.

Accordingly, the light-emitting diodes LED and the lower diodes UD are disposed on the substrate 80, and then the driving thyristors S and the transfer thyristors T including the voltage reduction layer 89 are respectively disposed on the light-emitting diodes LED and the lower diodes UD as in the case of the light-transmission reduction layer 84. In this way, the occurrence of crystal defects is suppressed in the light-emitting diodes LED and the lower diodes UD, particularly, in the light-emitting diodes LED, to make the crystal defects less influential in the light emission characteristics. In addition, the driving thyristors S and the transfer thyristors T may be monolithically stacked.

The current constriction layer 81*b* is provided in the p-anode layer 81 of the light-emitting diode LED; however, the current constriction layer 81*b* may be provided in the n-cathode layer 83 of the light-emitting diode LED or in the p-anode layer 85 or the n-cathode layer 88 of the driving thyristor S.

Figure 16:
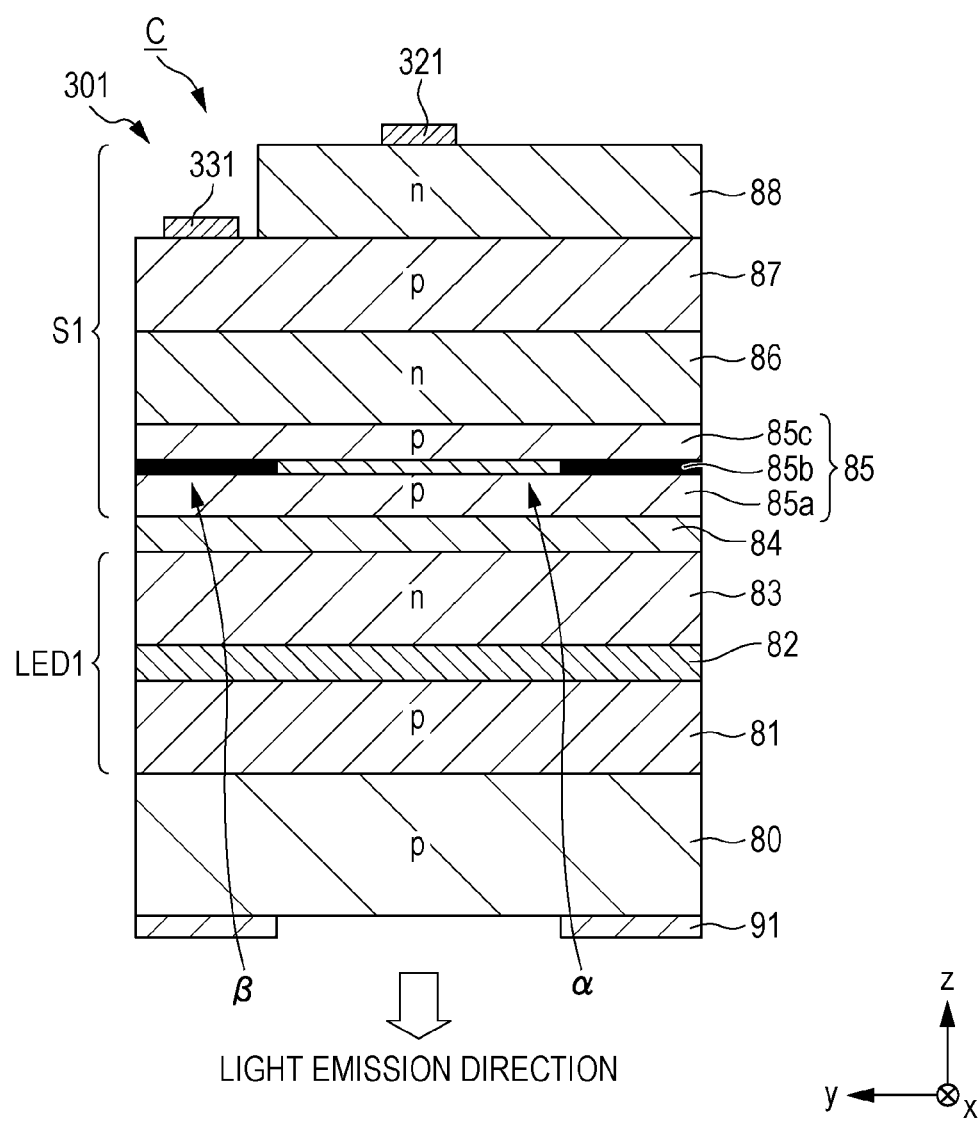
FIG. 16 illustrates a first modification of the light-emitting chip according to the first exemplary embodiment and is an enlarged cross-sectional view of the island in which the light-emitting diode and the driving thyristor are stacked.

Modifications of the light-emitting chip C according to the first exemplary embodiment will be described below. In the modifications described below, a description is given of a portion where the driving thyristor S1 and the light-emitting diode LED1 are stacked in the island 301 of the light-emitting chip C; however, the same applies to other portions where the driving thyristor S and the light-emitting diode LED are stacked and portions where the transfer thyristor T and the lower diode UD are stacked. Since the rest of the configuration is substantially the same as that of the light-emitting chip C described above, a description of the substantially the same part is omitted. That is, the different part will be described and First Modification of Light-Emitting Chip C According to First Exemplary Embodiment FIG. 16 illustrates a first modification of the light-emitting chip C according to the first exemplary embodiment and is an enlarged cross-sectional view of the island 301 in which the light-emitting diode LED1 and the driving thyristor S1 are stacked.

In the first modification of the first exemplary embodiment, the current constriction layer (a current constriction layer 85*b* in the first modification of the first exemplary embodiment) is provided in the p-anode layer 85 instead of the p-anode layer 81. That is, the p-anode layer 85 is constituted by a lower p-anode layer 85*a*, the current constriction layer 85*b*, and an upper p-anode layer 85*c*. The rest of the configuration is substantially the same as that of the light-emitting chip C according to the first exemplary embodiment.

The light-emitting chip C according to the first modification of the first exemplary embodiment is fabricated by modifying the fabrication method of the light-emitting chip C according to the first exemplary embodiment illustrated in FIGS. 10A to 12B. Specifically, the lower p-anode layer 85*a*, the current constriction layer 85*b*, and the upper p-anode layer 85*c* may be formed instead of the p-anode layer 85, and the current constriction layer 85*b* may be oxidized from the side faces thereof. Since this structure does not require etching to the light-emitting diode LED, the number of steps is reduced and the process becomes easier or a heat radiating property improves. Consequently, laser characteristics improve.

Figure 17:
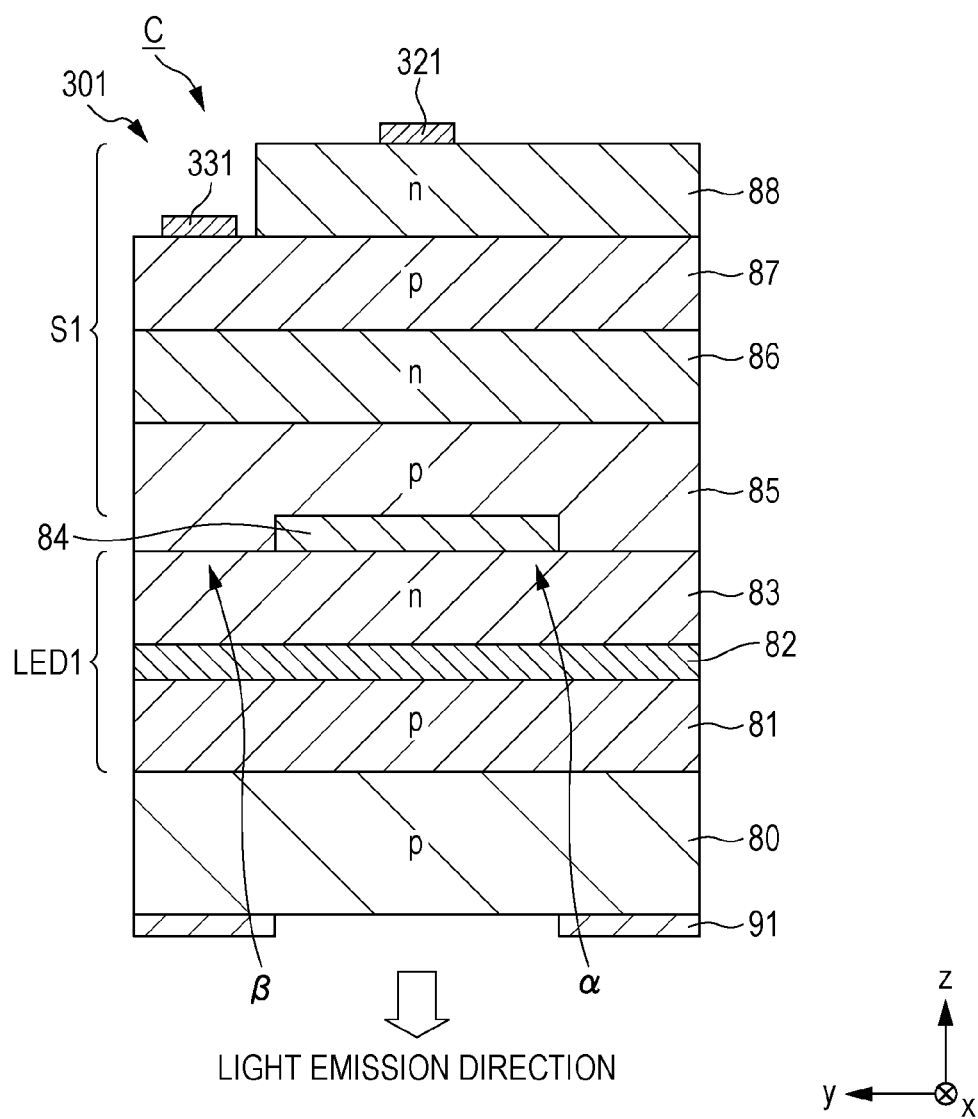
FIG. 17 illustrates a second modification of the light-emitting chip according to the first exemplary embodiment and is an enlarged cross-sectional view of the island in which the light-emitting diode and the driving thyristor are stacked.

Second Modification of Light-Emitting Chip C According to First Exemplary Embodiment FIG. 17 illustrates a second modification of the light-emitting chip C according to the first exemplary embodiment and is an enlarged cross-sectional view of the island 301 in which the light-emitting diode LED1 and the driving thyristor S1 are stacked.

In the second modification of the first exemplary embodiment, the light-transmission reduction layer 84 is disposed at a portion corresponding to the current passing portion α in place of the current constriction layer 81*b*. The rest of the configuration is substantially the same as that of the light-emitting chip C according to the first exemplary embodiment.

As described before, a current easily flows through the light-transmission reduction layer 84. In contrast, a current does not easily flow through a junction between the n-cathode layer 83 and the p-anode layer 85 without the light-transmission reduction layer interposed therebetween in a reverse-biased state in which breakdown does not occur.

However, if the light-transmission reduction layer 84 is provided at a portion corresponding to the current passing portion α, a current is concentrated at the central portion of the light-emitting diode LED.

The light-emitting chip C according to the second modification of the first exemplary embodiment is fabricated by modifying the fabrication method of the light-emitting chip C according to the first exemplary embodiment illustrated in FIGS. 10A to 12B. Specifically, the p-anode layer 81, the light-emitting layer 82, the n-cathode layer 83, and the light-transmission reduction layer 84 are sequentially stacked on the substrate 80 in FIG. 10A. Then, the light-transmission reduction layer 84 at a portion that serves as the current blocking portion β is removed, and the light-transmission reduction layer 84 at a portion that serves as the current passing portion α is left. Then, the p-anode layer 85 is stacked to surround the remaining light-transmission reduction layer 84. Then, the n-gate layer 86, the p-gate layer 87, and the n-cathode layer 88 are sequentially stacked. Note that the n-cathode layer 83 may surround the remaining light-transmission reduction layer 84 in place of the p-anode layer 85.

The light-emitting chip C according to the second modification of the first exemplary embodiment may be used when a semiconductor material for which application of steam oxidation is difficult is used.

Figure 18:
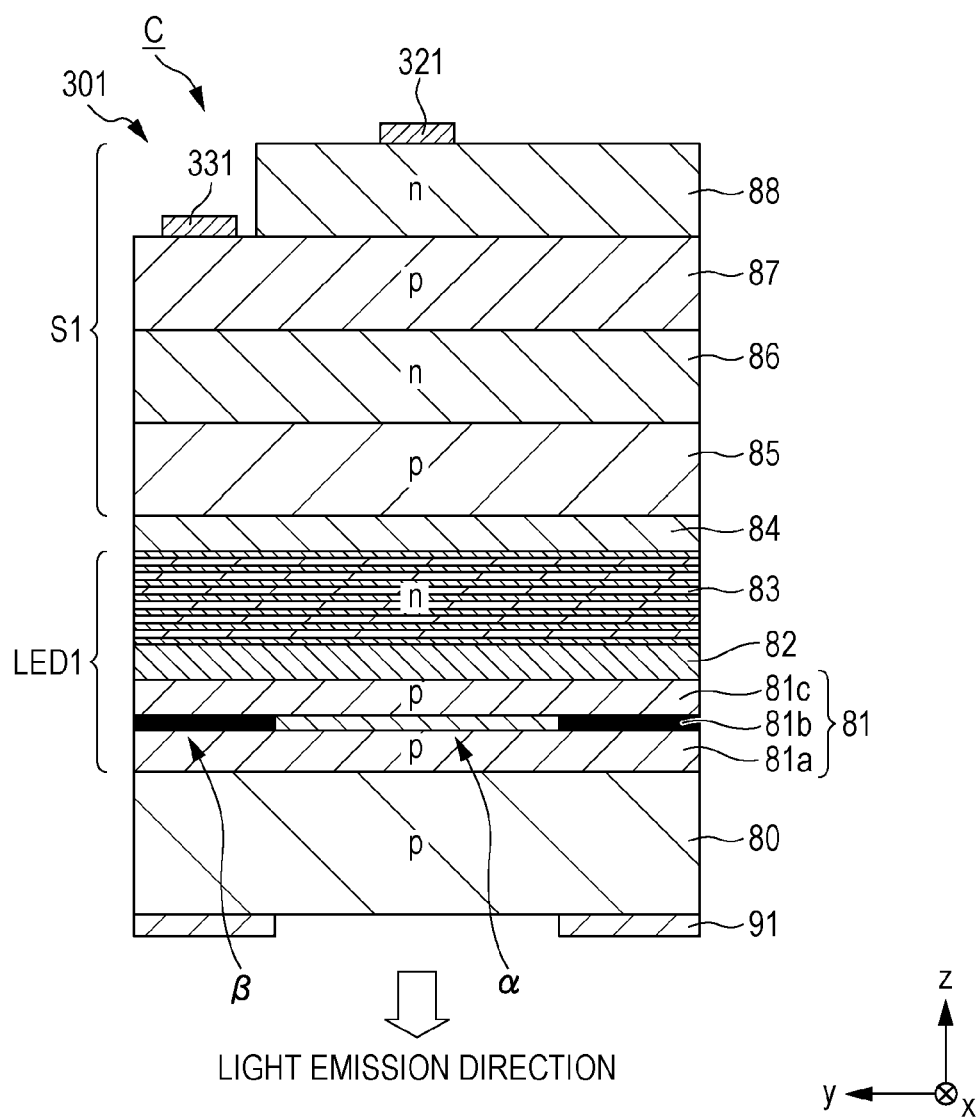
FIG. 18 illustrates a third modification of the light-emitting chip according to the first exemplary embodiment and is an enlarged cross-sectional view of the island in which the light-emitting diode and the driving thyristor are stacked.

Third Modification of Light-Emitting Chip C According to First Exemplary Embodiment FIG. 18 illustrates a third modification of the light-emitting chip C according to the first exemplary embodiment and is an enlarged cross-sectional view of the island 301 in which the driving thyristor S1 and the light-emitting diode LED1 are stacked.

In the third modification of the first exemplary embodiment, the n-cathode layer 83 is formed as a distributed Bragg reflector layer (hereinafter, referred to as a DBR layer). A DBR layer is constituted by stacking plural semiconductor layers with varying refractive index. A DBR layer reflects light emitted by the light-emitting diode LED. The rest of the configuration is substantially the same as that of the light-emitting chip C according to the first exemplary embodiment.

If a semiconductor material having a bandgap energy smaller than a bandgap energy equivalent to the wavelength of light emitted by the light-emitting diode LED is used for the light-transmission reduction layer 84, light that has reached the light-transmission reduction layer 84 is subjected to band-edge absorption, resulting in a loss. Thus, in the third modification of the first exemplary embodiment, a DBR layer is provided between the light-emitting layer 82 and the light-transmission reduction layer 84, and the light-transmission reduction layer 84 is provided at a position equivalent to the node of the standing wave caused in the DBR layer. Such a configuration greatly reduces band-edge absorption by a semiconductor material used for the light-transmission reduction layer 84.

A DBR layer is constituted by a combination of low refractive index layers with a high Al composition ratio, for example, $Al_{0.9}Ga_{0.1}As$, and high refractive index layers with a low Al composition ratio, for example, $Al_{0.2}Ga_{0.8}As$. Thicknesses (optical path lengths) of the low refractive index layers and the high refractive index layers are set to 0.25 (¼) of the center wavelength, for example. Note that the Al composition ratios of the low refractive index layers and the high refractive index layers may be changed within a range of 0 to 1.

The light-emitting chip C according to the third modification of the first exemplary embodiment is fabricated by changing the n-cathode layer 83 to the DBR layer in the fabrication method of the light-emitting chip C according to the first exemplary embodiment illustrated in FIG. 10A to 12B.

Figure 19:
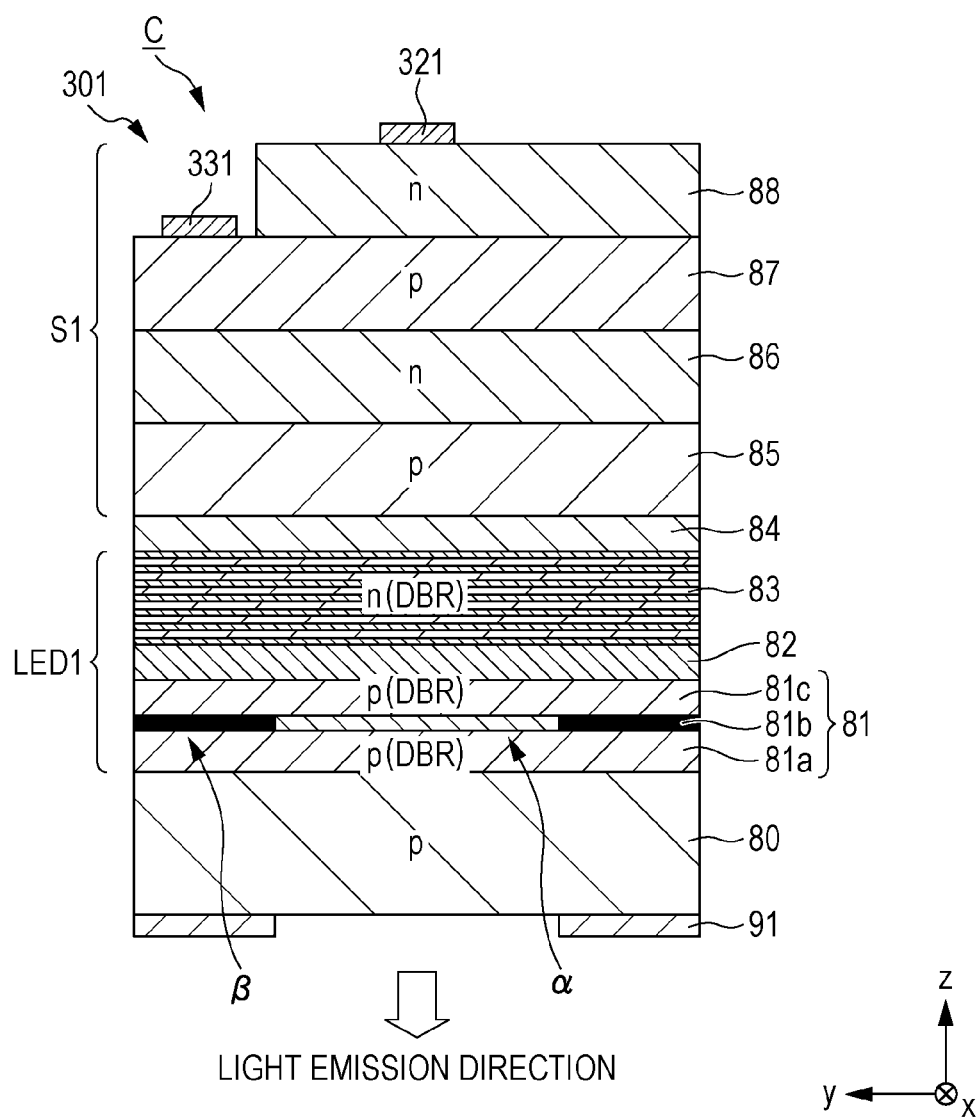
FIG. 19 illustrates a fourth modification of the light-emitting chip according to the first exemplary embodiment and is an enlarged cross-sectional view of the island in which the light-emitting diode and the driving thyristor are stacked.

Fourth Modification of Light-Emitting Chip C According to First Exemplary Embodiment FIG. 19 illustrates a fourth modification of the light-emitting chip C according to the first exemplary embodiment and is an enlarged cross-sectional view of the island 301 in which the light-emitting diode LED1 and the driving thyristor S1 are stacked.

In the fourth modification of the first exemplary embodiment, the light-emitting layer 82 is sandwiched by two DBR layers. Specifically, the p-anode layer 81 and the n-cathode layer 83 are formed as DBR layers. The p-anode layer 81 includes the current constriction layer 81*b*. That is, the p-anode layer 81 is constituted by the lower p-anode layer 81*a*, the current constriction layer 81*b*, and the upper p-anode layer 81*c* that are sequentially stacked, and the lower p-anode layer 81*a* and the upper p-anode layer 81*c* are formed as DBR layers.

Note that the lower p-anode layer 81*a*, the upper p-anode layer 81*c*, and the n-cathode layer 83 are sometimes referred to as a lower p-anode (DBR) layer 81*a*, an upper p-anode (DBR) layer 81*c*, and an n-cathode (DBR) layer 83, respectively.

The configuration of the DBR layers are substantially the same as that of the third modification of the first exemplary embodiment. Note that the thickness (optical path length) of the current constriction layer 81*b* in the p-anode (DBR) layer 81 is determined by the adopted structure. In the case where importance is placed on extraction efficiency and process reproducibility, the thickness (optical path length) of the current constriction layer 81*b* is desirably set to an integer multiple of the thickness (optical path length) of the low refractive index layers and the high refractive index layers constituting the DBR layer. The thickness is set to 0.75 (¾) of the center wavelength, for example. In the case of an odd multiple, the current constriction layer 81*b* is desirably sandwiched by a high refractive index layer and a high refractive index layer. In the case of an even multiple, the current constriction layer 81*b* is desirably sandwiched by a high refractive index layer and a low refractive index layer. That is, the current constriction layer 81*b* is desirably provided to suppress a disturbance in the period of the refractive index due to the DBR layer. Conversely, in the case where a reduction of the influences of an oxidized portion (in the refractive index and distortion) is desired, the thickness of the current constriction layer 81*b* is desirably set to several tens of nanometers (nm) and is desirably inserted at a portion corresponding to a node of a standing wave caused in the DBR layer.

The p-anode (DBR) layer 81 and the n-cathode (DBR) layer 83 reflect light emitted by the light-emitting layer 82 of the light-emitting diode LED. That is, the p-anode (DBR)

layer 81 and the n-cathode (DBR) layer 83 constitute a resonator (cavity), and the intensity of light emitted by the light-emitting layer 82 is increased by resonance before the light is output. That is, the driving thyristor S is stacked on a resonant cavity light-emitting diode LED in the fourth medication of the first exemplary embodiment.

The light-emitting chip C according to the fourth modification of the first exemplary embodiment is fabricated by partially modifying the fabrication method according to the first exemplary embodiment illustrated in FIGS. 10A to 12B. Specifically, the lower p-anode layer 81a and the upper p-anode layer 81c of the p-anode layer 81 and the n-cathode layer 83 are formed as DBR layers in the semiconductor stack formation step illustrated in FIG. 10A.

Figure 20:
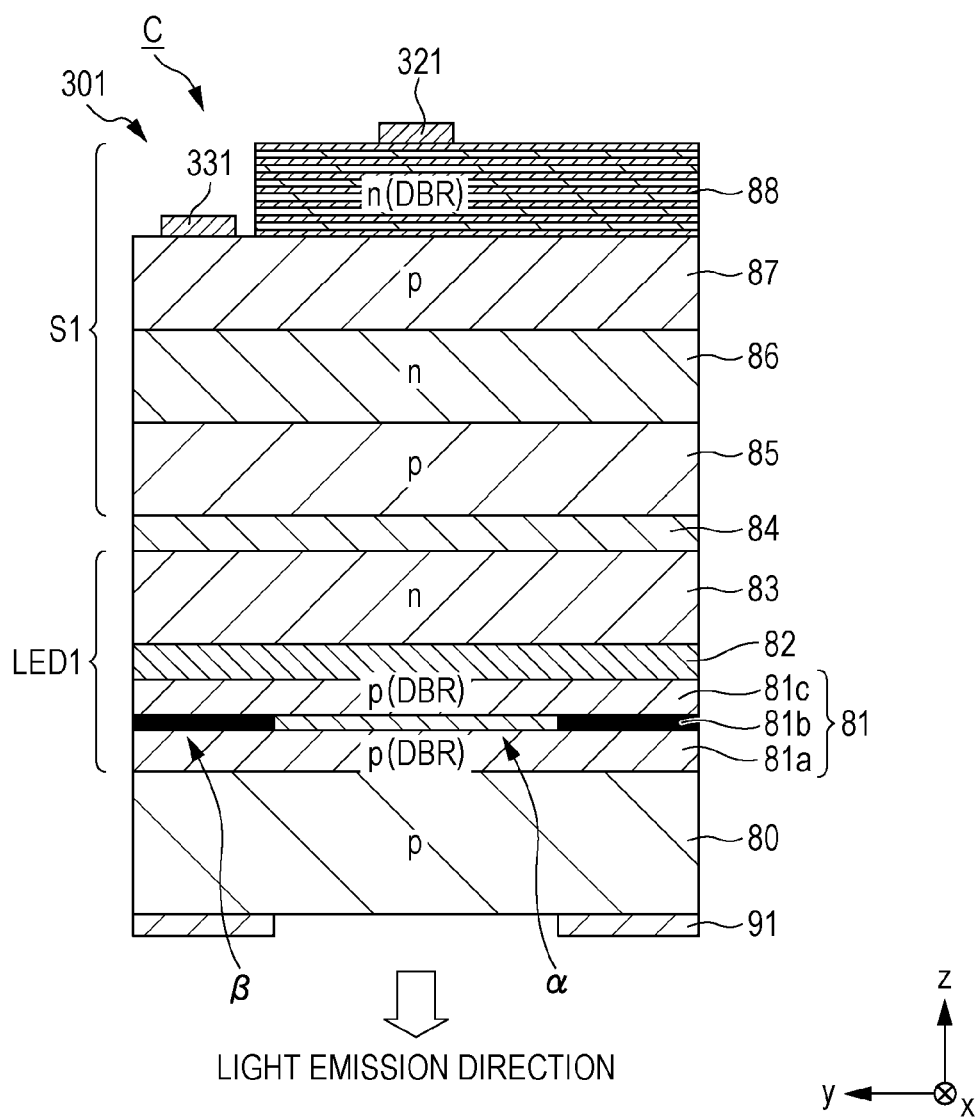
FIG. 20 illustrates a fifth modification of the light-emitting chip according to the first exemplary embodiment and is an enlarged cross-sectional view of the island in which the light-emitting diode and the driving thyristor are stacked.

Fifth Modification of Light-Emitting Chip C According to First Exemplary Embodiment FIG. 20 illustrates a fifth modification of the light-emitting chip C according to the first exemplary embodiment and is an enlarged cross-sectional view of the island 301 in which the light-emitting diode LED1 and the driving thyristor S1 are stacked.

In the fifth modification of the first exemplary embodiment, the n-cathode (DBR) layer 83 of the light-emitting chip C illustrated in FIG. 19 is formed as the n-cathode layer 83 that is not a DBR layer; instead, the n-cathode layer 88 is formed as a DBR layer. Thus, the n-cathode layer 88 is referred to as an n-cathode (DBR) layer 88. The rest of the configuration is substantially the same as that of the light-emitting chip C according to the first exemplary embodiment.

In the fifth modification of the first exemplary embodiment, the p-anode (DBR) layer 81 and the n-cathode (DBR) layer 88 constitute a resonator (cavity), and the intensity of light emitted by the light-emitting layer 82 is increased by resonance before the light is output. Note that this configuration is used when the light emitted by the light-emitting layer 82 passes through the light-transmission reduction layer 84.

The light-emitting chip C according to the fifth modification of the first exemplary embodiment is fabricated by partially modifying the fabrication method according to the first exemplary embodiment illustrated in FIGS. 10A to 12B. Specifically, the p-anode (DBR) layer 81 and the n-cathode (DBR) layer 88 are formed as DBR layers in the semiconductor stack formation step illustrated in FIG. 10A.

Since the light-transmission reduction layer 84 is provided in the light-emitting chips C according to the first exemplary embodiment and the modifications of the first exemplary embodiment, the intensity (amount) of light emitted by the driving thyristor S is reduced and mixing of the emission spectrum of the driving thyristor S to the emission spectrum of the light-emitting diode LED is suppressed.

In addition, since the current blocking portion β is provided at the circumferential portion of the light-emitting diode LED, a current concentrates at the current passing portion α. This reduces electric power consumed by non-radiative recombination, and consequently power consumption is reduced and light extraction efficiency improves.

Note that when the current constriction layer formed by oxidation is used, the current constriction layer may be provided in the n-cathode layer 83 of the light-emitting diode LED or in the p-anode layer 85 or the n-cathode layer 83 of the driving thyristor S. In addition, the light-transmission reduction layer 84 may be used in place of the current constriction layer formed by oxidation, as in the second modification (FIG. 17) of the first exemplary embodiment.

In addition, the driving thyristor S and the transfer thyristor T may additionally include the voltage reduction layer 89.

In addition, in the light-emitting chips C according to the first exemplary embodiment and the modifications of the first exemplary embodiment, the p-anode layer 81 and the n-cathode layer 83 of the light-emitting diode LED may be formed as cladding layers, and the light-emitting layer 82 may be sandwiched by the p-anode layer 81 and the n-cathode layer 83 that are cladding layers to cause laser oscillation. In this case, the light-emitting diode LED is a laser diode LD. The laser diode LD emits light in a direction parallel to the surface of the substrate 80.

Second Exemplary Embodiment

In the light-emitting chip C according to the first exemplary embodiment, the light-emitting diodes LED are used as light-emitting elements. A light-emitting chip C according to a second exemplary embodiment uses vertical-cavity surface-emitting lasers VCSEL as light-emitting elements.

The configuration of the light-emitting chip C is substantially the same as the configuration of the first exemplary embodiment except for a configuration in which the vertical-cavity surface-emitting lasers VCSEL (lower diodes UD) and the driving thyristors S (the transfer thyristors T) are stacked. That is, the light-emitting diodes LED (light-emitting diodes LED1 to LED128) are replaced with the vertical-cavity surface-emitting lasers VCSEL (vertical-cavity surface-emitting lasers VCSEL1 to VCSEL128). Thus, a description of the substantially the same part is omitted, and different part will be described.

Figure 21:
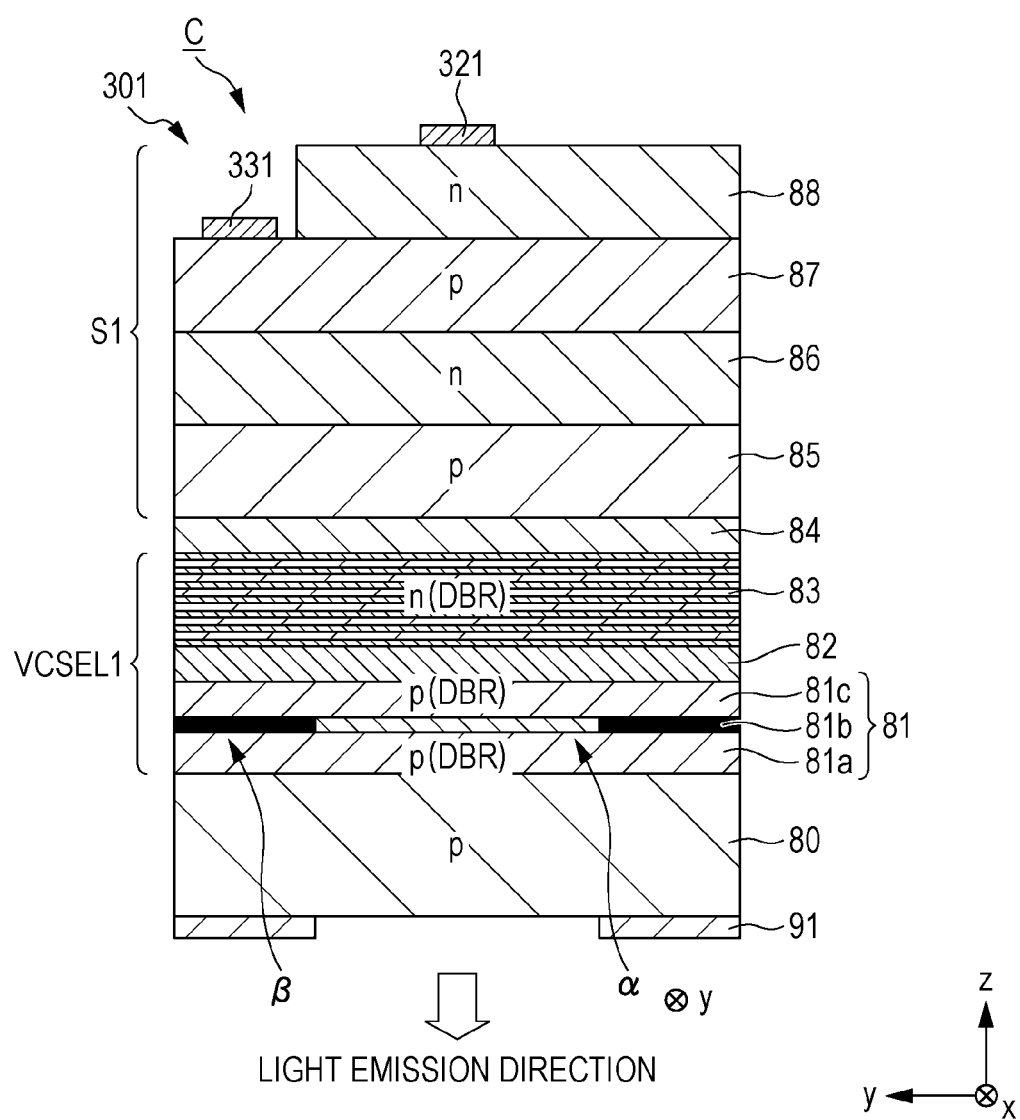
FIG. 21 is an enlarged cross-sectional view of an island in which a vertical-cavity surface-emitting laser and a driving thyristor are stacked in a light-emitting chip according to a second exemplary embodiment.

FIG. 21 is an enlarged cross-sectional view of the island 301 in which the vertical-cavity surface-emitting laser VCSEL and the driving thyristor S are stacked in the light-emitting chip C according to the second exemplary embodiment.

Since the basic configuration is substantially the same as that of the light-emitting chip C according to the fourth modification of the first exemplary embodiment illustrated in FIG. 19, a description thereof is omitted.

The vertical-cavity surface-emitting laser VCSEL resonates light at the light-emitting layer 82 sandwiched by two DBR layers (the p-anode (DBR) layer 81 and the n-cathode (DBR) layer 83) to cause laser oscillation. Laser oscillation occurs when the reflectance between the light-emitting layer 82 and the two DBR layers (the p-anode (p-DBR) layer 81 and the n-cathode (n-DBR) layer 83) becomes greater than or equal to 99%, for example.

Modifications of the light-emitting chip C according to the second exemplary embodiment will be described below. In the modifications described below, a description is given of a portion where the vertical-cavity surface-emitting laser VCSEL1 and the driving thyristor S1 are stacked in the island 301 of the light-emitting chip C; however, the same applies to other portions where the vertical-cavity surface-emitting laser VCSEL and the driving thyristor S are stacked and portions where the lower diodes UD and the transfer thyristor T are stacked. Since the rest of the configuration is substantially the same as that of the light-emitting chip C described above, a description of the substantially the same part is omitted. That is, different part will be described.

Figure 22:
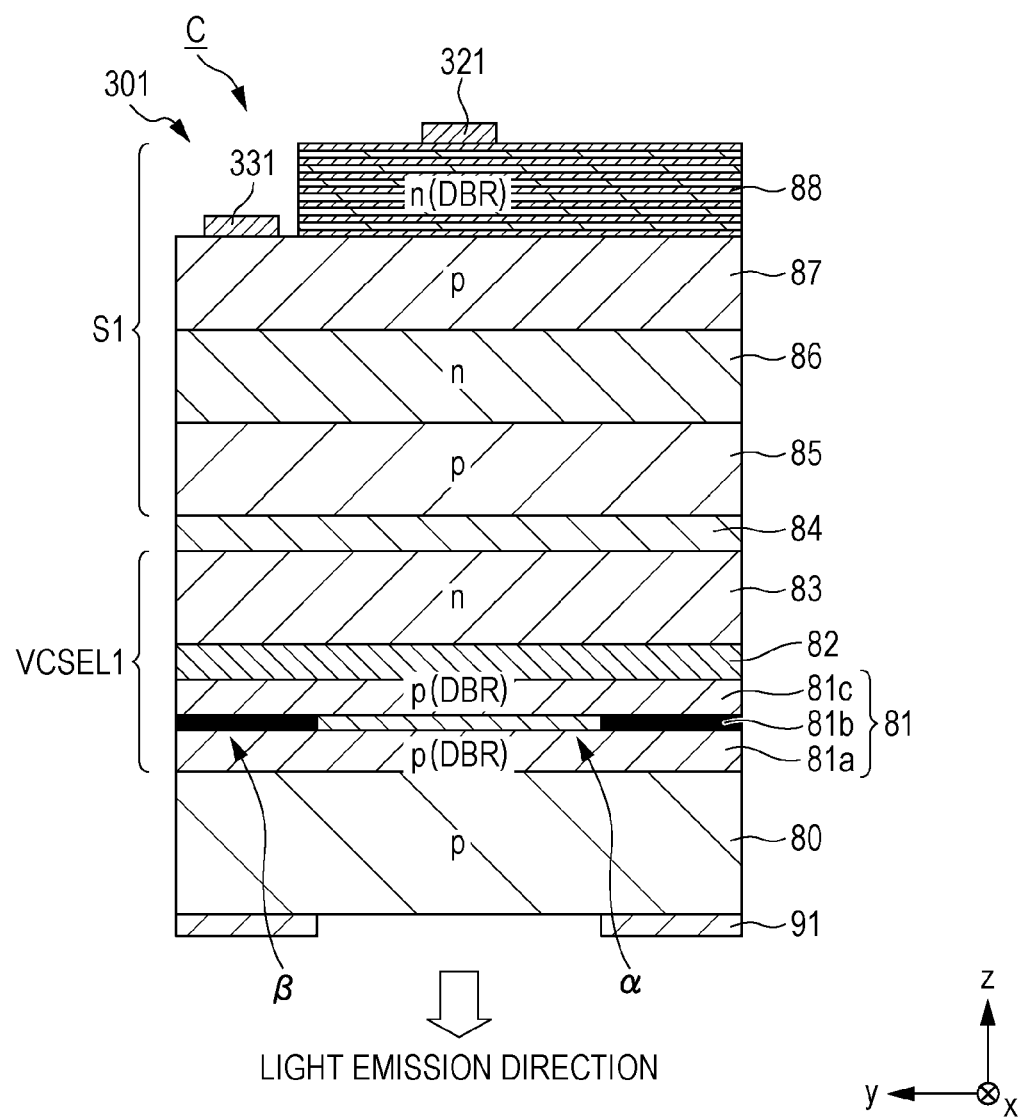
FIG. 22 illustrates a first modification of the light-emitting chip according to the second exemplary embodiment and is an enlarged cross-sectional view of the island in which the vertical-cavity surface-emitting laser and the driving thyristor are stacked.

First Modification of Light-Emitting Chip C According to Second Exemplary Embodiment FIG. 22 illustrates a first modification of the light-emitting chip C according to the second exemplary embodiment and is an enlarged cross-sectional view of the island 301 in which the vertical-cavity surface-emitting laser VCSEL and the driving thyristor S1 are stacked.

The basic configuration according to the first modification of the second exemplary embodiment is substantially the same as that of the light-emitting chip C according to the fifth modification of the first exemplary embodiment illustrated in FIG. 20, a description thereof is omitted.

The vertical-cavity surface-emitting laser VCSEL resonates light at the light-emitting layer 82 sandwiched by two DBR layers (the p-anode (DBR) layer 81 and the n-cathode (DBR) layer 88) to cause laser oscillation. Note that this configuration is used when light emitted by the light-emitting layer 82 passes through the light-transmission reduction layer 84.

Figure 23:
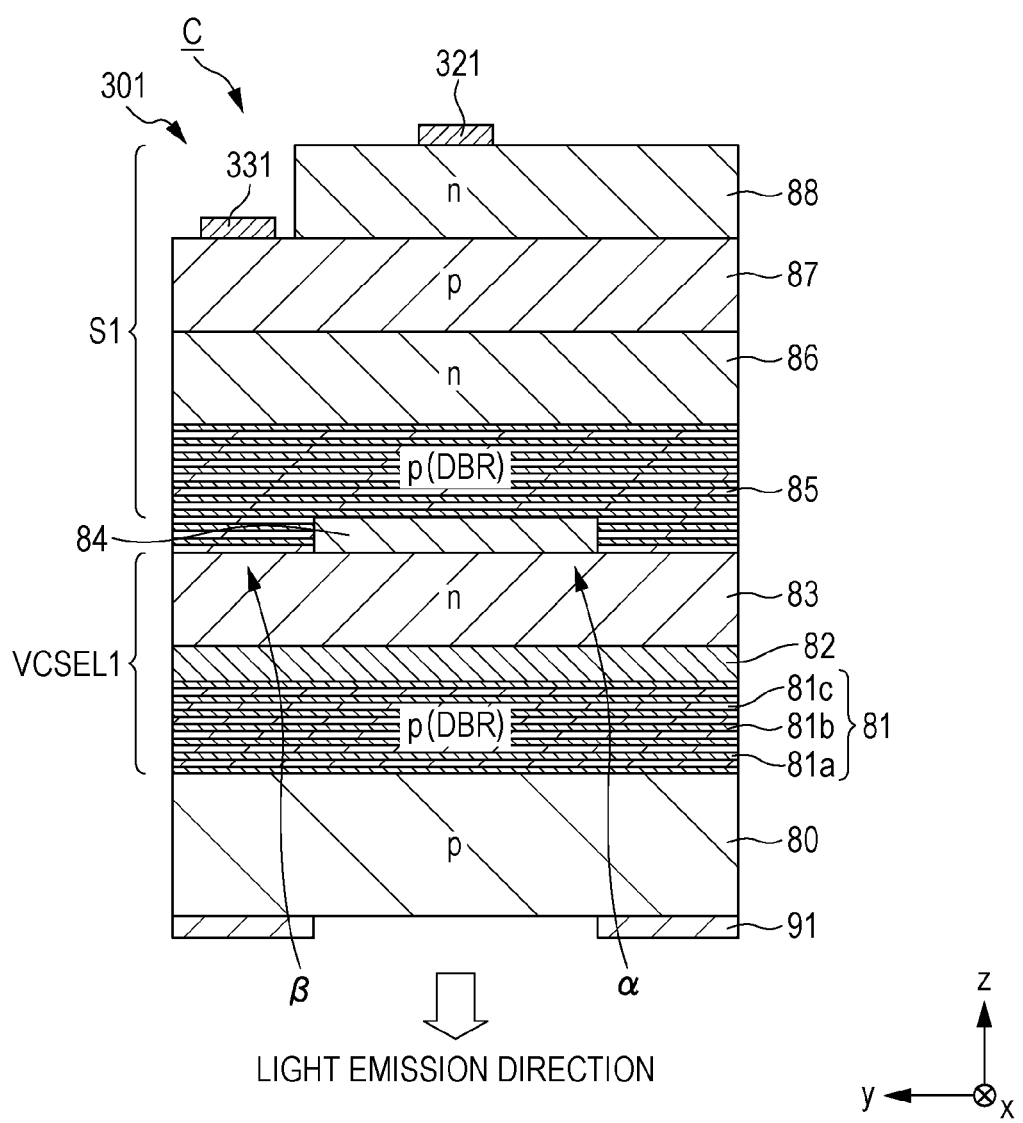
FIG. 23 illustrates a second modification of the light-emitting chip according to the second exemplary embodiment and is an enlarged cross-sectional view of the island in which the vertical-cavity surface-emitting laser and the driving thyristor are stacked.

Second Modification of Light-Emitting Chip C According to Second Exemplary Embodiment FIG. 23 illustrates a second modification of the light-emitting chip C according to the second exemplary embodiment and is an enlarged cross-sectional view of the island 301 in which the vertical-cavity surface-emitting laser VCSEL1 and the driving thyristor S1 are stacked.

Since the basic configuration according to the second modification of the second exemplary embodiment is substantially the same as that of the light-emitting chip C according to the second modification of the first exemplary embodiment illustrated in FIG. 17. Specifically, the p-anode layer 81 and the p-anode layer 85 are formed as DBR layers. Since the rest of the configuration is substantially the same as that of the second modification of the first exemplary embodiment, a description thereof is omitted.

The vertical-cavity surface-emitting laser VCSEL resonates light between the two DBR layers (the p-anode (DBR) layer 81 and the p-anode (DBR) layer 85) that sandwich the light-emitting layer 82 and the n-cathode layer 83 to cause laser oscillation. Note that this configuration is used when light emitted by the light-emitting layer 82 passes through the light-transmission reduction layer 84.

In addition, since the current constriction layer formed by oxidation is not used in the second modification of the second exemplary embodiment, the second modification of the second exemplary embodiment is suitably used for a semiconductor material on a substrate of InP, GaN, sapphire, or the like for which application of steam oxidation is difficult.

Since the light-transmission reduction layer 84 is provided in the light-emitting chips C according to the second exemplary embodiment and the modifications of the second exemplary embodiment, the intensity (amount) of light emitted by the driving thyristor S is reduced, and mixing of the emission spectrum of the driving thyristor S to the emission spectrum of the vertical-cavity surface-emitting layer VCSEL is suppressed.

In addition, since the current blocking portion β is provided at the circumferential portion of the vertical-cavity surface-emitting laser VCSEL, a current concentrates at the current passing portion α. This reduces electric power consumed by non-radiative recombination, and consequently power consumption reduces and light extraction efficiency improves.

When the current constriction layer formed by oxidation is used, the current constriction layer may be provided in the n-cathode layer 83 of the vertical-cavity surface-emitting laser VCSEL or in the p-anode layer 85 or the n-cathode layer 88 of the driving thyristor S.

In addition, the driving thyristor S and the transfer thyristor T may additionally include the voltage reduction layer 89.

Third Exemplary Embodiment

In the first and second exemplary embodiments, the transfer thyristor T is disposed on the lower diode UD, and the lower diode UD and the transfer thyristor T are connected in series. Accordingly, the potential "L" of the first transfer signal φ1 and the second transfer signal φ2 supplied to the transfer thyristor T is applied to the lower diode UD and the transfer thyristor T that are connected in series. Accordingly, the potential "L" is equal to −5 V.

In a third exemplary embodiment, the transfer thyristor T and the lower diode UD are not connected in series. Thus, the potential "L" of the first transfer signal φ1 and the second transfer signal φ2 supplied to the transfer thyristor T decreases and may be a potential applied across the anode and the cathode of the transfer thyristor T. The potential may be, for example, "L'" (−3.3 V).

The configuration of the third exemplary embodiment is substantially the same as that of the first exemplary embodiment except for the structure of the light-emitting chip C. Thus, a description of substantially the same part is omitted, and different part will be described.

Figure 24:
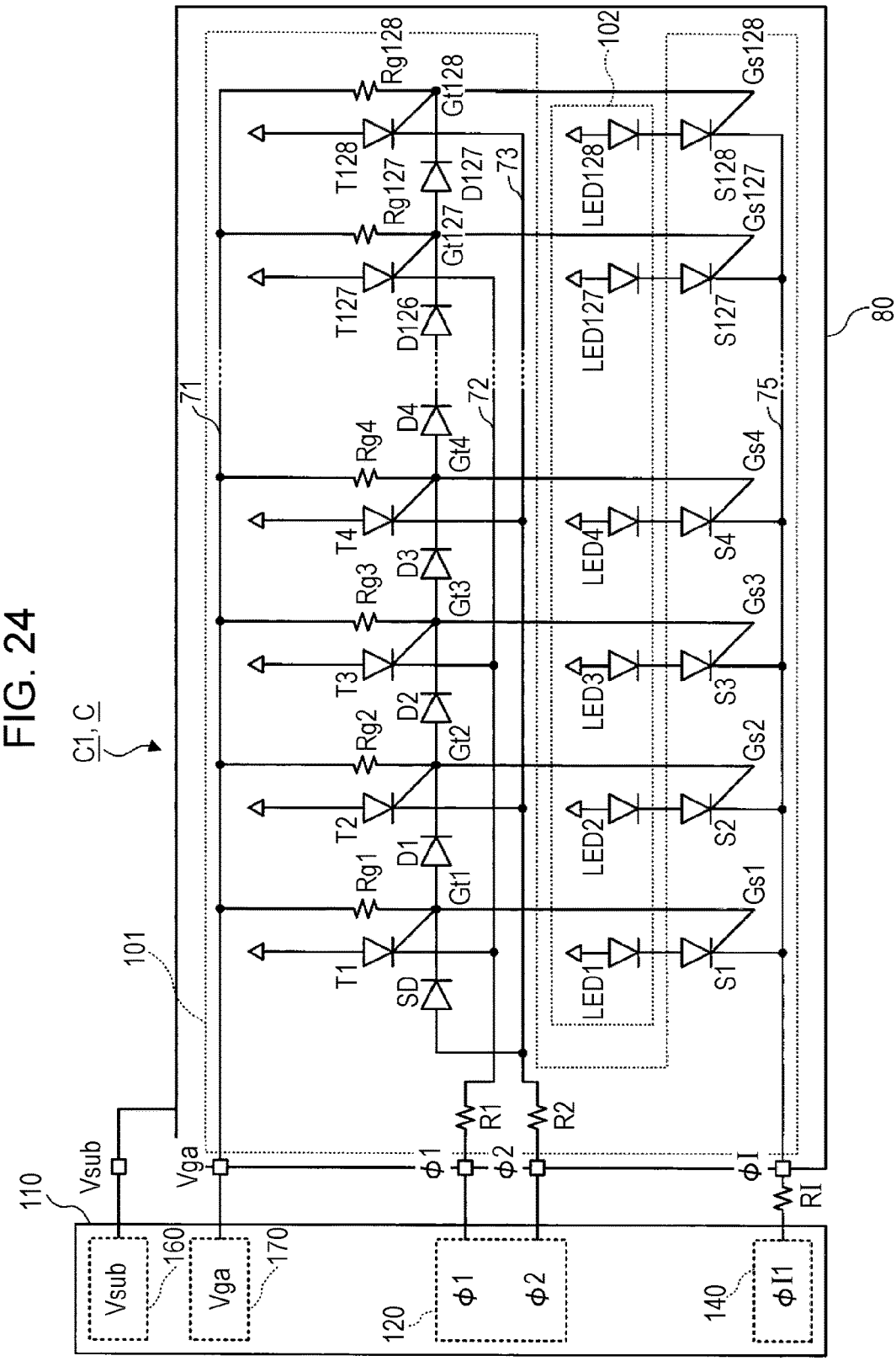
FIG. 24 is an equivalent circuit diagram illustrating a circuit configuration of a light-emitting chip in which an SLED array according to a third exemplary embodiment is mounted.

FIG. 24 is an equivalent circuit diagram illustrating a circuit configuration of a light-emitting chip C in which a self-scanning light-emitting device (SLED) array according to the third exemplary embodiment is mounted.

The light-emitting chip C1(C) includes the light-emitting unit 102 (see FIG. 4A) constituted by the light-emitting diodes LED1 to LED128. The light-emitting chip C1(C) includes the driving unit 101 constituted by the driving thyristor S1 to S128, the transfer thyristors T1 to T128, the coupling diodes D1 to D127, the power supply line registers Rg1 to Rg128, the start diode SD, and the current-limiting resistors R1 and R2.

That is, as illustrated in FIG. 24, the light-emitting chip C according to the third exemplary embodiment does not include the lower diodes UD1 to UD128 that are included in the light-emitting chip C according to the first exemplary embodiment illustrated in the equivalent circuit diagram of FIG. 5.

Figure 25:
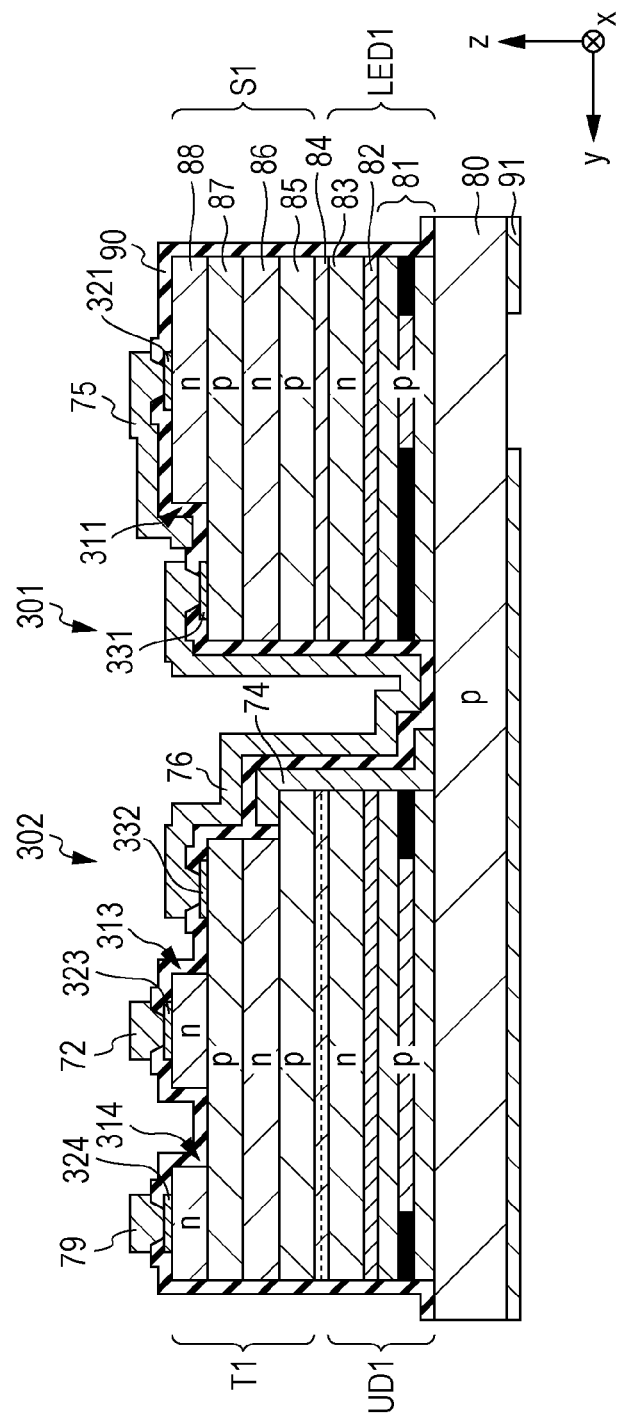
FIG. 25 is a cross-sectional view of islands of the light-emitting chip according to the third exemplary embodiment.

FIG. 25 is a cross-sectional view of the islands 301 and 302 of the light-emitting chip C according to the third exemplary embodiment.

The plan layout of the light-emitting chip C according to the third exemplary embodiment is substantially the same as that of the light-emitting chip C according to the first exemplary embodiment illustrated in FIG. 6A. Thus, a description thereof is omitted.

The cross-section of the islands 301 and 302 of the light-emitting chip C according to the third exemplary embodiment illustrated in FIG. 25 is a cross-section taken along line VIB-VIB in FIG. 6A but is viewed from the side (−X direction) opposite to the side illustrated in FIG. 6B.

As illustrated in FIG. 25, the p-anode layer 85 of the transfer thyristor T1 and the p-type substrate 80 are connected to each other by a connection wire 74 in the island 302 of the light-emitting chip C according to the third exemplary embodiment. The connection wire 74 is formed of Zn-containing Au (AuZn) that easily forms an ohmic contact with the p-type semiconductor layer.

With such a configuration, the potential of the p-anode layer 85 of the transfer thyristor T1 is set to the reference potential Vsub ("H" (0 V)) that is supplied to the back-surface electrode 91 of the substrate 80.

In addition, the side faces of the p-anode layer 81, the light-emitting layer 82, and the n-cathode layer 83 of the lower diode UD1 located under the transfer thyristor T1 are short-circuited by the connection wire 74. With this configuration, the lower diode UD1 is present but does not operate. Note that the entire side faces of the island 302 may be covered with the protection layer 90.

The connection wire 74 is configured to short-circuit at least the light-emitting layer 82. For example, one end of the connection wire 74 may be connected to the n-cathode layer 83. Since a current flows from the connection wire 74 to the transfer thyristor T through the n-cathode layer 83 and the light-transmission reduction layer 84, the current does not flow through the lower diode UD (from the n-cathode layer 83 to the light-emitting layer 82 and the p-anode layer 81) and the lower diode UD does not consume any electric power. This is true when the connection wire 74 is connected to part of the light-transmission reduction layer 84. In addition, the other end of the connection wire 74 may be connected to the p-anode layer 81 instead of directly connecting to the substrate 80.

Figure 26:
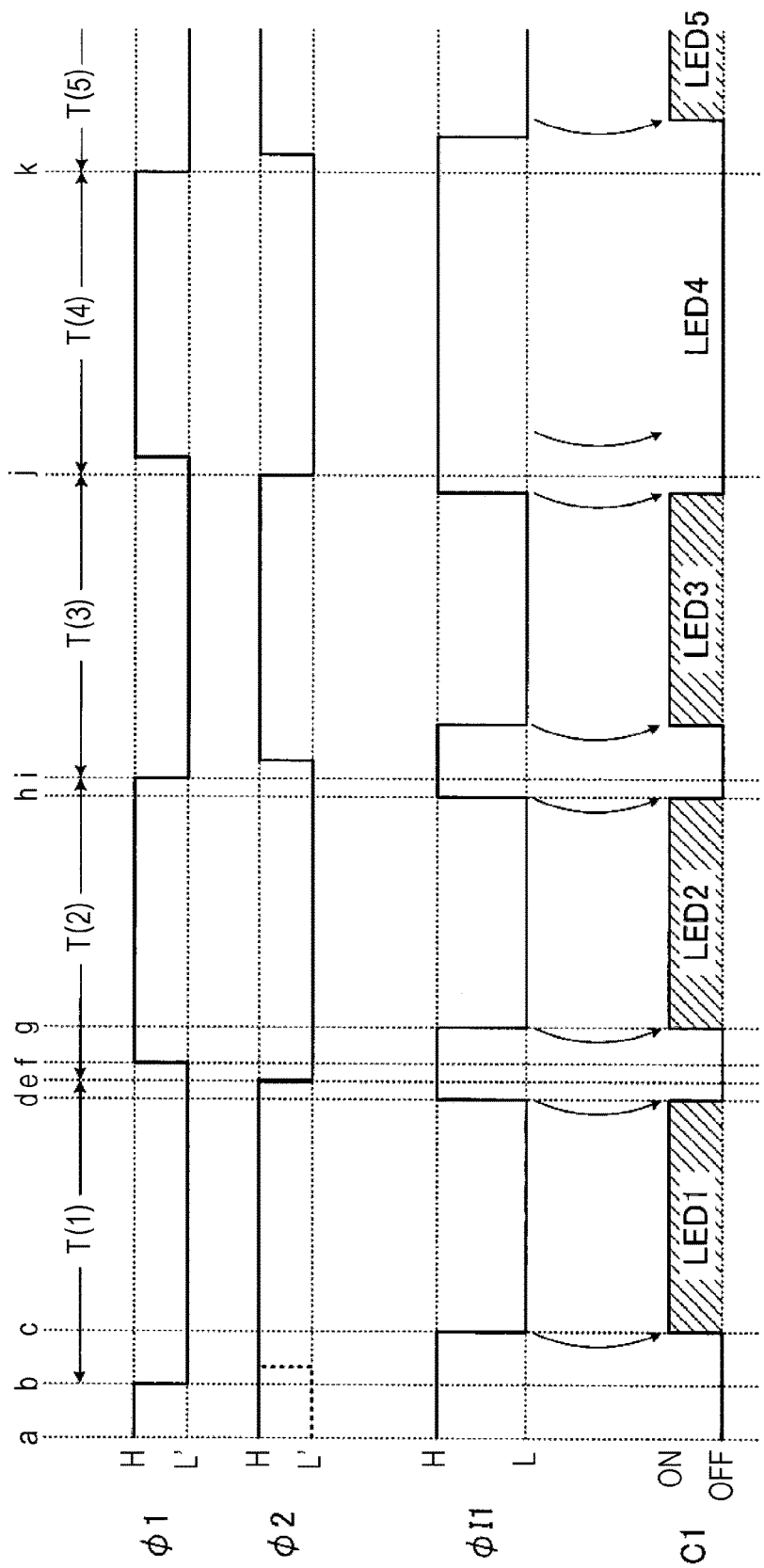
FIG. 26 is a timing chart describing an operation of the light-emitting chip according to the third exemplary embodiment.

FIG. 26 is a timing chart describing an operation of the light-emitting chip C according to the third exemplary embodiment.

In FIG. 26, the potential "L" of the first transfer signal φ1 and the second transfer signal φ2 in the timing chart describing the operation of the light-emitting chip C according to the first exemplary embodiment in FIG. 9 is changed to "L'". As described before, the first transfer signal φ1 and the second transfer signal φ2 are applied across the anode and the cathode of the transfer thyristor T. Thus, the first transfer signal φ1 and the second transfer signal φ2 used in the light-emitting chip C according to the third exemplary embodiment may have a voltage whose absolute value is smaller than that of the first transfer signal φ1 and the second transfer signal φ2 of the light-emitting chip C according to the first exemplary embodiment. That is, the voltage (1.7 V in this example) applied to the lower diode UD1 is no longer used. In this example, the potential "L'" is equal to −3.3 V. As for the operation of the light-emitting chip C, the potential "L" (−5 V) of the first transfer signal φ1 and the second transfer signal φ2 is changed to "L'" (−3.3 V) and the operation of the lower diode UD is ignored.

The voltage of the first transfer signal φ1 and the second transfer signal φ2 used for the operation is reduced, and consequently power consumption is reduced.

First Modification of Light-Emitting Chip C According to Third Exemplary Embodiment A first modification of the light-emitting chip C according to the third exemplary embodiment will be described below. In the modification described below, the islands 301 and 302 are different from those of the light-emitting chip C according to the third exemplary embodiment illustrated in FIG. 25. Since the rest of the configuration is substantially the same as that of the light-emitting chip C described above, a description of substantially the same part is omitted. That is, different part will be described.

Figure 27:
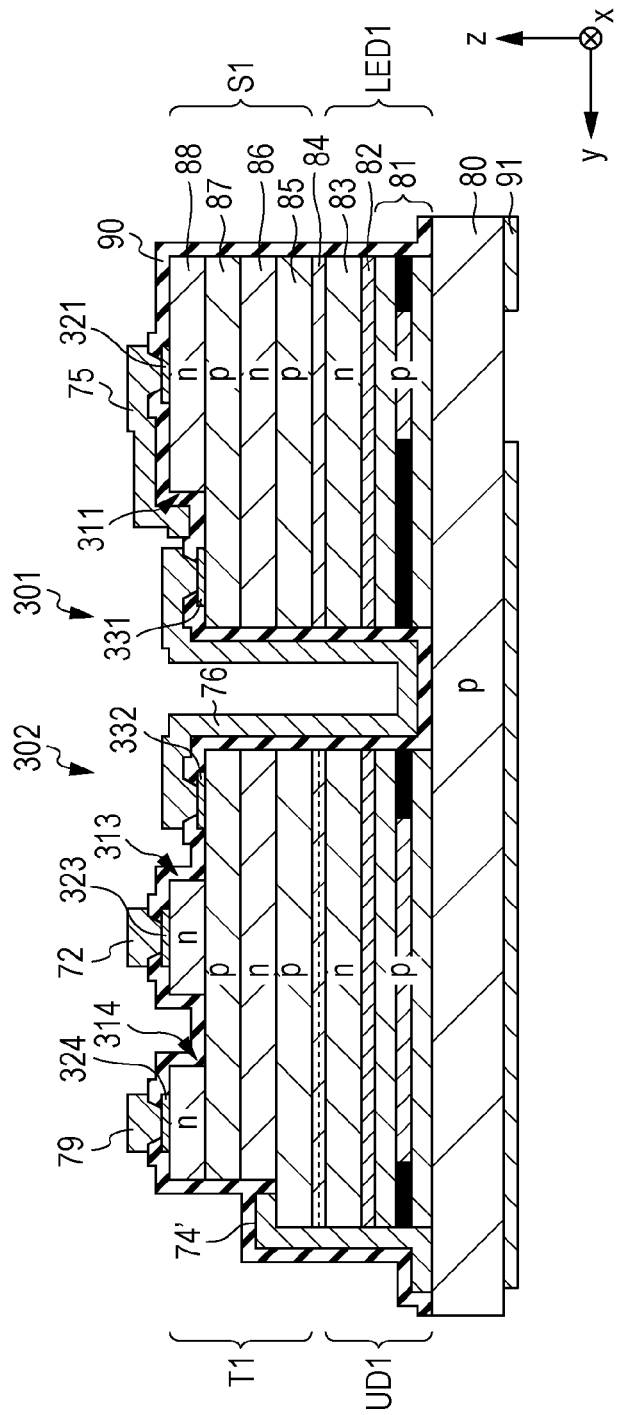
FIG. 27 is an enlarged cross-sectional view of the islands of the light-emitting chip C according to a first modification of the third exemplary embodiment.

FIG. 27 is an enlarged cross-sectional view of the islands 301 and 302 of the light-emitting chip C according to the first modification of the third exemplary embodiment. In the first modification of the third exemplary embodiment, a connection wire 74' is disposed at the end portion of the island 302 in the y direction. Such a configuration reduces a possibility of the connection wire 74 and the connection wire 76 being short-circuited as in the light-emitting chip C (FIG. 25) according to the third exemplary embodiment. Note that the state in which the connection wire 74' is disposed at the end portion in the y direction is an example in which the connection wire 74' and the connection wire 76 do not overlap with the protection layer 90 interposed therebetween. Specifically, the connection wire 74' is disposed at a place where the connection wire 74' and the connection wire 76 do not overlap with the protection layer 90 interposed therebetween (on the −x direction side or on the x direction side of the island 302). That is, the connection wire 74' may be disposed at a blank space in the plan layout of the light-emitting chip C illustrated in FIG. 6A.

In particular, portions near the first transfer signal line 72 or the second transfer signal line 73 or portions under the first transfer signal line 72 or the second transfer signal line 73 in the plan layout view of FIG. 6A are used only for disposing these signal lines and the semiconductor regions thereunder are not used. Thus, the connection wire 74' is desirably disposed at the portion near or under the first transfer signal line 72 or the second transfer signal line 73 since the size of the chip is not increased and the circuit configuration is not changed. For example, for the odd-numbered transfer thyristors T1, T3, ..., the connection wire 74 or 74' is disposed between the transfer thyristors T1, T3, ..., and the second transfer signal line 73 or under the second transfer signal line 73. For the even-numbered transfer thyristors T2, T4, ..., the connection wire 74 or 74' is disposed between the transfer thyristors T2, T4, ... and the first transfer signal line 72 or under the first transfer signal line 72.

The configuration of the light-emitting chip C according to the third exemplary embodiment may be used in the light-emitting chips C according to the first and second exemplary embodiments.

In the first to third exemplary embodiments, the description has been given by using the light-emitting diodes LED, the laser diodes LD, and the vertical-cavity surface-emitting lasers VCSEL as light-emitting elements; however, other light-emitting elements may be used. For example, the light-emitting elements may be laser transistors having the anode terminal, the cathode terminal, and the control terminal that controls on/off of laser oscillation or the intensity of laser light. In addition, the light-transmission reduction layer may be used for a component other than a light-emitting component including a combination of a light-emitting element and a thyristor. For example, the light-transmission reduction layer that suppresses transmission of light emitted by the light-emitting transistor may be disposed between a light-emitting element and a light-emitting transistor that drives the light-emitting element. Specifically, a light-emitting component including a light-emitting element disposed on a substrate, a driving element that is disposed on the light-emitting element and that drives the light-emitting element, and a light-transmission reduction layer that is disposed between the light-emitting element and the driving element and that suppresses transmission of light emitted by the driving element may be used. This light-emitting component may be used in combination with another circuit, or plural light-emitting components may be integrated into a new light-emitting component.

The self-scanning light-emitting device (SLED) array according to the first to third exemplary embodiments includes the light-emitting unit 102 including the light-emitting elements (the light-emitting diodes LED, the laser diodes LD, or the vertical-cavity surface-emitting lasers VCSEL) and the driving unit 101 including the driving thyristors S, the lower diodes UD, and the transfer thyristors T, for example; however, the driving unit 101 may further include control thyristors disposed between the driving thyristors S and the transfer thyristors T. Further, other components such as diodes or resistors may be further included.

In addition, the transfer thyristors T are connected to each other by the respective coupling diodes D. However, the transfer thyristors T may be connected to each other by respective members capable of transferring a change in the potential, such as resistors.

In addition, instead of the light-emitting elements (the light-emitting diodes LED, the laser diodes LD, or the vertical-cavity surface-emitting lasers VCSEL) and the driving thyristors S, the lower diodes UD may be used as the light-emitting elements (the light-emitting diodes LED, the laser diodes LD, or the vertical-cavity surface-emitting lasers VCSEL) and the first transfer signal φ1 and the second transfer signal φ2 supplied to the transfer thyristors T may be superimposed onto the turn-on signal φI. Such a configuration reduces the number of elements used and makes the light-emitting chip C more compact. In this case, elements such as the transfer thyristors T except for the light-emitting elements constitute the driving unit 101.

In the first to third exemplary embodiments, the conductivity types of the light-emitting elements (the light-emitting diodes LED, the laser diodes LD, and the vertical-cavity surface-emitting lasers VCSEL) and of the driving thyristors S, the lower diodes UD, and the transfer thyristors T may be reversed, and the polarity of the circuit may be changed. That is, the anode-common circuit may be changed to a cathode-common circuit; conversely, the cathode-common circuit may be changed to the anode-common circuit.

To reduce light emission delay and relaxation oscillation at the time of turn-on of the light-emitting elements (the light-emitting diodes LED, the laser diodes LD, and the vertical-cavity surface-emitting lasers VCSEL), a small current that is greater than or equal to a threshold current may be caused to flow through the light-emitting elements in advance to set the light-emitting elements in a light-emitting state or an oscillation-state. That is, the light-emitting elements may be caused to emit weak light before the respective driving thyristors S turn on, and the amount of light emitted by the light-emitting elements may be increased when the respective driving thyristors S turn on so that a predetermined amount of light is emitted. Examples of such a configuration may include the following. For example, an electrode is formed at the anode layer of each light-emitting element (the light-emitting diode LED, the laser diode LD, or the vertical-cavity surface-emitting laser VCSEL). A voltage or current source may be connected to this electrode, and a weak current may be supplied to the light-emitting element from this voltage or current source before the driving thyristor S turns on.

In addition, the transfer thyristors T and the driving thyristors S used in each of the exemplary embodiments may have a structure other than the pnpn four-layer structure as long as the structure implements functions of the transfer thyristors T and the driving thyristors S in the exemplary embodiment. For example, the transfer thyristors T and the driving thyristors S may have a pinin structure, a pipin structure, an npip structure, or a pnin structure having properties of the thyristors. In this case, one of the i-layer, the n-layer, and i-layer sandwiched by the p-layer and the n-layer in the pinin structure and one of the n-layer and the i-layer sandwiched by the p-layer and the n-layer in the pnin structure may serve as a gate layer, and the n-ohmic electrode disposed on the gate layer may serve as the terminal of the gate Gt (gate Gs). Alternatively, one of the i-layer, the p-layer, and the i-layer sandwiched by the p-layer and the p-layer in the npip structure and one of the p-layer and the i-layer sandwiched by the n-layer and the p-layer in the npip structure may serve as the gate layer and the p-ohmic electrode 332 disposed on the gate layer may serve as the terminal of the gate Gt (gate Gs).

Further, the semiconductor structure in which plural semiconductor layers constituting a thyristor and plural semiconductor layers constituting a light-emitting element are stacked with one or more semiconductor layers constituting a light-transmission reduction layer interposed therebetween in accordance with each of the exemplary embodiments is usable for a component other than the self-scanning light-emitting device (SLED) array. For example, the semiconductor structure is usable as a single light-emitting component that includes a single light-emitting element (such as the light-emitting diode LED, the laser diode LD, or the vertical-cavity surface-emitting laser VCSEL) and the driving thyristor S stacked on the light-emitting element and that turns on in response to input of an electric signal or optical signal from the outside. In this case, the light-emitting element constitutes the light-emitting unit 102, and the driving thyristor S constitutes the driving unit 101.

The above description has been given mainly of the case where the substrate 80 is formed of p-type GaAs by way of example. An example of semiconductor layers (of a semiconductor stack formed in the semiconductor stack formation step in FIG. 10A) when a substrate of another type is used will be described.

First, an example of the semiconductor stack in the case where a GaN substrate is used is as described below.

The p-anode layer 81 is formed of p-type $Al_{0.9}GaN$ with an impurity concentration of $1\times10^{18}/cm^3$, for example. The Al composition ratio may be changed within a range of 0 to 1.

Since it is difficult to use an oxidized constriction layer as the current constriction layer on the GaN substrate, a desirable structure is those illustrated in FIGS. 17 and 23 in which the light-transmission reduction layer is used as the current constriction layer. Alternatively, it is effective to use ion implantation as a current constriction method.

The light-emitting layer 82 has a quantum well structure in which well layers and barrier layers are alternately stacked. The well layers are formed of GaN, InGaN, or AlGaN, for example, and the barrier layers are formed of AlGaN or GaN, for example. The light-emitting layer 82 may have a quantum wire structure or a quantum dot structure.

The n-cathode layer 83 is formed of n-type $Al_{0.9}GaN$ with an impurity concentration of $1\times10^{18}/cm^3$, for example. The Al composition ratio may be changed within a range of 0 to 1.

When the light-transmission reduction layer 84 is constituted by the $n^{++}$-layer 84a doped with an n-type impurity at a high concentration and the $p^{++}$-layer 84b doped with a p-type impurity at a high concertation (see FIG. 10A), examples of the combination of the $n^{++}$-layer 84a and the $p^{++}$-layer 84b (hereinafter, referred to as the $n^{++}$-layer 84a/the $p^{++}$-layer 84b) include $n^{++}GaN/p^{++}GaN$, $n^{++}GaInN/p^{++}GaInN$, and $n^{++}AlGaN/p^{++}AlGaN$. Note that the combinations may be interchanged.

The p-anode layer 85 is formed of p-type $Al_{0.9}GaN$ with an impurity concentration of $1\times10^{18}/cm^3$, for example. The Al composition ratio may be changed within a range of 0 to 1.

The n-gate layer 86 is formed of n-type $Al_{0.9}GaN$ with an impurity concentration of $1\times10^{17}/cm^3$, for example. The Al composition ratio may be changed within a range of 0 to 1.

The p-gate layer 87 is formed of p-type $Al_{0.9}GaN$ with an impurity concentration of $1\times10^{17}/cm^3$, for example. The Al composition ratio may be changed within a range of 0 to 1.

The n-cathode layer 88 is formed of n-type $Al_{0.9}GaN$ with an impurity concentration of $1\times10^{18}/cm^3$, for example. The Al composition ratio may be changed within a range of 0 to 1.

An example of the semiconductor stack in the case where an InP substrate is used is as described below.

The p-anode layer 81 is formed of p-type InGaAsP with an impurity concentration of $1\times10^{18}/cm^3$, for example. The Ga composition ratio may be changed within a range of 0 to 1.

Since it is difficult to use an oxidized constriction layer as the current constriction layer on the InP substrate, a desirable structure is those illustrated in FIGS. 17 and 23 in which the light-transmission reduction layer is used as the current constriction layer. Alternatively, it is effective to use ion implantation as a current constriction method.

The light-emitting layer 82 has a quantum well structure in which well layers and barrier layers are alternately stacked. The well layers are formed of InAs, InGaAsP, AlGaInAs, or GaInAsPSb, for example, and the barrier layers are formed of InP, InAsP, InGaAsP, or AlGaInAsP, for example. Note that the light-emitting layer 82 may have a quantum wire structure or a quantum dot structure.

The n-cathode layer 83 is formed of n-type InGaAsP with an impurity concentration of $1\times10^{18}/cm^3$, for example. The Ga composition ratio may be changed within a range of 0 to 1.

When the light-transmission reduction layer 84 is constituted by the $n^{++}$-layer 84a doped with an n-type impurity at a high concentration and the $p^{++}$-layer 84b doped with a p-type impurity at a high concertation (see FIG. 10A), examples of the combination of the $n^{++}$-layer 84a and the $p^{++}$-layer 84b (hereinafter, referred to as the $n^{++}$-layer 84a/the $p^{++}$-layer 84b) include $n^{++}InP/p^{++}InP$, $n^{++}InAsP/p^{++}InAsP$, $n^{++}InGaAsP/p^{++}InGaAsP$, and $n^{++}InGaAsPSb/p^{++}INGaAsPSb$. Note that the combinations may be interchanged.

The p-anode layer 85 is formed of p-type InGaAsP with an impurity concentration of $1\times10^{18}/cm^3$, for example. The Ga composition ratio may be changed within a range of 0 to 1.

The n-gate layer 86 is formed of n-type InGaAsP with an impurity concentration of $1\times10^{17}/cm^3$, for example. The Ga composition ratio may be changed within a range of 0 to 1.

The p-gate layer 87 is formed of p-type InGaAsP with an impurity concentration of $1\times10^{17}/cm^3$, for example. The Ga composition ratio may be changed within a range of 0 to 1.

The n-cathode layer 88 is formed of n-type InGaAsP with an impurity concentration of $1\times10^{18}/cm^3$, for example. The Ga composition ratio may be changed within a range of 0 to 1.

These semiconductor layers are stacked using MOCVD or MBE, for example. Consequently, the semiconductor stack is formed.

In addition, the exemplary embodiments described above may be applied to p-type, n-type, and i-type layers formed of organic materials.

Further, each of the exemplary embodiments may be used in combination with another exemplary embodiment. Various modifications may be made without departing from the essence of the present invention.

In each of the exemplary embodiments, the cases where the light-emitting chips are used in a printhead and in an image forming apparatus that uses the printhead have been described. However, the light-emitting chips may be used in a light-emitting device other than these devices. For example, the light-emitting chips may be used in a light-emitting device for a projector or a three-dimensional printer or in a light-emitting device used for object shape recognition or distance measurement. In the cases where the light-emitting chips are used for these applications, a line of light emitted from the light-emitting chips may be reflected in a direction crossing this line. That is, light emitted from the light-emitting chips arranged in a line in the main scanning direction may be reflected in a sub-scanning direction crossing the line, so that the light is emitted two dimensionally. A polygon mirror, a micro electro mechanical systems (MEMS) mirror, or the like may be used as a reflector. In addition, in the case where light is emitted from the light-emitting chips two dimensionally, the light may be emitted only through an optical system, such as a lens, without using the reflector.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
   a substrate;
   a light-emitting element disposed on the substrate;
   a thyristor that causes the light-emitting element to emit light or causes an amount of light emitted by the light-emitting element to increase, upon entering an on-state; and
   a light-transmission reduction layer that is disposed between the light-emitting element and the thyristor such that the light-emitting element and the thyristor are stacked, the light-transmission reduction layer being at least one semiconductor layer and being configured to suppress light from the thyristor to the light-emitting element, wherein the light-transmission reduction layer is disposed on the light-emitting element and the thyristor is disposed on the light-transmission reduction layer.

2. The light-emitting component according to claim 1, wherein the light emitted by the light-emitting element and the light emitted by the thyristor have different wavelengths.

3. The light-emitting component according to claim 1, wherein the light-transmission reduction layer includes a semiconductor layer having a bandgap energy smaller than a bandgap energy equivalent to the light emitted by the thyristor.

4. The light-emitting component according to claim 2, wherein the light-transmission reduction layer includes a semiconductor layer having a bandgap energy smaller than a bandgap energy equivalent to the light emitted by the thyristor.

5. The light-emitting component according to claim 2, wherein
   each of the light-emitting element and the thyristor includes a plurality of semiconductor layers that are stacked, and
   the light-transmission reduction layer includes a semiconductor layer having a conductivity type identical to a conductivity type of one of a light-emitting-elementside semiconductor layer that is in contact with the light-transmission reduction layer among the plurality of semiconductor layers of the light-emitting element and a thyristor-side semiconductor layer that is in contact with the light-transmission reduction layer among the plurality of semiconductor layers of the thyristor, and having an impurity concentration higher than an impurity concentration of the one of the light-emitting-element-side semiconductor layer and the thyristor-side semiconductor layer.

6. The light-emitting component according to claim 2, wherein each of the light-emitting element and the thyristor includes a plurality of semiconductor layers that are stacked, and the light-transmission reduction layer is configured to maintain a direction in which a current easily flows in a case where a light-emitting-element-side semiconductor layer that is in contact with the light-transmission reduction layer among the plurality of semiconductor layers of the light-emitting element and a thyristor-side semiconductor layer that is in contact with the light-transmission reduction layer among the plurality of semiconductor layers of the thyristor are directly joined.

7. The light-emitting component claim 2, wherein each of the light-emitting element, the thyristor, and the light-transmission reduction layer includes a plurality of semiconductor layers that are stacked, a semiconductor layer that is in contact with the light-transmission reduction layer among the plurality of semiconductor layers of the thyristor and a semiconductor layer that is in contact with the thyristor among the plurality of semiconductor layers of the light-transmission reduction layer have an identical conductivity type, a semiconductor layer that is in contact with the light-transmission reduction layer among the plurality of semiconductor layers of the light-emitting element and a semiconductor layer that in is in contact with the light-emitting element among the plurality of semiconductor layers of the light-transmission reduction layer have an identical conductivity type, the semiconductor layer that is in contact with the thyristor among the plurality of semiconductor layers of the light-transmission reduction layer has an impurity concentration higher than an impurity concentration of the semiconductor layer that is in contact with the light-transmission reduction layer among the plurality of semiconductor layers of the thyristor, and the semiconductor layer that in is in contact with the light-emitting element among the plurality of semiconductor layers of the light-transmission reduction layer has an impurity concentration higher than an impurity concentration of the semiconductor layer that is in contact with the light-transmission reduction layer among the plurality of semiconductor layers of the light-emitting element.

8. The light-emitting component claim 1, wherein the thyristor further includes a voltage reduction layer that reduces a rising voltage of the thyristor.

9. The light-emitting component according to claim 8, wherein the voltage reduction layer has a bandgap energy that is smaller than bandgap energies of other semiconductor layers of the thyristor.

10. A light-emitting device comprising:

a plurality of light-emitting components that are caused to sequentially emit light, each of the plurality of light-emitting components being the light-emitting component claim 1; and an optical system that emits light emitted from the light-emitting components two-dimensionally.

11. An image forming apparatus comprising:

an image bearing member;

a charging member that charges the image bearing member;

the light-emitting device according to claim 10 that exposes the image bearing member that has been charged to light;

a developing member that develops an electrostatic latent image formed on the image bearing member that has been exposed to light by the light-emitting device; and a transfer member that transfers an image developed on the image bearing member onto a transferred-image-receiving medium.

12. The light-emitting component according to claim 1, wherein the light-transmission reduction layer includes a plurality of semiconductor layers.

13. The light-emitting component according to claim 1, wherein the light-emitting element is a laser element.

14. The light-emitting component according to claim 1, wherein the lighting element is a VCSEL element.

15. A light-emitting component comprising:

a substrate;

a light-emitting element disposed on the substrate;

a thyristor that causes the light-emitting element to emit light or causes an amount of light emitted by the light-emitting element to increase, upon entering an on-state; and a light-transmission reduction layer that is disposed between the light-emitting element and the thyristor such that the light-emitting element and the thyristor are stacked and that suppresses light emitted by the thyristor from passing therethrough, wherein each of the light-emitting element and the thyristor includes a plurality of semiconductor layers that are stacked, and the light-transmission reduction layer includes a semiconductor layer having a conductivity type identical to a conductivity type of one of a light-emitting-element-side semiconductor layer that is in contact with the light-transmission reduction layer among the plurality of semiconductor layers of the light-emitting element and a thyristor-side semiconductor layer that is in contact with the light-transmission reduction layer among the plurality of semiconductor layers of the thyristor, and having an impurity concentration higher than an impurity concentration of the one of the light-emitting-element-side semiconductor layer and the thyristor-side semiconductor layer.

16. A light-emitting component comprising:

a substrate;

a light-emitting element disposed on the substrate;

a thyristor that causes the light-emitting element to emit light or causes an amount of light emitted by the light-emitting element to increase, upon entering an on-state; and a light-transmission reduction layer that is disposed between the light-emitting element and the thyristor such that the light-emitting element and the thyristor are stacked and that suppresses light emitted by the thyristor from passing therethrough, wherein each of the light-emitting element and the thyristor includes a plurality of semiconductor layers that are stacked, and the light-transmission reduction layer is configured to maintain a direction in which a current easily flows in a case where a light-emitting-element-side semiconductor layer that is in contact with the light-transmission reduction layer among the plurality of semiconductor layers of the light-emitting element and a thyristor-side semiconductor layer that is in contact with the light-transmission reduction layer among the plurality of semiconductor layers of the thyristor are directly joined.

17. A light-emitting component comprising:

a substrate;

a light-emitting element disposed on the substrate;

a thyristor that causes the light-emitting element to emit light or causes an amount of light emitted by the light-emitting element to increase, upon entering an on-state; and a light-transmission reduction layer that is disposed between the light-emitting element and the thyristor such that the light-emitting element and the thyristor are stacked and that suppresses light emitted by the thyristor from passing therethrough, wherein each of the light-emitting element, the thyristor, and the light-transmission reduction layer includes a plurality of semiconductor layers that are stacked, a semiconductor layer that is in contact with the light-transmission reduction layer among the plurality of semiconductor layers of the thyristor and a semiconductor layer that is in contact with the thyristor among the plurality of semiconductor layers of the light-transmission reduction layer have an identical conductivity type, a semiconductor layer that is in contact with the light-transmission reduction layer among the plurality of semiconductor layers of the light-emitting element and a semiconductor layer that in is in contact with the light-emitting element among the plurality of semiconductor layers of the light-transmission reduction layer have an identical conductivity type, the semiconductor layer that is in contact with the thyristor among the plurality of semiconductor layers of the light-transmission reduction layer has an impurity concentration higher than an impurity concentration of the semiconductor layer that is in contact with the light-transmission reduction layer among the plurality of semiconductor layers of the thyristor, and the semiconductor layer that in is in contact with the light-emitting element among the plurality of semiconductor layers of the light-transmission reduction layer has an impurity concentration higher than an impurity concentration of the semiconductor layer that is in contact with the light-transmission reduction layer among the plurality of semiconductor layers of the light-emitting element.

18. A light-emitting component comprising:

a substrate;

a plurality of light-emitting elements disposed on the substrate;

a plurality of thyristors that are stacked on the plurality of light-emitting elements with a light-transmission reduction layer interposed therebetween, each of the plurality of thyristors being configured to cause a corresponding one of the plurality of light-emitting elements to emit light or cause an amount of light emitted by the corresponding one of the plurality of light-emitting elements to increase, upon entering an on-state;

a plurality of transfer elements that are stacked on respective lower elements with a light-transmission reduction layer interposed therebetween, each of the plurality of transfer elements being configured to set, upon entering the on-state, a corresponding one of the thyristors to be ready to enter the on-state, the lower elements having a layered structure identical to a layered structure of the plurality of light-emitting elements; and a connection wire that causes the lower elements not to operate as the light-emitting elements.

19. The light-emitting component claim 18, wherein the light-transmission reduction layer is a semiconductor layer disposed on the plurality of light-emitting elements and the plurality of light-emitting elements are laser elements.

20. A light-emitting component comprising:

a light-emitting element that is disposed on a substrate;

a driving element that is disposed on the light-emitting element and that drives the light-emitting element; and a light-transmission reduction layer that is disposed between the light-emitting element and the driving element, the light-transmission reduction layer being a semiconductor layer and being configured to suppress light from the driving element to the light-emitting element, wherein the light-transmission reduction layer is disposed on the light-emitting element and the driving element is disposed on the light-transmission reduction layer.

* * * * *